US011680867B2

(12) United States Patent
Papadimitriou et al.

(10) Patent No.: US 11,680,867 B2
(45) Date of Patent: Jun. 20, 2023

(54) STRESS ENGINEERING ASSESSMENT OF RISERS AND RISER STRINGS

(71) Applicant: Wanda Papadimitriou, Houston, TX (US)

(72) Inventors: Stylianos Papadimitriou, Houston, TX (US); Wanda Papadimitriou, Houston, TX (US)

(*) Notice: Subject to any disclaimer, the term of this patent is extended or adjusted under 35 U.S.C. 154(b) by 239 days.

(21) Appl. No.: 16/372,945

(22) Filed: Apr. 2, 2019

(65) Prior Publication Data

US 2019/0228777 A1    Jul. 25, 2019

Related U.S. Application Data

(60) Continuation-in-part of application No. 15/660,038, filed on Jul. 26, 2017, and a continuation-in-part of application No. 15/136,282, filed on Apr. 22, 2016, now abandoned, said application No. 15/660,038 is a continuation-in-part of application No. 15/136,282, filed on Apr. 22, 2016, now abandoned, which is a (Continued)

(51) Int. Cl.
*G01M 5/00* (2006.01)
*G10L 15/22* (2006.01)

(52) U.S. Cl.
CPC ........... *G01M 5/0033* (2013.01); *G10L 15/22* (2013.01)

(58) Field of Classification Search
CPC .................................................. G01M 5/0033
See application file for complete search history.

(56) References Cited

U.S. PATENT DOCUMENTS

| 1,823,810 A | 9/1931 | Wall |
| 2,194,229 A | 3/1940 | Johnston et al. |

(Continued)

FOREIGN PATENT DOCUMENTS

| DE | 4427880 | 2/1996 |
| EP | 0067531 | 12/1982 |

(Continued)

OTHER PUBLICATIONS

Papadimitriou, Steve et al, "The Inspection of Used Coil Tubing", Second International Conference and Exhibition on Coiled Tubing Technology, Adams Mark Hotel, Houston, Texas, Mar. 28-31, 1994.

(Continued)

*Primary Examiner* — Jennifer Bahls
(74) *Attorney, Agent, or Firm* — Kenneth L. Nash

(57) ABSTRACT

Riser stress-engineering-assessment equipment to verify the integrity and the in-deployment-integrity of a riser string by knowing the status, details and location of each riser joint and by monitoring the deployment parameters. When the failure risk exceeds an acceptable level, the equipment activates a local and/or a remote alarm using voice, sound and lights. The system comprises a computer with communication means, a material properties and geometry detection system, a data acquisition system acquiring deployment and other parameters, a database comprising of riser historical data and captured expert knowledge, a failure-criteria calculation to calculate maximum-stresses under different loads and the combined effects of the different loads to determine if the riser string is still fit-for-deployment.

38 Claims, 32 Drawing Sheets

Related U.S. Application Data continuation-in-part of application No. 14/095,085, filed on Dec. 3, 2013, now Pat. No. 9,322,763, which is a continuation-in-part of application No. 13/304,136, filed on Nov. 23, 2011, now Pat. No. 8,831,894, and a continuation-in-part of application No. 13/304,061, filed on Nov. 23, 2011, now Pat. No. 8,428,910, said application No. 13/304,136 is a continuation-in-part of application No. 13/304,061, filed on Nov. 23, 2011, now Pat. No. 8,428,910, which is a continuation-in-part of application No. 11/769,216, filed on Jun. 27, 2007, now Pat. No. 8,086,425, said application No. 13/304,061 is a continuation-in-part of application No. 13/304,136, filed on Nov. 23, 2011, now Pat. No. 8,831,894, and a division of application No. 11/769,216, filed on Jun. 27, 2007, now Pat. No. 8,086,425, which is a continuation-in-part of application No. 11/743,550, filed on May 2, 2007, now Pat. No. 7,403,871, which is a continuation of application No. 11/079,745, filed on Mar. 14, 2005, now Pat. No. 7,231,320, which is a continuation-in-part of application No. 10/995,692, filed on Nov. 22, 2004, now Pat. No. 7,155,369, said application No. 11/769,216 is a continuation-in-part of application No. 10/867,004, filed on Jun. 14, 2004, now Pat. No. 7,240,010.

(56) References Cited

U.S. PATENT DOCUMENTS

| | | |
|---|---|---|
| 2,317,721 A | 4/1943 | Barnes |
| 2,527,000 A | 10/1950 | Drake |
| 2,582,437 A | 1/1952 | Jezeweski et al. |
| 2,685,672 A | 1/1954 | Price et al. |
| 2,770,773 A | 11/1956 | Cooley |
| 2,881,386 A | 4/1959 | price et al. |
| 2,927,321 A | 3/1960 | Harris |
| 3,202,914 A | 8/1965 | Deem et al. |
| 3,225,293 A | 12/1965 | Wood et al. |
| 3,238,448 A | 3/1966 | Wood et al. |
| 4,128,011 A | 12/1978 | Savage |
| 4,223,346 A | 9/1980 | Neiheisel et al. |
| 4,370,889 A | 2/1983 | Ruthrof et al. |
| 4,409,842 A | 10/1983 | Scott et al. |
| 4,433,581 A | 2/1984 | Scott et al. |
| 4,480,480 A | 11/1984 | Scott et al. |
| 4,496,904 A | 1/1985 | Harrison |
| 4,522,064 A * | 6/1985 | McMillan ............ G01N 29/11 73/592 |
| 4,523,468 A | 6/1985 | Derkacs et al. |
| 4,629,985 A * | 12/1986 | Papadimitriou ...... E21B 17/006 324/227 |
| 4,630,229 A | 12/1986 | D'Hondt |
| 4,631,533 A | 12/1986 | Mark, Jr. |
| 4,631,688 A | 12/1986 | Boehm et al. |
| 4,648,041 A | 3/1987 | Tarr |
| 4,675,604 A | 6/1987 | Moyer et al. |
| 4,698,631 A | 10/1987 | Kelly, Jr. et al. |
| 4,710,712 A | 12/1987 | Bradfield et al. |
| 4,751,657 A | 6/1988 | Imam et al. |
| 4,800,512 A | 1/1989 | Busch |
| 4,821,575 A | 4/1989 | Fujikake et al. |
| 4,825,385 A | 4/1989 | Dolph et al. |
| 4,930,026 A | 5/1990 | Kljniev et al. |
| 4,975,855 A | 12/1990 | Miller et al. |
| 5,019,777 A | 5/1991 | Gulliver et al. |
| 5,068,800 A | 11/1991 | Brook et al. |
| 5,140,264 A | 8/1992 | Metala et al. |
| 5,159,563 A | 10/1992 | Miller et al. |
| 5,202,680 A | 4/1993 | Savage |
| 5,210,704 A | 5/1993 | Husselny |
| 5,255,565 A | 10/1993 | Judd et al. |
| 5,256,966 A | 10/1993 | Edwards |
| 5,321,362 A | 6/1994 | Fischer et al. |
| 5,371,462 A | 12/1994 | Hedengren et al. |
| 5,421,204 A | 6/1995 | Svaty, Jr. |
| 5,430,376 A | 7/1995 | Vierti |
| 5,440,237 A | 8/1995 | Brown et al. |
| 5,455,777 A | 10/1995 | Fujiyama et al. |
| 5,481,916 A | 1/1996 | Macecek et al. |
| 5,579,241 A | 11/1996 | Corby, Jr. et al. |
| 5,648,721 A | 7/1997 | Wincheski et al. |
| 5,671,155 A | 9/1997 | Edens et al. |
| 5,754,122 A | 5/1998 | Li et al. |
| 5,774,378 A | 6/1998 | yang |
| 5,777,891 A | 7/1998 | Pagano et al. |
| 5,786,768 A | 7/1998 | Chan et al. |
| 5,793,647 A | 8/1998 | Hageniers et al. |
| 5,828,213 A | 10/1998 | Hickman |
| 5,914,596 A | 6/1999 | Weinbaum |
| 5,943,632 A | 8/1999 | Edens et al. |
| 5,970,438 A | 10/1999 | Clark et al. |
| 6,006,164 A | 12/1999 | McCarty et al. |
| 6,115,674 A | 9/2000 | Brudnoy et al. |
| 6,181,841 B1 | 1/2001 | Hodge |
| 6,226,088 B1 | 5/2001 | Keane |
| 6,279,125 B1 | 8/2001 | klein |
| 6,292,108 B1 | 9/2001 | Straser et al. |
| 6,326,758 B1 | 12/2001 | Discenzo |
| 6,359,434 B1 | 3/2002 | Winslow et al. |
| 6,360,609 B1 | 3/2002 | Wooh |
| 6,378,387 B1 | 4/2002 | Froom |
| 6,420,867 B1 | 7/2002 | Goldfine et al. |
| 6,449,564 B1 | 9/2002 | Kliman et al. |
| 6,480,811 B2 | 11/2002 | Denny et al. |
| 6,549,820 B1 | 4/2003 | Barrett et al. |
| 6,560,555 B1 | 5/2003 | Mallory |
| 6,580,268 B2 | 6/2003 | Wolodko |
| 6,594,591 B2 | 7/2003 | Clark et al. |
| 6,633,378 B2 | 10/2003 | Doyle, Jr. |
| 6,657,429 B1 | 12/2003 | Goldfine et al. |
| 6,697,466 B2 | 2/2004 | Howard et al. |
| 6,720,775 B2 | 4/2004 | Plotnikov et al. |
| 6,727,691 B2 | 4/2004 | Goldfine et al. |
| 6,784,662 B2 | 8/2004 | Schlicker et al. |
| 6,785,635 B2 | 8/2004 | von Flotow |
| 6,789,428 B2 | 9/2004 | Nishimura et al. |
| 6,836,560 B2 | 12/2004 | Emery |
| 6,847,207 B1 | 1/2005 | Veach et al. |
| 6,904,818 B2 | 6/2005 | Harthorn et al. |
| 6,907,799 B2 | 6/2005 | Jacobsen et al. |
| 6,911,826 B2 | 6/2005 | Plotnikov et al. |
| 6,925,879 B2 | 8/2005 | Raichle |
| 6,925,881 B1 | 8/2005 | Kwun et al. |
| 6,943,869 B2 | 9/2005 | Hubner et al. |
| 6,975,108 B2 | 12/2005 | Bilik et al. |
| 7,005,851 B2 | 2/2006 | May et al. |
| 7,082,822 B2 | 8/2006 | Harthorn et al. |
| 7,095,224 B2 | 8/2006 | Goldfine et al. |
| 7,104,125 B2 | 9/2006 | Harthorn et al. |
| 7,109,702 B2 | 9/2006 | Imamoto et al. |
| 7,155,369 B2 | 12/2006 | Papadimitriou et al. |
| 7,159,654 B2 | 1/2007 | Ellison et al. |
| 7,194,913 B2 | 3/2007 | Morrison et al. |
| 7,221,445 B2 | 5/2007 | Earthman et al. |
| 7,231,320 B2 | 6/2007 | Papadimitriou et al. |
| 7,231,331 B2 | 6/2007 | Davis |
| 7,233,886 B2 | 6/2007 | Wegerich et al. |
| 7,240,010 B2 | 7/2007 | Papadimitriou et al. |
| 7,277,162 B2 | 10/2007 | Williams |
| 7,301,296 B1 | 11/2007 | Discenzo |
| 7,328,741 B2 | 2/2008 | Allen |
| 7,403,871 B2 | 7/2008 | Papadimitriou et al. |
| 7,461,561 B2 | 12/2008 | Morrison et al. |
| 7,526,964 B2 | 5/2009 | Goldfine et al. |
| 7,539,537 B2 | 5/2009 | Wegerich et al. |
| 7,721,611 B2 | 5/2010 | Salama |
| 7,876,094 B2 | 1/2011 | Goldfine et al. |
| 8,050,874 B2 | 11/2011 | Papadimitriou et al. |
| 8,074,720 B2 | 12/2011 | Radi |
| 8,086,425 B2 | 12/2011 | Papadimitriou et al. |
| 8,428,910 B2 | 4/2013 | Papadimitriou et al. |

(56) References Cited

U.S. PATENT DOCUMENTS

| | | |
|---|---|---|
| 8,831,894 B2 | 9/2014 | Papadimitriou et al. |
| 8,981,018 B2 | 3/2015 | Goldfine et al. |
| 9,322,763 B2 | 4/2016 | Papadimitriou et al. |
| 10,145,198 B2 | 12/2018 | Papadimitriou et al. |
| 2002/0183971 A1 | 12/2002 | Wegerich et al. |
| 2003/0164700 A1 | 9/2003 | Goldfine et al. |
| 2003/0229476 A1 | 12/2003 | Naganarayana et al. |
| 2004/0030507 A1 | 2/2004 | Jung |
| 2004/0225474 A1 | 11/2004 | Goldfine et al. |
| 2004/0231547 A1 | 12/2004 | Russell et al. |
| 2005/0100414 A1 | 5/2005 | Salama |
| 2005/0127908 A1 | 6/2005 | Schlicker et al. |
| 2005/0248339 A1 | 11/2005 | Goldfine et al. |
| 2006/0076952 A9 | 4/2006 | Goldfine et al. |
| 2007/0067678 A1* | 3/2007 | Hosek ................ G06F 11/008 714/25 |
| 2008/0128138 A1* | 6/2008 | Radi .................. E21B 47/001 166/350 |
| 2009/0192731 A1* | 7/2009 | De Jesus ............ G01M 5/0025 702/42 |
| 2009/0250926 A1* | 10/2009 | Khemakhem ........ F16L 15/006 285/333 |
| 2012/0203474 A1* | 8/2012 | Kawiecki ............ G01N 29/07 702/39 |
| 2016/0237804 A1 | 8/2016 | Papadimitriou et al. |

FOREIGN PATENT DOCUMENTS

| | | |
|---|---|---|
| EP | 1464435 | 3/2008 |
| JP | S5817353 | 2/1983 |
| JP | H10123099 | 5/1998 |
| JP | 4850857 | 1/2012 |
| JP | 5284503 | 9/2013 |

OTHER PUBLICATIONS

Norsemek, A.S, Northtradem Ltd., Three easy steps to inspection automation, Oct. 14, 2002 www.stylwan.com.

The inspection of materials subjected to dynamic loading with the Stylwan 3D-FEI Bryan Seprenant, Steve Apadimitriou Oct. 2002 www.stylwan.com.

Steve Papadimitriou, Fatigue, Oct. 2002, www.stylwan.com.

Wanda Papadimitriou & Steve Papadimitriou, Selecting inspection of Marine Drilling Risers, Jan. 2003, R.I.S.E.R, Inc.

Steve Papadimitriou, Unique applications of the STYLWAN 3D-FEI Tri Saver, Feb. 2000, www.stylwan.com.

Teodor Dogaru & Stuart T. Smith, NondestructiveTesting and Evaluation, Apr. 27, 2007, Taylor & Francis.

Teodor Dogaru & Stuart T. Smith, Giant Magnetoresistance-Based Eddy-Current Sensor, Oct. 2001, IEEE Transactions on Magnetics.

F.A. Simonen & C.E. Jaske, A Computational Model for Predicting the Life of Tubes Used in Petrochemical Heater Service, Aug. 1985, Journal of Pressure Vessel Technology.

P. Smith, A Recording and Presentation System for Manual Ultrasonic Inspections Using A Speech Recognition Interface, Apr. 1998, A thesis submitted in partial fulfilment of the requirements of the University of Paisley for the degree of Doctor of Philosophy.

Mitsuru Uesaka, Kazumi Hakuta, Kenzo Miya, Kazuhiko Aoki, and Ayumu Takahashi, Eddy-Current Testing by Flexible Microloop Magnetic Sensor Array, Jul. 1998, IEEE Transactions on Magnetics.

The inspection of materials subjected to dynamic loading with the STYLWAN 3D-FEI Bryan Seprenant, Steve Papadimitriou Oct. 2002 www.stylwan.com.

Steve Papadimitriou, Coil Tubing Inspection, Oct. 2002, www.stylwan.com.

Norsemek, A.S, Northtradem Ltd., Riser Inspection, Oct. 14, 2002, www.riserinc.com; www.stylwan.com.

Wanda Papadimitriou & Steve Papadimitriou, Imperfections on Marine Drilling Risers , Jan. 2003, R.I.SER, Inc.

Wanda Papadimitriou & Steve Papadimitriou, NDE techniques for the inspection for Marine Drilling Risers, Jan. 2003, R.I.SER, Inc.

Wanda Papadimitriou & Steve Papadimitriou, Inspection of Marine Drilling Risers with Ultrasonics, Jan. 2003, R.I.SER, Inc.

Wanda Papadimitriou & Steve Papadimitriou, Riser Integrated Scanning Evaluation Recommendation, Jun. 2003, R.I.SER, Inc.

Steve Papadimitriou, OCTG Inspection at the Wellhead, Oct. 2002, www.stylwan.com.

Rafik Sabet & Steve Papadimitriou, Deepwater Riser System Management Forum, Jun. 14, 2000, Transocean Sedco Forex and Stylwan.

Wanda Papadimitriou & Steve Papadimitriou, Inspection of Marine Drilling Risers with Magnetic Flux Leakage (MFL), Jan. 2003, R.I.SER, Inc.

Steve Papadimitriou, Field reports and charts of the Stylwan 3D-FEI TripSaver, Feb. 1999, Stylwan.

Bryan Suprenant & Steve Papadimitriou, The Inspection of materials subjected to dynamic loading with the Stylwan 3D-FEI, Feb. 2000, Stylwan.

Steve Papadimitriou, The Inspection of Marine Riser Systems, Dec. 2000, Stylwan.

Steve Papadimitriou, 3D FEI Report Summary, Stylwan.

Case No. 4:20-cv-03297 Exhibit A, Affidavit of Stylianos Papadimitriou filed in Case No. 4:07-cv-01633 dated Oct. 3, 2008, United State District Court for the Southern District of Texas. (Redacted).

Case No. 4:20-cv-03297 Exhibit C, Plaintiffs Original Petition and supporting Exhibits for Cause No. 2006-43581 filed Jul. 17, 2006, Harris County District Courts, United State District Court for the Southern District of Texas. (Redacted).

Case No. 4:20-cv-03297 Exhibit E, Stylwan DG12 and DG21 Operating Agreements filed under seal in Cause No. 1999-41704, Harris County District Courts, United State District Court for the Southern District of Texas. (Redacted).

Case No. 4:20-cv-03297 Exhibit F, Affidavit of Reinhold Kammann and supporting exhibits filed under seal in Cause No. 1999-41704, Harris County District Courts, United State District Court for the Southern District of Texas. (Redacted).

\* cited by examiner $$\begin{bmatrix} Sensor1 \\ Sensor2 \\ \vdots \\ SensorX \end{bmatrix} \times \begin{bmatrix} K_{11} & K_{12} & \cdots & K_{1X} \\ K_{21} & K_{22} & \cdots & K_{2X} \\ & & & \\ K_{X1} & K_{X2} & \cdots & K_{XX} \end{bmatrix} = \textit{Flaw Spectrum} \quad (Eq.1)$$

Illustration of a 2D Extraction Matrix

FIG. 3A

$$Ya_{ij} = M \sum_{k=1}^{N} a_{ik} Xa_{kj} \qquad (Eq.2a)$$

$$Ya_{ij} = M \left[1 + e^{-\sum_{k=1}^{N} a_{ik} Xa_{kj}}\right]^{-1} \qquad (Eq.2b)$$

$$Ya_{ij} = T_{(M \sum_{k=1}^{N} a_{ik} Xa_{kj})} \qquad (Eq.2c)$$

Illustration of Identifier Equations

FIG. 3B

Illustration of a Stress Concentration Factors Calculation

Addressable SSI Sensor Array

Riser Fitness Certificate

Rig
Riser Joint #
ID Tag #

| | MT | C | K | B |
|---|---|---|---|---|
| Nominal OD ($OD_n$) | 21.00" | 6.50" | 6.50" | 5.00" |
| Nominal Wall Thickness ($W_n$) | 0.875" | 1.00" | 1.00" | 0.50" |
| Minimum Wall Thickness ($W_{min}$) | -1.9% | | | |
| Nominal Cross-Sectional-Area ($CSA_n$) | 55.32in² | | | |
| Minimum Cross-Sectional-Area ($CSA_{min}$) | +0.6% | | | |
| Estimated Remaining Strength (ERS%) | 98.4% | | | |
| $\Delta TS_{min}\%$ | +1.02% | | | |

FIG. 9A

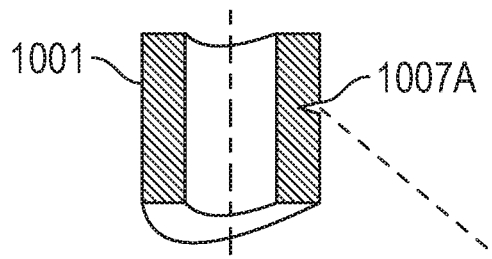
FIG. 13A
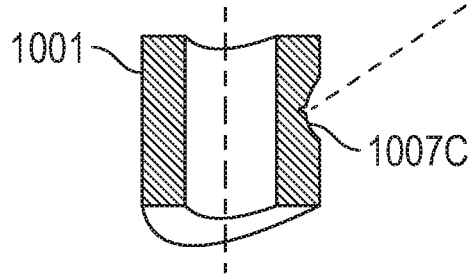
FIG. 13B
FIG. 13C
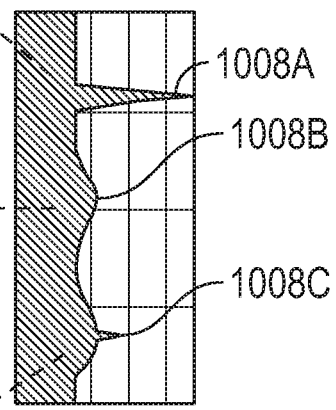
FIG. 13D

The minimum GAIN of the PGA is: G = 1 + [R3 / (R2 + R1)]

The maximum GAIN of the PGA is: G = 1 + [R3 /R2]

EXAMPLE 1:

R1 = 100K   R2 = 5K   R3 = 100K

Maximum GAIN = 21   Minimum GAIN = 1.95

EXAMPLE 2:

R1 = 100K   R2 = 1K   R3 = 100K

Maximum GAIN = 101   Minimum GAIN = 1.99

```
1st Order Filter
      Transfer Function: H(s) = 1 / (s + ω_c)
Design Equation:     R1 = 1 / [2 K π C1 F_c] = 1 / [K C1 ω_c]
```

```
2nd Order Filter
     Transfer Function: H(s) = 1 / [s² + s a ω_c) + ω_c²]

Design Equations: G = 3 - a

R2 = 1 / [2 K π C2 F_c]

R4 = 2 G R2              R3 = R4 / [G - 1]

Where:
     Fc = Cutoff Frequency    K , a = Filter Type Constants
```

```
1st Order Filter
     Transfer Function: H(s) = s / (s + ω_c)
Design Equation:    R1 = 1 / [2 K π C1 F_c] = 1 / [K C1 ω_c]
```

```
2nd Order Filter
     Transfer Function: H(s) = s² / [s² + s a ω_c) + ω_c²]

Design Equations: G = 3 - a

R2 = 1 / [2 K π C2 F_c]

R4 = 2 G R2              R3 = R4 / [G - 1]

Where:
     Fc = Cutoff Frequency    K , a = Filter Type Constants
```

**Transforming ANALOG FILTERS to equivalent
INFINITE IMPULSE RESPONSE (IIR) DIGITAL FILTERS**

A typical analog filter transfer function is of the form:

$$H(s) = \frac{\sum_{i=0}^{m} a_i s^i}{\sum_{i=0}^{n} b_i s^i} = \frac{N(s)}{D(s)} \qquad \text{(Eq. 11.1)}$$

where m is less or equal to n

Each of the Numerator N(s) and Denominator D(s) polynomials is transformed separately by substituting the variable (s) as shown in equation 11.2

Higher orders of digital filters are obtained by cascading 1st and 2nd order digital filter.

FIG. 21A

BILINEAR TRANSFORMATION

Bilinear Transformation is a frequency domain method particularly suited for the design of recursive digital filters, commonly known as IIR Digital filters, by converting an analog filter transfer function H(s) into an equivalent digital transfer function H(z). The Bilinear Transformation is performed by substituting variables:

$$s = 2 * Fs * \frac{(z-1)}{(z+1)} \qquad \text{(Eq. 11.2)}$$

where Fs is the Sampling Frequency.

FIG. 21B

The frequency response of the IIR Digital filter is obtained by substituting:

$$z = e^{j\omega/Fs} \qquad \text{(Eq. 11.3)}$$

FIG. 21C

For example, the HAAR wavelet $$H_0(\omega) = 0.5(1 + e^{-j\omega}) \quad \text{(Eq. 12.1)}$$

describes a low-pass where $H_0(0) = 1$ and $H_0(\pi) = 0$.

The quadrature mirror filter of $H_0(\omega)$ is $H_1(\omega)$ $$H_1(\omega) = 0.5(1 - e^{-j\omega}) \quad \text{(Eq. 12.2)}$$

describes a high-pass filter.

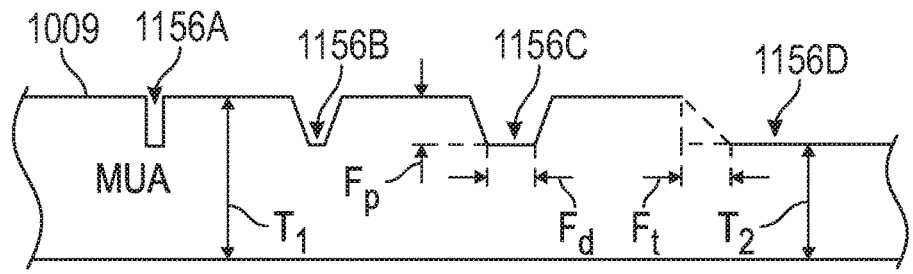
FIG. 26A
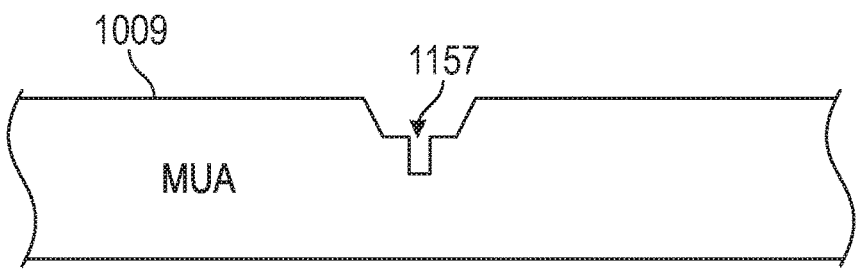
FIG. 26B
| Typical 1D-NDI Recommended Reference & Disposition Standards | | | | | | |
|---|---|---|---|---|---|---|
| Reference Imperfection | Length | | Width | | Depth | |
| | inches | tolerance | inches | tolerance | %penetration | tolerance |
| 1/16" Hole | 0.063" | ±0.016" | 0.063" | ±0.016" | 100% | — |
| 5% Notch | 1.000" | -0.500" | 0.040" | — | 5% | ±0.004" |
| 10% Notch | 0.500" | — | 0.020" | or Less | 10% | ±1.5% |
| Wall Loss | — | — | — | — | 12.5% | — |
FIG. 26C
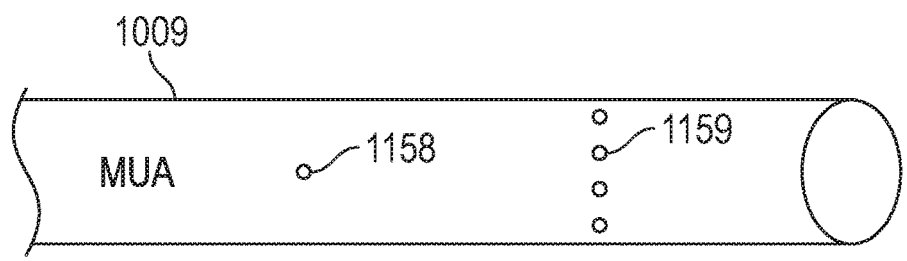
FIG. 26D

STRESS ENGINEERING ASSESSMENT OF RISERS AND RISER STRINGS

TECHNICAL FIELD

The invention is an autonomous system approach to risk management through continuous riser stress-engineering-assessment. The system/method verifies the integrity of a riser joint and the in-deployment-integrity of a riser string by knowing the status, details and location of each riser joint and by monitoring the deployment parameters. When the failure risk exceeds an acceptable level, riser stress-engineering-assessment equipment activates at least one alarm using voice, sound and lights.

BACKGROUND OF THE INVENTION

Components are made from materials and are typically assembled to sub-systems which in turn are assembled to complex systems. Complex systems are assembled using processes and often they function within the envelop of a process. As is known in the art, materials are selected for use based on criteria including minimum strength requirements, useable life and anticipated normal wear. The list of typical materials and systems includes, but is not limited to, aircraft, beam, bridge, blowout preventer, BOP, boiler, cable, casing, chain, chiller, coiled tubing (herein after referred to as "CT"), chemical plant, column, composite, compressor, coupling, crane, drill pipe (herein after referred to as "DP"), drilling rig, enclosure, engine, fastener, flywheel, frame, gear, gear box, generator, girder, helicopter, hose, marine drilling and production Riser (herein after referred to as "Riser"), metal goods, oil country tubular goods (herein after referred to as "OCTG"), pipeline, piston, power plant, propeller, pump, rail, refinery, rod, rolling stoke, sea going vessel, service rig, storage tank, structure, sucker rod (herein after referred to as "SR"), tensioner, train, transmission, trusses, tubing, turbine, vehicle, vessel, wheel, workover rig, components of the above, combinations of the above, and similar items, (herein after referred to as "Material-Under-Assessment" or "MUA"). "MUA of interest" is also referred to as "MUA".

During its useful life, MUA deteriorates and/or is weakened and/or is deformed by external events such as mechanical and/or chemical actions arising from the type of application, environment, repeated usage, handling, hurricanes, earthquakes, ocean currents, pressure, waves, storage, temperature, transportation, and the like; thus, raising safety, operational, functionality, and serviceability issues. A non-limiting list of the loads the MUA may endure during its life involves one or more of bending, buckling, compression, cyclic loading, deflection, deformation, dynamic linking, dynamic loading, eccentricity, eccentric loading, elastic deformation, energy absorption, feature growth, feature morphology migration, feature propagation, flexing, heave, impulse, loading, misalignment, moments, offset, oscillation, plastic deformation, propagation, pulsation, pulsating load, shear, static loading, strain, stress, tension, thermal loading, torsion, twisting, vibration, analytical components of the above, relative components of the above, linear combinations thereof, non-linear combinations thereof and similar items, (herein after referred to as "Loads").

Marine drilling risers, catenary risers, flexible risers and production risers are hereinafter referred to as "Riser". Risers provide a conduit for the transfer of materials, such as drilling and production fluids and gases, to and from the seafloor equipment, such as a Blowout Preventer, hereinafter referred to as "BOP", to the surface floating platform.

Multi-tubulars comprise tubular arrangement of multiple tubes running in parallel. Risers are multi-tubulars along with umbilicals. However, umbilicals may be analyzed as one tube whereas the main tube of the riser is the main load bearing structure.

A Riser joint may comprise of a single or more typically multiple pipes in parallel that are selected for use based on minimum material strength requirements. Each Riser joint is designed to withstand a range of operation loads, hereinafter after referred to as "Loads". A failure occurs when the stresses due to the deployment Loads exceed the actual Riser strength. It is reasonable therefore to expect that the applicable Standards and Recommended Practices would discuss and set allowable stresses limits and/or maximum allowable Loads.

REFERENCES

American Petroleum Institute (API) RP 16Q: Recommended Practice for Design, Selection, Operation and Maintenance of Marine Drilling Riser Systems
API Specification 16F: Specification for Marine Drilling Riser Equipment
American Society of Mechanical Engineers (ASME) B31.4
API 579-1/ASME FFS-1: Fitness-for-Service
Det Norske Veritas (DNV): DNV-OS—F201 Offshore Standards
DNV-F206: Riser Integrity Management
DNV-OSS-302: Offshore Riser Systems
DNV-RP-G103: Non-Intrusive Inspection
American Bureau of Shipping (ABS): Guide for the Certification of Drilling Systems
ABS: Guide for Building and Classing Subsea Riser Systems
Atlantic Margin Joint Industry Group (AMJIG): Deep Water Drilling Riser Integrity Management Guidelines.
Theory of Elasticity S. P. Timoshenko, J. N. Goodier
ROARK'S Formulas for Stress and Strain
Pertersen Stress Concentration Factors
Review of Standards and Recommended Practices
API RP 16Q Section 3: RISER RESPONSE ANALYSIS "This section applies equally to the design of a new riser system or the site specific evaluation of an existing riser system. Riser analysis should be performed for a range of environmental and operational parameters."
API RP 16Q Table 3.1: Lists maximum operating and design stresses factors and "[3] All stresses are calculated according to von Mises stress failure criterion".
API 16F Section 5.4: "The analysis shall provide peak stresses and shall include effects of wear, corrosion, friction and manufacturing tolerances" 3.74 Stress Amplification Factor (SCF): "The factor is used to account for the increase in the stresses caused by geometric stress amplifiers that occur in riser components".
ASME B31.4 402 Calculation of stresses: "Circumferential, longitudinal, shear, and equivalent stresses shall be considered . . . " "Calculations shall take into account stress intensification factors . . . " Table 402.1-1 lists "stress intensification factors".
ABS 9.1: "The riser is to be so designed that the maximum stress intensity for the operating modes, as described in API RP 16Q, is not exceeded"
AMJIG A.1.2: "Assessment of pipe strength is based on the von Mises combined stress criterion" A1.2.1 Riser Stresses: "API-RP-16Q recommends a maximum allowable stress factor for drilling operations of 0.67".

DNV-RP-F204: Riser Fatigue Appendix A.

DNV-F206 10.2.2: Condition Based Maintenance "This maintenance strategy can be used when it is possible to observe some kind of equipment degradation".

DNV-OSS-302: API RP 16Q is applicable. 108: "Establishment of components strength in terms of maximum applicable external loads/deformations"

API 579-1/ASME FFS-1 G.1.2. "When conducting a FFS assessment it is very important to determine the cause(s) of the damage or deterioration".

Review of Non-Destructive-Inspection

The concepts of modern Non-Destructive-Inspection (hereinafter referred to as "NDI") were established in the 1920s. Modern day NDI units often use a similar design concept as the U.S. Pat. No. 1,823,810 and the exact same sensors and configuration as found in U.S. Pat. No. 2,685,672 FIGS. 5 and 6. The vacuum tube amplifier of U.S. Pat. No. 1,823,810 is replaced with a solid-state amplifier and the readout meter is replaced by a computer with a colorful display. A few have replaced the coil sensors of U.S. Pat. No. 2,685,672 FIGS. 5 and 6 with Hall probes. None of this repackaging has improved the overall capabilities of modern NDI as the U.S. Pat. No. 2,685,672 single sensor per area comingles all imperfection signals into one signal resulting in what may be called a one-dimensional NDI, herein referred to as "1D-NDI". Notice that the 1D-NDI classification also applies to eddy-current, radiation, ultrasonic, similar systems and combinations thereof. Some combine different 1D-NDI techniques in-line resulting in a system with two or more 1D inspection signals that are not related in form, kind, space and time and thus, they cannot be used to solve a system of equations.

The 1D-NDI signal is insufficient to solve the system of equations to "determine the cause(s) of the damage or deterioration" per API 579-1/ASME FFS-1 and to identify the "geometric stress amplifiers that occur in riser components" per API 16F. Therefore, and as opposed to RiserSEA as discussed hereinafter, 1D-NDI data is unrelated to the as-is Riser strength, fitness-for-service (herein referred to as "FFS") and remaining-useful-life (herein referred to as "RUL") other than an occasional end-of-life statement.

It should be expected that the Lack-of-Knowledge about the MUA Features results in "false indications" or "false calls" whereby the 1D-NDI signal (1D-NDI flag) is not associated with any Feature, resulting in wasted verification crew man-hours and reduced productivity. In order to improve productivity, 1D-NDI employs threshold(s) to eliminate the material signature, the low amplitude signals that are commonly referred to as "grass". Fatigue gives rise to low amplitude signals and therefore, fatigue signals are eliminated from the 1D-NDI traces as a standard procedure. For example, 1D-NDI equipment that is configured to comply with T. H. Hill DS-1, will never detect drill pipe fatigue build-up regardless of how often drill pipe undergoes DS-1 type of inspection.

The "false calls" in U.S. Pat. No. 6,594,591 is the result of 1D-NDI "not knowing by any detail" the MUA Feature, not even knowing if the signal corresponds to a Feature much less been capable of "connecting or associating the feature with known definitions" that allow the calculation of an FFS and/or RULE. US Patent Application 2004/0225474 describes the same problem in [0004] "A significant impediment to NDE inspections in the field (as opposed to depot) and to onboard diagnostics and prognostics is the potential for excessive false indications that directly impact readiness". In other words, 1D-NDI cannot be deployed in the field or onboard an aircraft because of the excessive number of 1D-NDI "false indications" requiring the human intervention of at least one verification crew.

It should be understood that all the means and methods improvised to reduce the 1D-NDI "false indications" or "false calls" are simply band aids to the underline problem of insufficient number of sensors and signal processing to solve the multidimensional MUA problem (the system of equations) of detecting, identifying and recognizing MUA Features and calculating an FFS and/or a RULE as the present invention does.

Furthermore, today's NDI standards, like the drill pipe DS-1, discuss Fatigue extensively and then specify an 1D-NDI unit setup that eliminates any Fatigue signals through thresholds to improve the "signal to noise ratio", just like in the 1920s U.S. Pat. No. 1,823,810 variable grid bias. However, the "noise" also contains metallurgy and Fatigue signals in addition to the sensor ride chatter. Therefore, modern day repackaging of the 1920s 1D-NDI means and methods did not improve the overall 1D-NDI performance. Because of the signal comingling and the limited dynamic range, 1D-NDI cannot detect many of the dangerous imperfections early on, such as fatigue, and has a limited operational range for pipe size, configuration, wall thickness, types of imperfections, inspection speed, sampling rate and similar items while it still relies on the manual intervention of a verification-crew to locate and identify the source of the 1D-NDI signal. As opposed to the RiserSEA affirmative verification of the as-is Riser status, 1D-NDI verifies that it did not detect the few late-life defects within its capabilities.

As opposed to inspection, Assessment is an affirmative process that relies on a sufficient number of good quality specific data to judge and confirm. FFS and RULE are the results of an Assessment.

It would then be the responsibility of whoever performs the Assessment to define the good quality inspection(s), scope and techniques including the number and type of specific data to facilitate the Assessment. Inspection therefore is a very small part of an Assessment process and it is well defined only when it is part of an Assessment process. Inspection is not a substitute for an Assessment. Many disasters root-cause can be traced to this misunderstanding alone; where inspection, such as 1D-NDI, is used as a substitute for Assessment.

It should further be understood that Assessment preferably examines and evaluates, as close as possible, 100% of the MUA for 100% of Features and declare the MUA fit for service only after the Features impact upon the MUA have been evaluated under specific knowledge and rules that include, but not limited, to the definition of the deployment "service" or "purpose". Inspection, such as 1D-NDI, inherently cannot fulfill that role. Marine Drilling Risers are an example of the difference between Assessment and inspection.

Risers connect the drillship to the seafloor BOP and therefore are a very critical component of the offshore drilling operation. Based on the API RP-579 Fitness-For-Service recommendations, the Riser Assessment of the main tube alone should be based on about 30,000 Wall-Thickness readings. From the commercial literature, the Riser inspection of U.S. Pat. No. 6,904,818 acquires about 180 Wall-Thickness readings and yet, it does fulfill the "annual inspection" letter of the Law although more than 99% of the Riser condition is still unknown after this inspection.

Although API RP-579 lists some of the MUA specific data required to facilitate an Assessment it fails to provide means to obtaining the MUA specific data that lead to an Assessment as it only focuses on how difficult it is obtain such data (sufficient number of good quality data) with 1D-NDI. Attaining detailed MUA condition knowledge and the associated specific data through manual means is prohibitive both financially and time wise as it involves the employment of a number of multidiscipline experts, laboratories and equipment.

It is desirable therefore to provide to the industry automatic means and methods to facilitate an MUA condition based maintenance program through an Assessment and preferably, through frequent Assessments to facilitate a constant-vigilance maintenance program, especially for high-reliability safety-critical equipment, systems and processes with minimum amount of human intervention.

Riser 1D-NDI Analysis

Riser pipes fall well outside the inspection capabilities of 1D-NDI. Furthermore, the primary concern of the Riser manufacturers (herein referred to as "Riser-OEM") is to verify the compliance of the new pipes from the pipe mill with the purchase order prior to assembling them into a new Riser. A limited manual 1D-NDI sampling (herein referred to as "Spot-Checks") is sufficient to verify compliance. The Riser-OEM Spot-Checks comprises of a number of manual spot readings that typically cover less than 1% of the pipe, again, due to the limitations of the available 1D-NDI technology. However, this Riser-OEM Spot-Checks is inadequate and inappropriate for the inspection of used Riser where 100% inspection coverage is essential for the calculation of the maximum (peak) Riser stresses. It should also be noted that Riser-OEM Spot-Checks is inadequate and inappropriate for the inspection of all other new or used Oil-Country-Tubular-Goods, hereinafter after referred to as "OCTG", like drill pipe.

The Riser-OEM Spot-Checks comprise of one or more of: a) a few ultrasonic (UT) readings around the pipe circumference, typically 4 readings spaced 2 to 5 feet apart, proving less than 0.1% inspection coverage for wall thickness only; b) a limited eddy-current inspection (EC) of the ID surface that also provides less than 0.1% inspection coverage for near-surface imperfections only; c) TOFD of welds that may only detect mid-wall imperfections with two diffracting ends. The mid-wall imperfections must be away from the TOFD two inspection dead-zones (the near-surface dead-zone due to lateral waves and the far-surface dead-zone due to echoes); d) mag-particle inspection (MPI) of the welds that is limited to surface and near-surface imperfections on the OD only, after the buoyancy and the paint or coating are removed; e) visual inspection and f) a few dimensional readings. Again, this Riser-OEM Spot-Checks may be adequate to verify the compliance of new pipe with the purchase order; however, it is inadequate for the inspection of used Risers as it leaves over 99% of the Riser condition unknown, a serious safety hazard.

Due to the limitations of 1D-NDI to provide 100% inspection coverage on Riser pipes, certified and monitored inspection companies that specialize in the inspection of new and used OCTG, such as the inspection of drill pipe, production tubing etc., are not involved with the inspection of Risers. This leaves the Riser-OEMs as the only vendors of used Riser inspection. Lacking any other means and used OCTG inspection expertise, Riser-OEMs utilize the same Spot-Checks to inspect used Risers leaving 99% of the Riser condition unknown after the inspection. The simplicity of the spot checks, the modest investment in tools and the lack of required certification and monitoring has encouraged many to enter the used Riser inspection market.

Furthermore, and in order to perform the spot checks, Riser-OEMs and others require the used Riser to be shipped to one of their facilities onshore. In summary, this involves: a) loading the Riser to a workboat; b) unloading the Riser from the workboat onto a flatbed truck; c) transporting and unloading the Riser at the inspection facility; d) disassembling, removing paint/coating and cleaning the Riser; e) performing the spot-check 1D-NDI; recoating/repainting and reassembling the Riser with 99% of its condition still unknown and g) shipping the Riser back to the rig. Although the Riser is exposed to a high probability of transportation and handling damage including but not limited to disassembly and reassembly errors and omissions, this entire process does not produce sufficient data to verify the used Riser integrity or for the calculation of the maximum (peak) Riser stresses. A careful study may conclude that this process is more harmful than helpful because, among many more, it also a) produces a significant amount of air and water contaminant from the transportation, sand-blasting and pressure-washing of the Riser pipes and b) gives the false sense of security to the rig crew that otherwise may be more vigilant during the deployment or retrieval of the Riser.

It should be noted that for decades drill pipe and other used OCTG inspection mandates 100% inspection coverage by certified and monitored inspection companies using calibrated equipment. Again, Riser-OEM spot-checks do not meet the new or used drill pipe and other OCTG minimum inspection requirements. In offshore drilling, drill pipe is deployed inside the Riser Main Tube along with the drilling and well fluids. The irony of it all is that if the drill pipe breaks it would result in an inconvenience as the Riser will protect the environment and limit any harmful consequences. If the Riser breaks, drilling and well fluids and gases would be released immediately to the environment with limited means to control the damage and the pollution. It should also be noted that gases may reach the surface underneath or very near the floating platform and may ignite, a familiar Gulf-of-Mexico scenario. In other words, 100% inspection coverage by a certified and monitored company is specified to prevent an inconvenience while 1% or less inspection coverage by anybody is deemed adequate to prevent a disaster.

Riser Analysis

Due to lack of 1D-NDI useful data, Riser analysis is still carried out using ideal Riser material assumptions such as: a) the material is assumed to be Linearly Elastic; b) the material is assumed to be Homogeneous (having the same material properties at all points); c) the material is assumed to be Isotropic (having the same properties at all directions); d) the cross-sectional-area (herein referred to as "CSA") of the material is Circular throughout its Length; e) the CSA is constant throughout its Length and f) the Riser is straight. These assumptions simplify the Riser analysis while it is further assumed that any unknowns, errors and omissions are covered when the calculated Riser maximum stresses do not exceed, for example, 0.67 of the material specified minimum yield strength. This assumption may be allowable for normal operating conditions. However, under abnormal, contingency, extreme, emergency and survival conditions the knowledge of the actual strength of the weakest riser joint in the string becomes the key to survival, not an assumed value of an ideal material that is never present in a string.

Furthermore, the greater water depths are now overshadowing the ideal Riser material assumptions. This is equivalent to high altitude mountain climbing whereby the lack of oxygen at or above the death-zone overshadows the skills, endurance and determination of the climber. However, as opposed to the mountain climbing fixed death-zone altitude, the Riser death-zone depends on the condition of each Riser joint. For example, quoting from API 16F "3.74 Stress Amplification Factor (SAF): The factor is used to account for the increase in the stresses caused by geometric stress amplifiers that occur in riser components". Geometric stress amplifiers: a) are never present in ideal material; b) they are not the same from Riser joint to Riser joint; c) can only be determined from NDI data that cover 100% of the volume of the Riser joint and d) is capable of "determining the cause(s) of the damage or deterioration" per API 579-1/ASME FFS-1.

Therefore, there is an offshore drilling industry need for an automated system to calculate maximum Riser stresses during deployment using deployment data along with Riser material and geometry data, including the effects of geometric stress amplifiers, and to compare said stresses to failure-criteria to determine if the Riser string is still fit-for-deployment per API 16Q, API 16F, DNV, ABS and all other specifications and requirements.

SUMMARY OF THE INVENTION

It is reasonable to conclude from the aforementioned that the purpose of the Riser inspection is to acquire a sufficient number of good quality specific data to facilitate a Riser response Analysis that includes, but is not limited, to a calculation of maximum Riser stresses to verify that they do not exceed the allowable stresses under Loading, preferably using the von Mises stress failure criterion. The Analysis should include, but is not limited to, the effects of corrosion, crack-like-flaws, fatigue, geometric-distortion, groove-like-flaws, hardness, local wall thickness misalignment, pit-like-flaws, wall thickness, wear, and other stress-concentrators (geometric stress amplifiers), herein referred to as "Imperfections". Imperfections that exceed an alert threshold are herein referred to as "Flaws". Imperfections that exceed an alarm threshold are herein referred to as "Defects".

As opposed to Riser codes, standards and 1D-NDI, computers and finite element analysis software, herein referred to as "FEA", have made great strides widening the gap between Riser Analysis and Riser Inspection.

Furthermore, a condition based maintenance is preferable when the Riser inspection can detect a spectrum of degradation (DNV-F206) and determine the causes of degradation (API 579-1/ASME FFS-1). Therefore, RiserSEA should detect and recognize a spectrum of Imperfections and analyze their combined effects on the Riser under loading. It should then be understood that RiserSEA analysis results in an affirmative verification that the as-is Riser exceeds a minimum strength requirement or should be rerated or should be repaired or should be removed from service.

In one possible embodiment, RiserSEA comprises an Autonomous Constant-Vigilance (herein after referred to as "AutoCV") system or elements thereof may be provided to ascertain and/or to mitigate hazards arising from the failure of an MUA resulting from misapplication and/or deterioration of the MUA. The AutoCV system may comprise elements such as, for instance, a computer and an MUA Features acquisition system. The MUA Features acquisition system may be used to scan the MUA and identify the nature and/or characteristics of MUA Features. A computer program may evaluate the impact of the MUA Features upon the MUA by operating on the MUA Features, said operation guided by a database constraints selected at least in part from knowledge and/or rules and/or equations and/or MUA historical data. The AutoCV system may acquire Loads and Deployment Parameters by further comprising of a data acquisition system. A computer program may evaluate the impact of the Loads and Deployment Parameters upon the MUA by operating on the MUA Features, said operation guided by a database constraints selected at least in part from knowledge and/or equations and/or rules. A computer program may convert the MUA data to a data format for use by a Finite Element Analysis program (herein after referred to as "FEA"), also known as an FEA engine, or a Computer Aided Design program (herein after referred to as "CAD"), The computer program may further combine the as-is MUA components into a functional (operational) MUA model, such as a structure, an engine, a pump or a BOP or a string of pipe. The computer may further recalculate the physical shape of each as-is MUA component using Features, Loads, Deployment Parameters, constraints, equations, rules and knowledge and may then operate the MUA model to verify that the MUA is still functional as intended within a safe operational-envelop and in an emergency, guide the crew on the limits of exceeding the safe operational-envelop.

The computer program may further combine as-is MUA models to assess the functionality of a complex system, such as the as-is drill pipe inside the as-is Riser and the as-is subsea BOP. Such a simulation will also take into account the as-is drill pipe, Riser and BOP including, but not limited to, as-is shape, wall thickness, hardness, hydraulic pressure and temperature and other pertinent Features, Loads and Deployment Parameters. For example a string of pipe or string of riser. If the string of pipe is not suitable due to a particular pipe or riser that pipe may be replaced or left out and a revised simulated tubular string may be calculated. Or it may be possible to simply remove a pipe from a high stress region and place it in another place to provide a re-ordered simulated tubular string.

In one possible embodiment, an evaluation system may be provided to ascertain and/or to mitigate hazards arising from the failure of a material resulting from misapplication and/or deterioration of the material shortening its RUL. The system may comprise elements such as, for instance, a computer and a material features acquisition system. The materials feature acquisition system may be used to scan the material and identify the nature and/or characteristics of material features. In one possible embodiment, the invention may further comprise a database which may comprise material historical data and/or constraints. The first database constraints may be selected at least in part from knowledge and/or rules. The knowledge and/or rules may involve stress or loading related factors. A non-limiting list of knowledge or rules may involve use of the material in applications involving one or more of bending, buckling, compression, cyclic loading, deflection, deformation, dynamic linking, dynamic loading, eccentricity, eccentric loading, elastic deformation, energy absorption, feature growth, feature morphology migration, feature propagation, impulse, loading, misalignment, moments, offset, oscillation, plastic deformation, propagation, shear, static loading, strain, stress, tension, thermal loading, torsion, twisting, vibration, and/or a combination thereof.

In another embodiment, a first computer program may evaluate the impact of the material features upon the material by operating on the material features. The operation may be guided by the database constraints and/or any material historical data. In one possible embodiment, the first computer program evaluates the RUL of the material under the constraints.

In one embodiment, an evaluation system may provide a computer programmed to calculate the remaining useful life of a material, and respond in various ways. For instance, the computer may be programmed to operate/process or otherwise act upon a first material feature, which may be electronically or otherwise detected, to recommend a remediation path to extend said remaining useful life. The material remediation path recommended by the programmed computer may, for example, comprise at least of utilization, redeployment and alteration to a shape of the material feature. The alteration to a shape of said material feature is an optimal shape for extending a remaining useful life.

In another embodiment, sound such as speech or special audio effects may be utilized by the computer in different ways such as requesting information of various types about the material under investigation or providing information about it. For instance, the computer may utilize a sound synthesizer to convert calculated information about the remaining useful life into speech or easily recognizable audio effects.

In another embodiment, a first computer program may evaluate the impact of the material features upon the material by operating on the material features. The operation may be guided by the database constraints and/or any material historical data, stored, at least in part, in a storage device affixed on to the material. In one possible embodiment, the first computer program evaluates the RUL of the material under the constraints and writes, at least in part, the evaluation data, including but not limited to, inspection data and/or FFS data and RUL data.

In another possible embodiment, a material evaluation system may comprise a computer, a material features acquisition system, a first database comprising of constraints and/or material historical data; and/or a data conversion program, whereby the material features may be rendered in a data format for use by a finite element analysis engine.

In another possible embodiment, the invention may comprise a sensor with an output comprising of signals indicative of features from the material being scanned, in a time-varying electrical form. A sensor interface may be provided for the computer, wherein the computer converts the signals to a digital format. Additional elements may comprise at least one database comprising of material features recognition constraints and/or historical data. A computer program may be executed on the computer for identifying the material features detected by said sensor.

In another possible embodiment, a material evaluation system may comprise a computer and a material features acquisition system, whereby the material features are acquired and are stored as part of a research and development effort to establish FFS and RUL using actual material deployment and application data.

In another embodiment, a method may be provided to calibrate a remaining useful life evaluation system comprising steps such as, for example, providing at least one material sample, with at least one feature, and possibly many features, that impact a material remaining useful life, and whereby a remaining useful life evaluation outcome of the material sample is known. Additional steps may comprise evaluating the material sample with said remaining useful life evaluation system, and adjusting the remaining useful life evaluation system, whereby an evaluation outcome of said material sample matches a known remaining useful life of said material sample.

These and other embodiments, objectives, features, and advantages of the present invention will become apparent from the drawings, the descriptions given herein, and the appended claims. However, it will be understood that above-listed embodiments and/or objectives and/or advantages of the invention are intended only as an aid in quickly understanding certain possible aspects of the invention, are not intended to limit the invention in any way, and therefore do not form a comprehensive or restrictive list of embodiments, objectives, features, and/or advantages.

BRIEF DESCRIPTION OF DRAWINGS

FIG. 3A illustrates an example of a Two-Dimensional (2D) Extraction Matrix in accord with one possible embodiment of the present invention;

FIG. 3B illustrates an example of a Identifier Equations in accord with one possible embodiment of the present invention;

FIG. 9A is an example of a Riser Fitness Certificate;

FIG. 13A illustrates a section of MUI with an imperfection.

FIG. 13B illustrates a section of MUI following remediation.

FIG. 13C illustrates a section of MUI following incomplete remediation.

FIG. 13D illustrates the stress concentration.

FIG. 21A illustrates the Bilinear Transformation, a mathematical technique to translate an analog transfer function to the digital domain, according to the present invention;

FIG. 21B illustrates the mathematical formula for the Bilinear Transformation illustrated in FIG. 21A according to the present invention;

FIG. 21C illustrates a mathematical formula for the frequency response of IIR Digital filter for the Bilinear Transformation illustrated in FIG. 21A according to the present invention;

FIG. 26A illustrates a typical material sample with man-made features;

FIG. 26B illustrates a typical material sample with a critically flawed area;

FIG. 26C illustrates typical reference defects found in 1D-NDI standards;

FIG. 26D a critically flawed area;

SUMMARY

Figure 1:
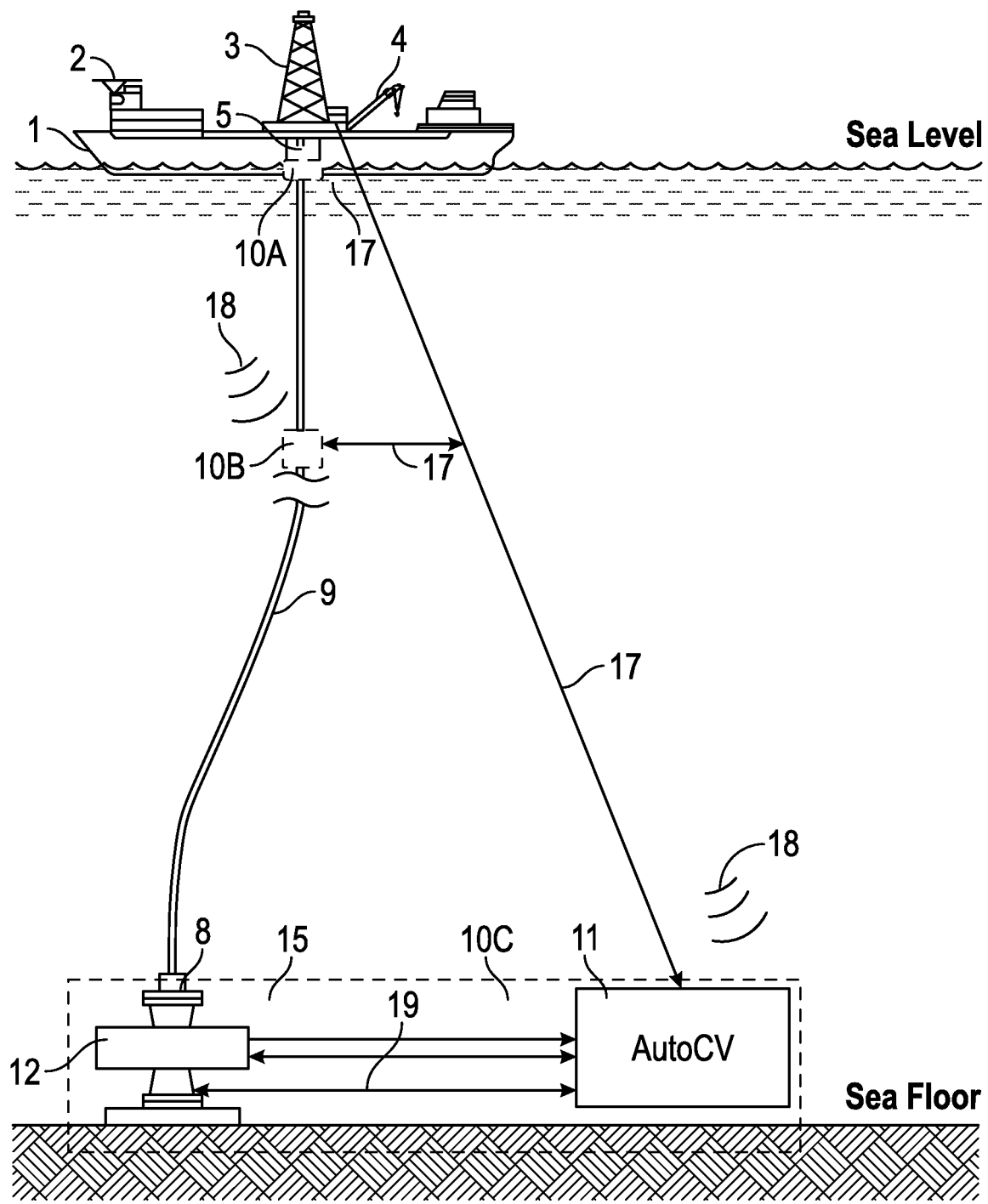
FIG. 1 illustrates a block diagram of an example of an AutoCV system, of which RiserSea may be a component, deployed with an offshore drilling rig in accord with one possible embodiment of the present invention.

A system of one or more computers can be configured to perform particular operations or actions by virtue of having software, firmware, hardware, or combinations of them installed on the system that in operation causes or cause the system to perform the actions.

One or more computer programs can be configured to perform particular operations or actions by virtue of including instructions that, when executed by data processing apparatus, cause the apparatus to perform the actions. One general aspect includes a method for assessment of a tubular, the method including: utilizing a material features acquisition system operable to detect a plurality of material features in the tubular, the material features acquisition system including a sensor.

The method also includes providing a database to retain data so that the material features acquisition system is operable for repeatedly scanning the tubular with the material features acquisition system over time when providing axial movement between the sensor and the tubular. The method also includes providing that the material features acquisition system is responsive to a material feature for calibrating the material features acquisition system from a calibration sample. The method also includes detecting an output of the sensor. The method also includes calibrating the sensor with a calibration sample including a plurality of different material features.

The method also includes providing that the material features acquisition system is operable to evaluate the output of the sensor to detect new material features and monitor previously detected material features in the tubular from the database. The method also includes providing that the material features acquisition system is operable for determining a degradation mechanism from a plurality of possible degradation mechanisms or changes affecting the tubular. In other words, the system is operable to determine many different possible degradation mechanisms. Other embodiments of this aspect include corresponding computer systems, apparatus, and computer programs recorded on one or more computer storage devices, each configured to perform the actions of the methods.

Implementations may include one or more of the following features. The method further including simulating an anticipated load on the tubular to assess the tubular. The method where the material features acquisition system is operable to categorize material features including at least wall thickness, cracks, welds, tapers, and collars. The method further including determining whether the tubular is fit for service with a plurality of anticipated loads based on one or more of an estimated remaining strength of the tubular, a material strength requirement for a range of operational loads for the tubular, a minimum strength requirement for the tubular, or a deterioration of the tubular.

The method further including providing data in a suitable data format representative of the tubular to at least one of a finite element analysis (FEA) program, a simulation program, or a computer aided design (CAD) program. The method where the tubular includes an oil country tubular good, a pipeline, a riser, a component of the oil country tubular good, the pipeline or the riser, or combinations of the oil country tubular good, the pipeline, or the riser. The method further including providing a database operable for storage of a history of the tubular under evaluation, the material features acquisition system is operable to determine at least one degradation mechanism that affects the tubular under evaluation from a plurality of possible degradation mechanisms from the history. The method further including providing data representative of the tubular from the sensor of the material features acquisition system to at least one of an FEA program, a simulation program, or a computer aided design (CAD) program and providing that the data representative of the tubular is in a usable format for at least one of the FEA program, the CAD program, or the simulation program. The method further including comparing the tubular with a history of the tubular from a database or storage to determine changes in the tubular. The method further including producing a representation of the tubular utilizing data from the sensor. The method further including comparing the representation of the tubular with a representation from a history of the tubular from a database to determine changes in the tubular.

The method determining whether the tubular is fit for service with a plurality of anticipated loads based on one or more of an estimated remaining strength of the tubular, a material strength requirement for a range of operational loads for the tubular, a minimum strength requirement for the tubular, or a deterioration of the tubular. The method where the axial movement is at a selectable scanning speed in terms of distance over time, e.g. feet or meters per second. The method further including utilizing deployment data along with riser material and geometry data to assess the tubular. The method where the tubular includes an oil country tubular good, a pipeline, a riser, a component of the oil country tubular good, the pipeline or the riser, or combinations of the oil country tubular good, the pipeline, or the riser.

The method further including comparing data of the tubular with earlier data from a history of the tubular in a database to determine changes in the tubular. The method further including determining whether the tubular is fit for service with a plurality of anticipated loads based on one or more of an estimated remaining strength of the tubular, a material strength requirement for a range of operational loads for the tubular, a minimum strength requirement for the tubular, or a deterioration of the tubular. The method further including. The method may also include tracking of an order of each tubular for a plurality of tubulars and recording the order. The method may also include simulating a change in an order of the plurality of tubulars to provide a re-ordered simulated tubular string. The method may also include determining whether the re-ordered simulated tubular string is operable to withstand the anticipated load. The method further including replacing a selection of the tubular from a simulated tubular string to provide a revised simulated tubular string and determining whether the revised simulated tubular string is operable to withstand the anticipated load. The method where the anticipated load includes at least two of tension, bending, torsion, and vibration. The method where the plurality of tubulars includes a riser string, the anticipated load includes at least one or more of water currents acting on the riser string, a length of the riser string, an applied tension to the riser string, a pressure in the riser string, a rig motion applied to the riser string, cyclical loads applied to the riser string, weights of fluids within the riser string, forces applied to the riser string, string weight or maximum allowable loads for the riser string. The method further including replacing a selection of the tubular from a simulated tubular string to provide a revised simulated tubular string and determining whether the revised simulated tubular string is operable to withstand the anticipated load. The method further including replacing a selection of the tubular from a simulated tubular string to provide a revised simulated tubular string and determining whether the revised simulated tubular string is operable to withstand the anticipated load. The method where the calibration sample includes a plurality of different imperfections. The method further including utilizing deployment data along with riser material and geometry data to assess the tubular. The method further including determining a remaining useful life of each riser. The method further including utilizing deployment data along with riser material and geometry data to assess the tubular The method further including determining a remaining useful life of each riser. The method where axial movement occurs is at a speed in terms of a distance over time. The method further including producing data representative of material features of the tubular for use by at least one of a finite element analysis program or a computer aided design program. The method further including exporting a data set representative of the tubular to the finite element analysis program. The method further including selecting a resolution to export to the finite element analysis program. The method where the step of producing data representative of material features of the tubular by scanning the tubular for use by at least one of a finite element analysis program or a computer aided design program is performed substantially or completely by a computer. Implementations of the described techniques may include hardware, a method or process, or computer software on a computer-accessible medium.

One general aspect includes a method for assessment of a tubular, including: providing a material features acquisition system that includes an excitation inducer to induce excitation into the tubular. The method also includes providing that the material features acquisition system includes a sensor responsive to the excitation induced into the tubular. The method also includes calibrating the sensor with a calibration sample including a plurality of different material features. The method also includes providing axial movement between the sensor and the tubular; and utilizing data from the sensor for simulating an anticipated load on the tubular or producing a representation of the tubular. Other embodiments of this aspect include corresponding computer systems, apparatus, and computer programs recorded on one or more computer storage devices, each configured to perform the actions of the methods.

The method further including providing a database operable for storage of a history of the tubular under evaluation, the material features acquisition system is operable to determine at least one degradation mechanism that affects the tubular under evaluation from a plurality of possible degradation mechanisms from the history. The method further including providing data representative of the tubular from the sensor of the material features acquisition system to at least one of an FEA program, a simulation program, or a computer aided design (CAD) program and providing that the data representative of the tubular is in a usable format for at least one of the FEA program, the CAD program, or the simulation program. The method further including comparing the tubular with a history of the tubular from a database or storage to determine changes in the tubular. The method further including producing a representation of the tubular utilizing data from the sensor. The method further including comparing the representation of the tubular with a representation from a history of the tubular from a database to determine changes in the tubular. The method determining whether the tubular is fit for service with a plurality of anticipated loads based on one or more of an estimated remaining strength of the tubular, a material strength requirement for a range of operational loads for the tubular, a minimum strength requirement for the tubular, or a deterioration of the tubular. The method where the axial movement is at a selectable scanning speed in terms of distance over time. The method further including utilizing deployment data along with riser material and geometry data to assess the tubular. The method where the tubular includes an oil country tubular good, a pipeline, a riser, a component of the oil country tubular good, the pipeline or the riser, or combinations of the oil country tubular good, the pipeline, or the riser. The method further including comparing data of the tubular with earlier data from a history of the tubular in a database to determine changes in the tubular. The method further including determining whether the tubular is fit for service with a plurality of anticipated loads based on one or more of an estimated remaining strength of the tubular, a material strength requirement for a range of operational loads for the tubular, a minimum strength requirement for the tubular, or a deterioration of the tubular.

The method may also include tracking of an order of each tubular for a plurality of tubulars and recording the order. The method may also include simulating a change in an order of the plurality of tubulars to provide a re-ordered simulated tubular string. The method may also include determining whether the re-ordered simulated tubular string is operable to withstand the anticipated load. The method further including replacing a selection of the tubular from a simulated tubular string to provide a revised simulated tubular string and determining whether the revised simulated tubular string is operable to withstand the anticipated load. The method where the anticipated load includes at least two of tension, bending, torsion, and vibration. the method where the plurality of tubulars includes a riser string, the anticipated load includes at least one or more of water currents acting on the riser string, a length of the riser string, an applied tension to the riser string, a pressure in the riser string, a rig motion applied to the riser string, cyclical loads applied to the riser string, weights of fluids within the riser string, forces applied to the riser string, string weight or maximum allowable loads for the riser string. The method further including replacing a selection of the tubular from a simulated tubular string to provide a revised simulated tubular string and determining whether the revised simulated tubular string is operable to withstand the anticipated load. The method further including replacing a selection of the tubular from a simulated tubular string to provide a revised simulated tubular string and determining whether the revised simulated tubular string is operable to withstand the anticipated load. The method where the anticipated load includes at least two of tension, bending, torsion, and vibration. The method where the calibration sample includes a plurality of different imperfections. The method further including utilizing deployment data along with riser material and geometry data to assess the tubular. The method further including determining a remaining useful life of each riser. The method where axial movement occurs is at a speed in terms of a distance over time. The method further including producing data representative of material features of the tubular for use by at least one of a finite element analysis program or a computer aided design program. The method further including exporting a data set representative of the tubular to the finite element analysis program. The method further including selecting a resolution to export to the finite element analysis program. The method where the step of producing data representative of material features of the tubular by scanning the tubular for use by at least one of a finite element analysis program or a computer aided design program is performed substantially or completely by a computer. Implementations of the described techniques may include hardware, a method or process, or computer software on a computer-accessible medium.

One general aspect includes a system to evaluate a tubular including: a material features acquisition system, the material features acquisition system including of at least one sensor with an output. The system also includes a calibration sample including a known material feature where the material features acquisition system is adjusted for the known material feature. The system also includes a database operable for storage of a history of the tubular under evaluation, the material features acquisition system is operable to determine at least one degradation mechanism from a plurality of possible degradation mechanisms affecting the tubular under evaluation. The system also includes the material features acquisition system being operable to record data for the tubular under evaluation repeatedly over time during axial movement of a selectable speed between the sensor and tubular. Other embodiments of this aspect include corresponding computer systems, apparatus, and computer programs recorded on one or more computer storage devices, each configured to perform the actions of the methods.

One general aspect includes a method for assessment of a tubular, the method including: providing a material features acquisition system that includes an excitation inducer to induce excitation into the tubular. The method also includes providing that the material features acquisition system includes a sensor responsive to the excitation induced into the tubular. The method also includes calibrating the material features acquisition system at least once with a calibration sample including a plurality of material features. The method also includes providing relative axial movement between the sensor and the tubular. The method also includes producing data that is representative of material features of the tubular in a format for use by at least one of a finite element analysis program or a computer aided design program or a simulation program. The method also includes utilizing the data to simulate at least one anticipated load to assess the tubular. Other embodiments of this aspect include corresponding computer systems, apparatus, and computer programs recorded on one or more computer storage devices, each configured to perform the actions of the methods.

Implementations may include one or more of the following features. The method further including comparing data of the tubular with earlier data from a history of the tubular in a database to determine changes in the tubular. The method further including determining whether the tubular is fit for service with a plurality of anticipated loads based on one or more of an estimated remaining strength of the tubular, a material strength requirement for a range of operational loads for the tubular, a minimum strength requirement for the tubular, or a deterioration of the tubular. The method further including. The method may also include tracking of an order of each tubular for a plurality of tubulars and recording the order. The method may also include simulating a change in an order of the plurality of tubulars to provide a re-ordered simulated tubular string. The method may also include determining whether the re-ordered simulated tubular string is operable to withstand the anticipated load. The method further including replacing a selection of the tubular from a simulated tubular string to provide a revised simulated tubular string and determining whether the revised simulated tubular string is operable to withstand the anticipated load. The method where the anticipated load includes at least two of tension, bending, torsion, and vibration. The method where the plurality of tubulars includes a riser string, the anticipated load includes at least one or more of water currents acting on the riser string, a length of the riser string, an applied tension to the riser string, a pressure in the riser string, a rig motion applied to the riser string, cyclical loads applied to the riser string, weights of fluids within the riser string, forces applied to the riser string, string weight or maximum allowable loads for the riser string. The method where the step of producing data representative of material features of the tubular by scanning the tubular for use by at least one of a finite element analysis program or a computer aided design program is performed substantially or completely by a computer. Implementations of the described techniques may include hardware, a method or process, or computer software on a computer-accessible medium.

DESCRIPTION OF EMBODIMENTS OF THE PRESENT INVENTION

To understand the terms associated with the present invention, the following descriptions are set out herein below. It should be appreciated that mere changes in terminology cannot render such terms as being outside the scope of the present invention. Details of the terms and systems for providing these functions are also discussed in respective of our previous patents which are referenced herein.

Autonomous: able to perform a function without external control or intervention, which however may be initiated and/or switched off and/or verbally interacted with and/or visually interacted with and/or auditory interacted with and/or revised and/or modified as desired by external control or intervention.

AutoNDI: Autonomous Non-Destructive Inspection

AutoFFS: Autonomous Fitness-For-Service

AutoFFSE: Autonomous Fitness-For-Service-Estimation

AutoRULE: Autonomous Remaining-Useful-Life-Estimation

AutoCV: Autonomous Constant-Vigilance Assessment method and equipment carried-out, at least in part, by the exemplary STYLWAN Rig Data Integration System (RDIS-10) and incorporating herein by reference in their entirety the following: U.S. patent application Ser. No. 13/304,061, U.S. patent application Ser. No. 13/304,136, U.S. Pat. Nos. 8,086,425, 8,050,874, 7,403,871, 7,231,320, 7,155,369, 7,240,010, and any other patents/applications. In the prior art, FFS and RULE was typically performed by an expert or a group of experts using as-designed data and assumptions while the AutoCV assessment is based primarily on as-built or as-is data. When design data is available, AutoCV also monitors compliance with the design data. When less than optimal data is available, AutoCV may perform a Fitness-For-Service-Screening (Herein after referred to as "FFSS"). RiserSea may be a Degradation Mechanism: the phenomenon that is harmful to the material. Degradation is typically cumulative and irreversible such as fatigue built-up.

Essential: important, absolutely necessary.

Expert: someone who is skillful and well informed in a particular field.

Feature: a property, attribute or characteristic that sets something apart.

Finite Element Analysis (Herein after referred to as "FEA"): a method to solve the partial or ordinary differential equations that guide physical systems.

FEA Engine: is an FEA computer program, a number of which are commercially available such as Algor and Nastran. In practice, FEA engines are used to analyze structures under different loads and/or conditions, such as a Riser under tension and enduring vortex induced vibration (Herein after referred to as "VIV"). An FEA engine may analyze a structure with a feature under static and/or dynamic loading, but not a feature on its own.

Fitness For Service: typically an engineering Assessment to establish the integrity of in service material, which may or may not contain an imperfection, to ensure the continuous economic use of the material, to optimize maintenance intervals and to provide meaningful remaining useful life predictions.

Imperfection: one of the material features—a discontinuity, irregularity, anomaly, inhomogeneity, or a rupture in the material under Assessment. Imperfections are undesirable and often arise due to fabrication non-compliance with the design, transportation mishaps and MUA degradation. A Flaw is an Imperfection that exceeds an alert-threshold when monitored in accord with an embodiment of the present invention and typically places the MUA in the category of requiring in-service monitoring. A Defect is an Imperfection that exceeds an alarm-threshold for reliable use when monitored in accord with an embodiment of the present invention and may require removal from service, repair, remediation, different use and/or the like.

Knowledge: a collection of facts and rules capturing the knowledge of one or more specialist and/or experts.

Operational Envelop: the context of the conditions under which it is safe to use.

Remaining Useful Life: a measure that combines the material condition and the failure risk the material owner is willing to accept. The time period or the number of cycles a material (a structure) is expected to be available for reliable use.

Remaining Useful Life Estimation: establishes in one possible embodiment the next monitoring interval or the need for remediation but it is not intended to establish the exact time of a failure. When Remaining Useful Life can be established with reasonable certainty, the next monitoring interval may also be established with reasonable certainty. When Remaining Useful Life cannot be established with reasonable certainty, then RULE may establish the remediation method and upon completion of the remediation, the next monitoring interval may be established. When end of useful life is established with reasonable certainty, alteration and/or repair and/or replacement may be delayed under continuous monitoring.

Rules: how something should be done or not be done concerning MUA based upon know and/or detected facts.

Referring now to the drawings, FIG. 1 illustrates an offshore drilling rig 1. The offshore drilling rig 1 was selected as an example for a Constant-Vigilance application because it encompasses a large variety of materials, some safety-critical, deployed under extreme conditions. In this example, Constant-Vigilance monitors the drilling process through a number of distributed AutoCV systems in continuous communication with each other and each specifically configured for its assignment. However, the present invention is not limited to this particular application and may also be implemented in previously discussed and/or alluded to applications and/or other applications.

It should be understood that complex equipment, systems and processes, safety-critical or otherwise, are coupled closely and their interaction(s) is very complex. Even small changes may form a chain that may propagate through the system, amplify and may trigger a failure that cannot be predicted readily by a cursory look. Furthermore, equipment, systems and processes, especially safety-critical, preferably must exhibit high-reliability and fault-tolerance, whereby some operational capacity is still available after a failure.

Assessment of equipment, systems and processes, especially safety-critical, according to the present invention, preferably starts from the top and defines and prioritizes the key requirements of the operational-envelop and the risks associated with the failure-paths. It is a unique feature of one possible embodiment of the present invention that whoever performs the Assessment must examine and include in the MUA historical data a list of Loads, Deployment Parameters, Environment, Risk and Failure-chains to specifically exclude from list parts that do not belong in the Operational-Envelop of the MUA deployment. Then, the characteristics and values of the remaining Loads, Deployment Parameters, Environment, Risk and Failure-chains should be defined like chemistry, cyclic, magnitude, maximum, minimum, peak, phase, probability, pulsating, range, span, steady, units of measurement, combinations of the above and similar items. This list guides/reminds/helps whoever performs the Assessment or a follow-up Assessment to judge and confirm and to seek knowledge, search, ask for help or obtain an expert opinion(s) from the start of the Assessment process.

For example, such a list would have guided/reminded the HMAN Westralia crew that the fuel hoses do not only endure static pressure, but they also endure vibration (attached to a diesel engine), pulsating pressure (attached to a pump) and the other Loads, Deployment Parameters and Environment a sea going vessel encounters. A cursory search of the engine manuals and the manufacturer's bulletins could have averted this disaster as the pulsating pressure peak value was extensively discussed and is considered general knowledge among marine engineers and others.

Assessment then progresses downwards and splits the system into sub-systems and eventually components. For each sub-system and component, Assessment defines and prioritizes the key requirements of its operational-envelop and the risks associated with its failure-paths as aforementioned. It should be understood that the failure-paths of sub-systems and components may define additional requirements and/or may reformulate the risk associated with the overall system whereby restarting the Assessment from the top again (Assessment feedback). Assessment therefore knows by some detail the risks associated with each sub-system and component and then specifies the good quality inspection(s), scope and techniques including the number and type of specific data to facilitate the Assessment and to preferably disrupt the accident-chain(s).

The most effective way to manage complex equipment, systems and processes is to translate them, when possible, to a mathematical description that simplifies the detection and assesses subtle changes that people and organizations would miss with a cursory look thus warns about errors and contains failures by actively disrupting the failure-chains with knowledge. Occasionally, humans tend to misinterpret, misunderstand, simplify and dismiss subtle readings and changes, such as the pressure readings on the Deepwater Horizon. On the other hand, AutoCV mathematical description allows for higher-resolution Assessment, allows for overall system Assessment and it will not simplify or dismiss subtle changes.

Autonomous Constant-Vigilance System

The exploration, production, transportation and processing of hydrocarbons, onshore or offshore, utilizes substantially similar equipment and configuration of equipment. For example, a metallic or composite cylinder (with or without end connectors and/or welds) may be referred to as casing, coiled tubing, drill pipe 7, Riser 6, (see FIG. 2) pipe, pipeline, tubing etc., collectively referred to herein as OCTG and designated as MUA 9 (shown Riser 6 main tube and auxiliary lines with the drill pipe 7 inside the main tube). Similarly, a valve or a configuration of valves is referred to as control valve, diverter valve, relief valve, safety valve, BOP 8 etc. A structure is referred to as an aircraft wing, bridge, derrick 3, crane 4, frame, tower, helicopter landing pad 2 etc. and of course, the rig 1 itself is a sea going vessel comprising of most MUA varieties. Regardless of the MUA name, which may comprise any of the above mentioned elements, AutoCV: a) scans the MUA to detect a plurality of Features; b) recognizes the MUA detected Features and therefore "knows by some detail" the MUA Features; c) associates and connects the recognized MUA Features with known definitions, formulas, risks and MUA historical data, preferably stored in a database; d) creates an MUA mathematical and/or geometrical and/or numerical description compiled through the mathematical, geometrical and numerical description of the MUA recognized Features (herein after referred to as "Mathematical Description"); e) converts the MUA recognized Features into a data format for use by an FEA and/or a CAD program; f) calculates Feature change-chain and compares with stored failure-chains for a match; g) calculates a remediation to disrupt the Feature change-chain (disrupt the failure-chain early on) and h) updates the MUA historical data database.

The MUA Mathematical Description is then acted upon by the Loads and Deployment Parameters, sufficient for calculating an MUA FFS and RULE to predict an MUA behavior under deployment in accord with an embodiment of AutoCV operation. Furthermore, the MUA Mathematical Description may be converted to an MUA functional model or prototype which may be operated to verify MUA functionality directly and/or through a CAD program and/or through an FEA program.

FIG. 1 illustrates some components of the drilling process that are critical. The Riser joints 6 connect the rig 1 to the subsea BOP 8. Risers 9 comprise at least a main tube, typically 21 inches OD, and a number of auxiliary lines. The drill pipe 7 reaches the strata through the Risers 9 main tube and through the BOP 8. Riser 6 main tube also acts as the primary conduit of the drilling fluids to the rig 1. The BOP 8 main function is to shear the drill pipe 7 and to seal the well in the event of an accident.

The Riser string, which could conceivably be less than or greater than 10,000' long, is not only exposed to the hydrostatic pressure, it is also exposed to the ocean currents that change direction with depth. Therefore, the riser string is a flexible structure that also experiences varying side loads, some of which lead to vortex induced vibration (VIV). Anyone can place vibration monitors along the Riser string, collect VIV data, write a paper and contribute to the general knowledge. However, as was discussed above, general knowledge does not prevent an accident.

AutoCV on the other hand, recognizes that it is not a generic riser joint that endures VIV but a very specific riser joint that endures a very specific VIV loading (frequency, magnitude etc.) that changes minute by minute. VIV adds to the cyclic fatigue and acts upon the Features of the specific riser joint. Therefore, knowing in detail the fatigue status and the other features (wall-thickness, corrosion, hardness etc.) of each riser joint in the riser string (the subtle readings and changes), AutoCV assesses accurately the risk factors associated with the specific riser joint under the specific deployment loads and thus, it disrupts a failure-chain with exact knowledge that is continually updated. On the other hand, Riser inspection that acquires very few readings only adds an insignificant amount of information beyond what is known about a generic riser joint.

AutoCV also recognizes that it is not a generic drill pipe joint across the generic shear rams of a generic BOP. Instead, AutoCV recognizes that, at any given moment, there is a very specific length of a very specific drill pipe joint (specific wall-thickness, corrosion, hardness, tool joint etc.) across the very specific shear rams of a very specific BOP and thus, it disrupts another failure-chain with exact knowledge that is continually updated.

Constant-Vigilance uses this specific knowledge to select inspection and monitoring instruments, such as the exemplary AutoCV system, and then strategically locate them around the rig. It should be understood that this selection is based on safety and business values and therefore, not all equipment that are discussed in the examples below would be deployed in all similar applications.

Subsea AutoCV

The subsea AutoCV 10C comprises of at least one console 11, an Assessment head 12, a number of sensors 15, a power and communication link 17 and/or a wireless and/or sonic and/or underwater modem and/or other types of communicators and/or chain or relay stations that provide communication link 18 and a power and control link 19. The console 11 comprises of at least one computer with software connected to a Features detection interface and a data acquisition system. The data acquisition system is connected to sensors 15 comprising of numerous Loads and/or Deployment Parameters sensors that may include one or more subsea cameras. Console 11 further comprises of a power backup with sufficient storage to safely operate AutoCV 10C and maintain communication with the rig floor AutoCV 10A through the communication links 17, 18 and control link 19.

Assessment head 12 comprise of at least one Features detection sensor which in one embodiment may produce data which when utilized in the software or equations of the present invention can distinguish and/or measure one, two, or three physical dimensions of and/or classify one, two, or three physical dimensions, and/or one, two or three physical dimensions of different Features and/or measure changes in Feature-morphology, fatigue, or the like (See for example U.S. Pat. No. 7,155,369 Autonomous Non-Destructive Inspection, incorporated herein by reference in its entirety). The features detection system is preferably not limited to "one-dimensional" information in the sense that "one-dimensional" data simply provides, for example, an electrical signal that may change due to numerous reasons and therefore it is often unable to distinguish much less measure or describe significant and non-significant one dimensional physical variations of one, two or three dimensions of different features, and cannot realistically distinguish, much less measure or classify one, two or three physical dimensional aspects of different features. However, AutoCV may utilize multiple "one-dimensional" sensors that when combined may be utilized with equations to detect, measure and/or distinguish one, two or three dimensional different features. (See, for example, U.S. Pat. No. 7,231,320 Extraction of Imperfection Features through Spectral Analysis, referenced hereinbefore and incorporated herein by reference).

The subsea AutoCV 10C communicates with and monitors the BOP 8 controls through the control link 19. For example, in one possible embodiment, control link 19 may duplicate the function of the power and communication link 17 whereby AutoCV 10C is powered by and communicates with the rig floor AutoCV 10A through the BOP 8 controls. In addition to performing a continuous FFS, RULE and operating a model of the BOP 8, the subsea AutoCV 10C may prevent BOP 8 actions that may damage the BOP 8 or at least notify and ask for confirmation from the surface before the BOP 8 action is permitted. It should be understood that, as an Assessment of the system and the drilling process, the rig floor AutoCV 10A and the subsea AutoCV 10C are in continuous communication and act as one whereby, for example, the rig floor AutoCV 10A may prohibit pipe movement when the BOP 8 pipe rams are closed until such time that the action is confirmed. It is envisioned that such notification will be carried out through the rig floor AutoCV 10A visual, speech and sound interface (see FIG. 2 items 21, 21R, 50 and 55) whereby, in case of an emergency, the rig floor AutoCV 10A would automatically connect to additional speakers around the rig and increase the volume to an appropriate level to announce the emergency.

It should further be understood that the subsea AutoCV 10C would then monitor and confirm that the BOP 8 action was performed as intended and report back or calculate and/or estimate the degree by which the action was performed using data obtained through the Assessment head 12 and/or Loads and Deployment Parameters sensors 15, such as battery status, position of BOP 8 rams, activation of valves and controls, control's pressure, differential pressure across the rams and similar items. Monitoring the sound and the flow inside the BOP 8 or the Risers 9 would be a measure of success in closing the rams to seal the well.

Referring to Deepwater Horizon, the BOP monitor of U.S. Pat. No. 7,155,369, FIG. 3, incorporated herein by reference in its entirety, would have detected the conditions around the BOP 8 shear rams and would have alerted the driller instantly if the sheared drill pipe fell into the well away from the rams; while there was still thousands of feet of fluid inside the Riser. It would also have alerted the driller that the drill pipe did not fall away, in other words it did not shear completely, or if the drill pipe is bend or additional material is jamming the rams. This knowledge alone would have saved countless days of futile attempts to close the Deepwater Horizon BOP shear rams. Almost a year later and at enormous cost, the DNV report reflects what could have been known onsite instantly, knowledge that may have given the rig crew a fighting chance; a prime example of the high cost of lack-of-knowledge.

AutoCV Standalone Operation

The subsea AutoCV 10C is also capable of standalone operation in the event of a mishap. The subsea AutoCV 10C may be notified of a mishap or recognize a mishap through the Assessment head 12 and/or Loads and Deployment Parameters sensors 15 and/or sound recognition 55 and/or through data loss or even loss of external power. The subsea AutoCV 10 would then enter the automatic standalone operation mode after a certain amount of time without communication with the rig floor AutoCV 10A and/or after a number of failed communication attempts or by receiving a command to enter the standalone operation mode.

The actions of the subsea AutoCV 10C may be controlled by the material inside the BOP 8 and/or information derived from Loads and Deployment Parameters sensors 15 and/or sound recognition 55 (See FIG. 2) and may be limited by the amount of stored backup power. The subsea AutoCV 10C may be programmed with an active and/or a passive standalone mode. In the active standalone mode, the subsea AutoCV 10C may analyze the information from the sensors using onboard stored expert knowledge and may attempt to power and/or operate at least part of the BOP 8 if the expert analysis suggests, for example, a well blowout. In the passive standalone mode, the subsea AutoCV 10C may monitor and relay to the surface data obtained through the Assessment head 12 and/or Loads and Deployment Parameters sensors 15, such operation optimized to extend the power backup life. It is envisioned that the subsea AutoCV 10C may integrate a complete BOP 8 control system.

Mid-Level AutoCV

A number of AutoCV 10B may be deployed along the length of the Riser string to perform functions substantially similar to the subsea AutoCV 10C. For example, AutoCV 10B may be located at a certain depth where known currents initiate VIV. AutoCV 10B system(s) may be in communication by various means as discussed hereinbefore with AutoCV 10A and 10C systems. In addition, as part of a fault-tolerant system, the AutoCV 10B may be equipped with a flow restrictor to be deployed in case of a mishap. The flow restrictor may be as simple as an inflatable bladder with a fluid or compressed air reservoir or a ram and support equipment.

Rig Floor (Surface) AutoCV

Figure 2:
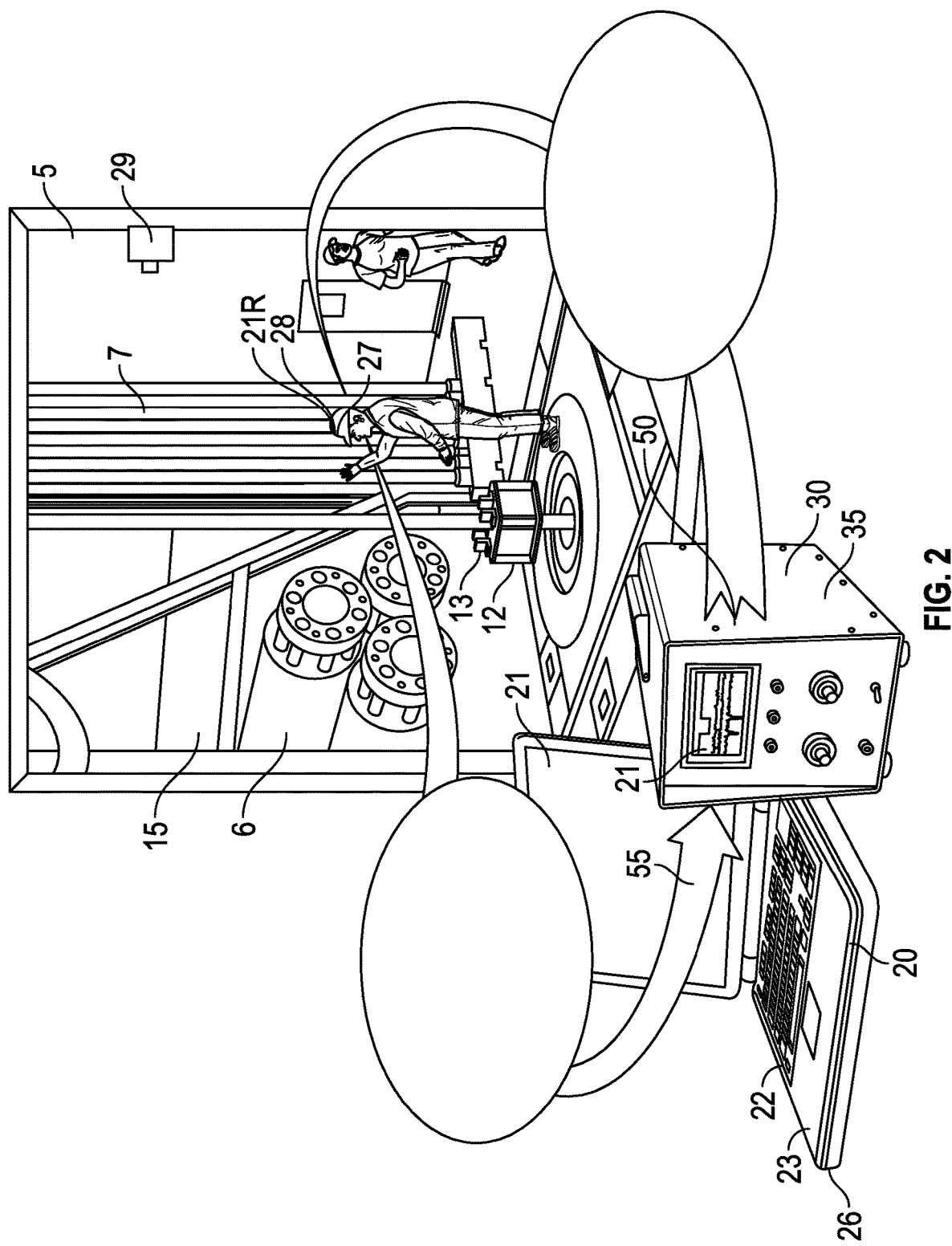
FIG. 2 illustrates a block diagram of an example a surface AutoCV system deployed at the rig floor of an offshore drilling rig in accord with one possible embodiment of the present invention.

FIG. 2 illustrates one possible embodiment of AutoCV 10A deployed on the rig floor 5 where it may be used to: a) assess the status of the OCTG; b) assess the status of other rig equipment, such as mooring, lifting and tensioner cables, tensioner cylinders and pistons, BOP 8, etc., c) assess the status of the rig structure and d) assess the status of complete systems and processes. It should be understood that AutoCV 10A may utilize different types and/or shapes and/or configurations of assessment heads 12 to fulfil the Assessment needs of the different MUAs which are referenced hereinbefore or after.

In this embodiment, AutoCV 10A comprise of at least one computer 20, with a display 21 and a remote display 21R, storage 23, an Assessment head 12 (shown while scanning drill pipe 7 as it is tripped from the well), a position and speed encoder 13, a features detection interface 30 and a data acquisition system 35 connected to numerous Load and Deployment Parameter sensors 15 distributed around the rig. The rig floor AutoCV 10 communicates with other AutoCV system, which may selectively be deployed around the rig, through wired and wireless communication links 26 that also allows for access to remote experts, computers and stored knowledge. The AutoCV 10A communicates with an operator or the rig crew through displays 21 and 21R, keyboard 22, Natural Speech and Sound interface 50 connected to a speaker or earphone 27 (helmet mount is shown) and a Speech and Sound recognition interface 55 connected to a microphone 28. It should be understood that not all AutoCV components would be deployed in all applications.

Material Identification

Material identification is critical for the Assessment process. The present invention provides means of correcting some misidentifications but not necessarily all. In addition to identification through camera 29 and/or operator identifying the material through keyboard 22, microphone 28, speech 55 and/or other inputs or stored information, at least one communication link 26 may facilitate communication with an identification system or a tag, such as RFID, affixed to MUA. Such identification tags are described in U.S. Pat. Nos. 4,698,631, 5,202,680 and 6,480,811 and are commercially available from multiple sources such as Texas Instruments, Motorola and others. Embedded tags specifically designed for harsh environments, are available with user read-write memory onboard (writable tag). It is anticipated that the memory onboard identification tags would increase as well as the operational conditions, such as temperature, while the dimensions and cost of such tags would decrease.

Computer 20 preferably provides for data exchange with the material identification system, including but not limited to, material ID, material geometry, material database, preferred FEA model, preferred evaluation system setup, constraints, constants, tables, charts, formulas, historical data or any combination thereof. It should be understood that identification systems may further comprise of a data acquisition system and storage to monitor and record Load and Deployment Parameters of MUA 9 (See FIG. 1). It should be further understood that the material identification system would preferably operate in a stand-alone mode or in conjunction with AutoCV. For example, while tripping out of a well, computer 20 may read such data from the drill pipe 7 or tubing identification tag and while tripping into a well, computer 20 may update the identification tag memory. Another example would be an identification computer with a data acquisition system affixed onto a Riser joint 6 or a crane 4. During deployment, such an identification system would preferably monitor and record Load and Deployment Parameters.

Speech and Voice Control

Speech is a tool which allows communication while keeping one's hands free and one's attention focused on an elaborate task, thus, adding a natural speech interface to the AutoCV would preferably enable the operator to focus on the MUA and other related activities while maintaining full control of the AutoCV. Furthermore, the AutoCV natural speech interaction preferably allows the operator to operate the AutoCV while wearing gloves or with dirty hands as he/she will not need to physically manipulate the system.

Language Selection

Different AutoCV may be programmed in different languages and/or with different commands but substantially performing the same overall function. The language capability of the AutoCV may be configured to meet a wide variety of needs. Some examples of language capability, not to be viewed as limiting, may comprise recognizing speech in one language and responding in a different language; recognizing a change of language and responding in the changed language; providing manual language selection, which may include different input and response languages; providing automatic language selection based on pre-programmed instructions; simultaneously recognizing more than one language or simultaneously responding in more than one language; or any other desired combination therein. In the event of an emergency, AutoCV preferably will announce the emergency and the corrective action in multiple languages preferably to match the native languages of all the crew members. It should be understood that the multi-language capability of the AutoCV voice interaction is feasible because it is limited to a few dozen utterances as compared to commercial voice recognition systems with vocabularies in excess of 300,000 words per language.

AutoCV Speech

Text to speech is highly advanced and may be implemented without great difficulty. Preferably, when utilizing text to speech, the AutoCV can readily recite its status utilizing, but not limited to, such phrases as: "magnetizer on"; "chart out of paper", and "low battery". It can recite the progress of the AutoCV utilizing, but not limited to, such phrases as: "MUA stopped" and "four thousand feet down, six thousand to go". It can recite readings utilizing, but not limited to, such phrases as "wall loss", "ninety six", "loss of echo", "unfit material", "ouch", or other possible code words to indicate a rejectable defect. The operator would not even have to look at a watch as simple voice commands like "time" and "date" would preferably recite the AutoCV clock and/or calendar utilizing, but not limited to, such phrases as "ten thirty two am", or "Monday April eleven".

However, it should be understood that the primary purpose of the AutoCV is to relay MUA (as-designed, as-is etc.) Load and Deployment information to the operator. Therefore, AutoCV would first have to decide what information to relay to the operator and the related utterance structure. It should be understood that in this example AutoCV 10A may further be utilized to coordinate communications for other AutoCV systems.

Assessment Trace to Sound Conversion

The prior art does not present any solution for the conversion of the Assessment to speech or sound. The present invention utilizes psychoacoustic principles and modeling to achieve this conversion and to drive a speech and sound synthesizer 50 with the resulting sound being broadcast through a speaker or an earphone 27. Thus, the assessment signals may be listened to alone or in conjunction with the AutoCV comments and are of sufficient amount and quality as to enable the operator to monitor and carry out the entire assessment process from a remote location, away from the AutoCV console and the typical readout instruments. Furthermore, the audible feedback is selected to maximize the amount of information without overload or fatigue. This assessment-to-sound conversion also addresses the dilemma of silence, which may occur when the AutoCV has nothing to report. Typically, in such a case, the operator is not sure if the AutoCV is silent due to the lack of features or if it is silent because it stopped operating. Furthermore, certain MUI 9 features such as, but not limited to, collars or welds can be observed visually and the synchronized audio response of the AutoCV adds a degree of security to anyone listening. A wearable graphics display 21R could further enhance the process away from the AutoCV console.

AutoCV Sound Recognition

AutoCV would preferably be deployed in the MUA use site and would be exposed to the site familiar and unfamiliar sounds. For example, a familiar sound may originate from the rig engine revving-up to trip an OCTG string out of a well. An indication of the MUA speed of travel may be derived from the rig engine sound. An unfamiliar sound, for example, would originate from a bearing about to fail. It should be noted that not all site sounds fall within the human hearing range but may certainly fall within the AutoCV analysis range when the AutoCV is equipped with appropriate sensors and microphone(s) 28. It should also be noted that an equipment unexpected failure may affect adversely the MUA RUL, thus training the AutoCV to the site familiar, and when possible unfamiliar sounds, such as a well blowout or a high pressure hose leak, would be advantageous.

AutoCV Speech Recognition

Speech recognition is also highly advanced and may be implemented without great difficulty or may be purchased commercially. A typical speech and sound recognition engine 55 may comprise an analog-to-digital (herein after referred to as "A/D") converter, a spectral analyzer, and the voice and sound templates table. The description of the sequence of software steps (math, processing, etc.) is well known in the art, such as can be found in Texas Instruments applications, and will not be described in detail herein.

Operator Identification and Security

Preferably, at least some degree of security and an assurance of safe operation, for the AutoCV, is achieved by verifying the voiceprint of the operator and/or through facial or iris scan or fingerprint identification through camera 29 or any other biometric device. It should be understood that camera 29 may comprise multiple cameras distributed throughout. With voiceprint identification, the likelihood of a false command being carried out is minimized or substantially eliminated. It should be appreciated that similar to a fingerprint, an iris scan, or any other biometric, which can also be used for equipment security, a voiceprint identifies the unique characteristics of the operator's voice. Thus, the voiceprint coupled with passwords will preferably create a substantially secure and false command immune operating environment.

Voiceprint speaker verification is preferably carried out using a small template, of a few critical commands, and would preferably be a separate section of the templates table. Different speakers may implement different commands, all performing the same overall function. For example "start now" and "let's go" may be commands that carry out the same function, but are assigned to different speakers in order to enhance the speaker recognition success and improve security. As discussed herein above, code words can be used as commands. The commands would preferably be chosen to be multi-syllabic to reduce the likelihood of false triggers. Commands with 3 to 5 syllables are preferred but are not required.

It should be further understood that the authorize operator may also be identified by plugging-in AutoCV a memory storage device with identification information or even by a sequence of sounds and or melodies stored in a small playback device, such as a recorder or any combination of the above.

AutoCV Operation Through Speech

Preferably, the structure and length of AutoCV utterance would be such as to conform with the latest findings of speech research and in particular in the area of speech, meaning and retention. It is anticipated that during the AutoCV deployment, the operator would be distracted by other tasks and may not access and process the short term auditory memory in time to extract a meaning. Humans tend to better retain information at the beginning of an utterance (primacy) and at the end of the utterance (recency) and therefore the AutoCV speech will be structured as such. Often, the operator may need to focus and listen to another crew member, an alarm, a broadcasted message or even an unfamiliar sound and therefore the operator may mute any AutoCV speech output immediately with a button or with the command "mute" and enable the speech output with the command "speak".

The "repeat" command may be invoked at any time to repeat an AutoCV utterance, even when speech is in progress. Occasionally, the "repeat" command may be invoked because the operator failed to understand a message and therefore, "repeat" actually means "clarify" or "explain". Merely repeating the exact same message again would probably not result in better understanding, occasionally due to the brick-wall effect. Preferably, AutoCV, after the first repeat, would change slightly the structure of the last utterance although the new utterance may not contain any new information, a strategy to work around communication obstacles. Furthermore, subsequent "repeat" commands may invoke the help menu to explain the meaning of the particular utterance in greater detail.

It should be appreciated that the present invention incorporates a small scale speech recognition system specifically designed to verify the identity of the authorized operator, to recognize commands under adverse conditions, to aid the operator in this interaction, to act according to the commands in a substantially safe fashion, and to keep the operator informed of the actions, the progress, and the status of the AutoCV process, especially in the event an emergency.

AutoCV Assessment

New material may or may not be fabricated as-designed and the design is often based on certain assumptions which may or may not be correct, such as the gusset plates of the I-35 W bridge in Minneapolis. Furthermore, the in-service (used) material deterioration is cumulative over time. AutoCV 10 (which may comprise AutoCV 10A, AutoCV 10B, AutoCV 10C and/or other AutoCV systems) provides a quantitative Assessment of a new or an in-service material to ascertain its suitability for a service. AutoCV Assessment is based on the as-is material Mathematical Description coupled with the historical data, the measured Loads and Deployment Parameters.

The MUA historical data should relay sufficient knowledge about the MUA, the deployment conditions and the boundaries (Accept/In-service monitoring/Reject-Redeploy) to adequately define the automatic Assessment Fitness categories and/or the safe-operating zone(s) and to create and operate an MUA FEA model. Typically, historical data define or permit for the calculation of the MUA safe-operating zone(s). Initial historical data is typically provided by the MUA owner/user/manufacturer and consists of:

a) Design data such as drawings, material specifications, design parameters and assumptions, loads, limits, constraints and calculations to adequately define the as-designed MUA;

b) Fabrication data such as drawings, material specifications, weld and heat-treatment reports, measurements and manufacturing inspection records to adequately define the as-built MUA;

c) Maintenance data such as alterations, adaptations, repairs and inspection records to adequately define the as-last-known MUA and d) Loads, Deployment Parameters, Environment, Risks and Failure-chains as discussed above. The location (longitude and latitude) may be sufficient to define some of the loads and boundaries like the formation, prevailing ocean currents, seismic activity and similar items.

The function of the features detection interface 30 is to induce controlled excitation into the MUA through the Assessment head 12 and to detect the response of the MUA through the sensors of the Assessment head 12. It should be appreciated that the Assessment head 12, whole or in part, may be applied to the outside or to the inside of the MUA or any combination thereof to cover the Assessment needs of MUA. It should also be understood that not all Assessment head 12 functions and components would be deployed simultaneously or in all applications. It should further be understood that the assessment heads 12 may operate in an active mode (induce full excitation) or in a bias mode (induce modified excitation) or in a passive mode (monitor the sensors only).

The Assessment head 12 sensor signals are preferably band limited and are converted to, lengthwise or timewise, time-varying discrete digital signals which are further processed by at least one computer 20 utilizing an extraction matrix (illustrated in FIG. 3A) to decompose the time-varying discrete digital signals into the flaw spectrum (flaw spectrum is a trademark of STYLWAN). The extraction matrix concept was published in 1994 and it is beyond the scope of this patent but it applies equally to any MUA some of which are referenced hereinbefore or after.

Mathematical Description of the MUA

The flaw spectrum is then processed by a system of identifier equations, as illustrated in FIG. 3B, resulting in a Mathematical Description of the MUA compiled through the Mathematical Description of its Features. At least one computer 20 utilizes stored constraints and/or knowledge and/or rules and/or equations and/or MUA historical data to identify the nature and/or characteristics of MUA Features so that at least one computer 20 knows by some detail the MUA Features and connects and associates the MUA Features with known definitions, formulas, Mathematical Description, FEA, CAD and similar items resulting in Identification Coefficient(s) Ki. It should be understood that Ki may be a number and/or an equation, an array of numbers and/or equations, a matrix, a table or a combination thereof.

Under certain geometrical conditions, Features in proximity may form a Critically-Flawed-Area (CFA) (Critically-Flawed-Area and CFA are trademarks of STYLWAN), even Features that are mundane on their own. A root-cause of a failure would be a 1D-NDI inspector dismissing mundane Features without taking into account their interaction in the overall system. STYLWAN defines a CFA (illustrated in FIG. 4) as "an MUA area that fosters crack initiation due to high stress concentration and promotes rapid crack propagation through bridging". Therefore, the Feature's Neighborhood is another critical Assessment parameter that 1D-NDI overlooks. At least one computer 20 examines the lengthwise flaw spectrum for other Neighborhood Features resulting in Neighborhood Coefficient(s) Kn. It should be understood that Kn may be a number and/or an equation, an array of numbers and/or equations, a matrix, a table or a combination thereof.

At least one computer 20 may further measure and acquire MUA Loads and/or Deployment Parameters by operating a data acquisition system 35 connected to numerous Load and Deployment Parameter sensors 15 resulting in Loading Coefficient(s) Kf. It should be understood that Kf may be a number and/or an equation, an array of numbers and/or equations, a matrix, a table or a combination thereof. At least one computer 20 further calculates and verifies that the MUA is operating within the safe-operating zone(s) of the operational-envelop. When the MUA is operated outside the safe-operating zone(s), at least one computer 20 alerts the operator and logs the conditions, time and event duration. AutoCV may further be programmed to permit such operation for a limited duration, to permit the operation under instructions from the operator or to inhibit the operation of MUA. FIG. 1 numerous AutoCVs may also be programmed to determine the root-cause(s) of the operating anomaly, for example, a well blowout may be determined by the upward traveling wellbore flow and associated pressure and sound.

Figure 3C:
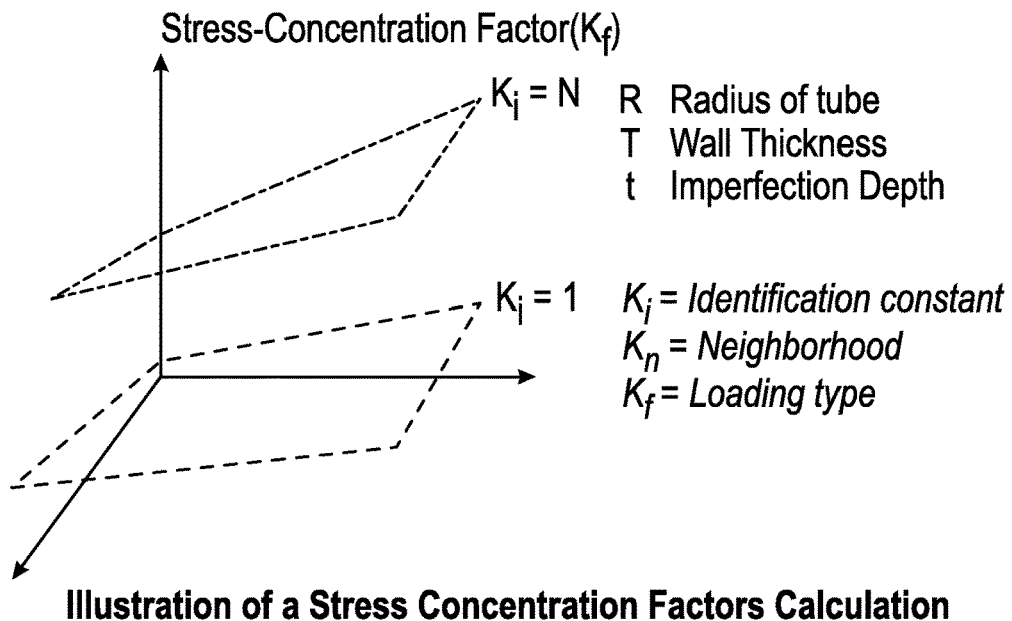
FIG. 3C illustrates an example of a Three-Dimensional (3D) Stress Concentration graph for use in a stress concentration factors calculation in accord with one possible embodiment of the present invention.

A computer program may further evaluate the impact of the MUA Features, and Deployment Parameters upon the MUA by selecting and applying Load specific Stress-Concentration and/or Deterioration Coefficients from equations, look-up tables or 3D charts as illustrated in FIG. 3C. Load specific Stress Concentration factor values may be obtained from the literature, from equations, from FEA or a combination thereof. Some Deterioration Coefficients may also be obtained from the literature, however, more accurate location specific Deterioration Coefficients may be obtained from previously acquired flaw spectrums in proximity to the deployment location. Therefore, coupling lengthwise flaw spectrums with longitude and latitude also results in a 3D history of the location/formation.

Numerical Description of the MUA

The simplest form of a MUA Mathematical Description is a string of numbers. Strings of lengthwise numbers may represent wall thickness, hardness, corrosion, cracks, fatigue, FFS, RULE, number of cycles, other MUA information or combinations thereof. For example, the string $\{0.888, 0.879, \ldots, 0.876, 0.880\}$ may represent the lengthwise Wall Thickness of a Riser joint in inches. The string $\{101, 100, \ldots 99, 100\}$ may represent the lengthwise Wall Thickness of a Riser joint as percentage of nominal Wall Thickness. The string $\{155, 161, \ldots 157, 160\}$ may represent the lengthwise Brinell hardness of a Riser joint. The string $\{19.24, 19.28, \ldots 19.20, 19.21\}$ may represent the lengthwise internal diameter (ID) of a Riser joint. The string $\{55.01, 54.87, \ldots 54.62, 54.98\}$ may represent the lengthwise cross-sectional area of a Riser joint in square inches, combinations thereof and similar items.

It should be understood that multiple such strings would cover, as close as possible to 100%, the MUA resulting in a string array of a specific type which may comprise multiple pipes that create a multi-conductor riser or a multi-conductor umbilical. A unique feature of the present invention is that calculations using string arrays may reveal additional MUA details and subtle changes that humans and 1D-NDI ignore. For example, the lengthwise minimum and maximum diameter of a tube would permit a full length calculation of ovality a pipe or each conductor of a multi-conductor riser or umbilical used for subsea operations. The internal (ID) and external (OD) diameter string arrays of tubes are also used in the calculation of axial stress, burst yield, collapse yield, fluid volume, hoop stress, overpull, radial stress, stretch, ultimate load capacity, ultimate torque, yield load capacity, yield torque, similar items and combination thereof using formulas and charts found in the literature. In another example, Assessment would examine the temperature readings encountered during a sea-going vessel passage to determine if the ductile-brittle transition temperature was ever reached or preferably Assessment would assign a passage to avoid low temperature areas.

It should further be understood that coupling string arrays with other measured values would result in a detailed geometrical description of the as-is MUA, such as combining the lengthwise internal diameter (ID) string arrays of a tube with the corresponding wall thickness arrays. The geometrical description of the MUA may further be compared with the historical Data such as Design, Fabrication and Alteration records and may be exported as a drawing file for use by CAD programs, simulation programs and FEA engines. MUA non-compliance may be reported to the operator. A drawing file may also be referred to as a representation of the as-is MUA with data determined from scanning the MUA at any time. However a representation may be any type of way to represent the MUA with data including a drawing or any other type of representation.

Furthermore, comparison of historical data similar strings and Failure-chains may reveal a Feature change, a Feature morphology migration, a Feature propagation and the calculation and identification of a subtle change-chain that matches an early stage of at least one of stored Failure-chains that may be disrupted through remediation before it progresses to a Failure-chain and eventually to an Accident-chain. For example, in Coiled Tubing a crack may initiate at the bottom of a corrosion pit that acts as a stress concentrator under loading (a CFA). The frequent scans of AutoCV would detect the coexisting crack and thus AutoCV will detect the subtle Feature morphology migration from pit to crack, recommend a remediation and disrupt the accident-chain. It should be understood that the transition from Feature change to a Failure (Imperfection to Flaw to Defect) is subtle and lengthy while the transition from Failure to Accident is rapid and sudden. For example, the morphology change-chain may take 98% of the material RUL while the progress to Accident only 2%. This is also the reason sporadic inspections of critical materials are often inadequate.

Critically-Flawed-Path

Computer 20 may further calculate a simpler flaw spectrum by combining all Features of a section, such as a circumference, into an equivalent flaw spectrum using Ki, Kn, Kf coefficients, stored formulas, charts, tables and historical data.

Figure 4:
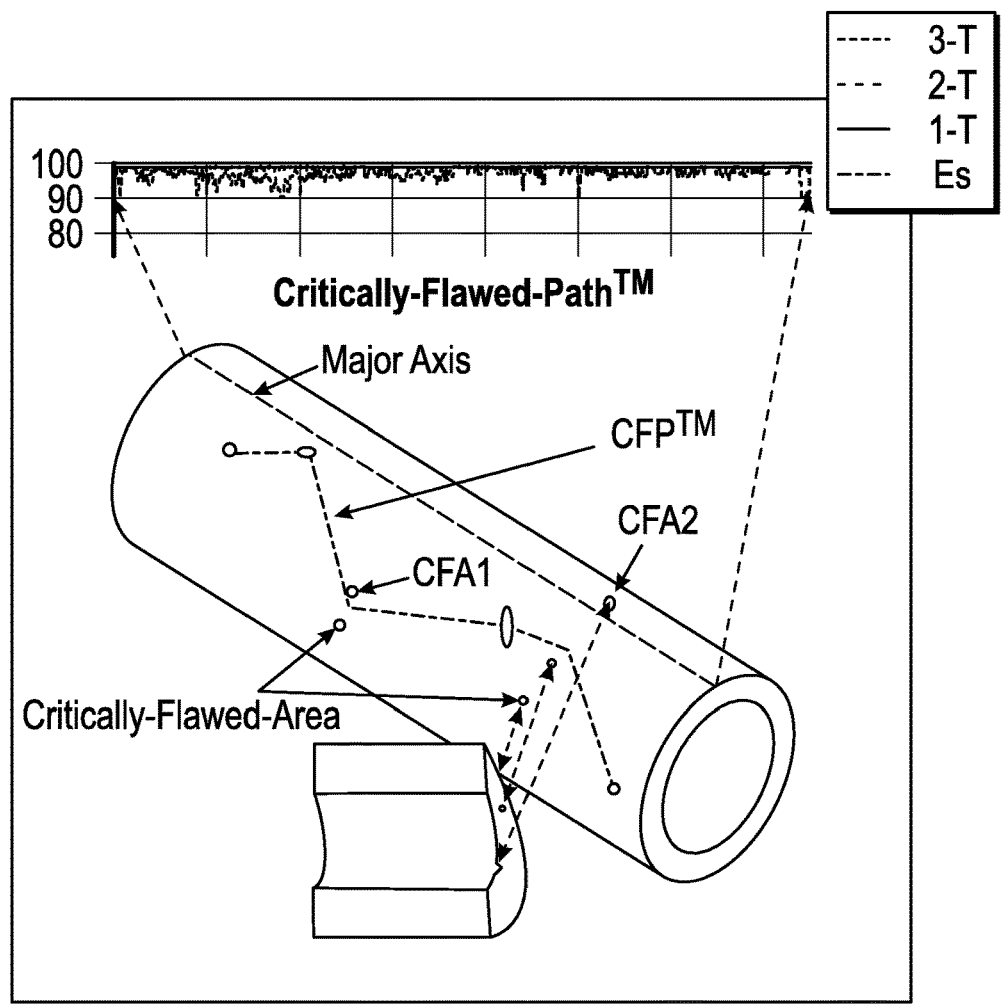
FIG. 4 illustrates an example of Critically-Flawed-Path on a tube showing related measurements and related critically flawed areas in accord with one possible embodiment of the present invention.

FIG. 4 illustrates the MUA resulting simpler flaw spectrum, a Critically-Flawed-Path (Herein after referred to as "CFP") (Critically-Flawed-Path and CFP are trademarks of STYLWAN). It should be understood that there is no physical correspondence between the CFP and the MUA Features as CFP is a mathematical construct that only preserves the MUA performance. A conservative Assessment of MUA will place the CFP on the Major/Minor axis of MUA where Features endure the maximum effects of loading. Under bending, for example, the major axis experiences the maximum tension and the minor axis the maximum compression. It is not uncommon for the major and minor axis to alternate during deployment. Again, it should be understood that the CFP Assessment is very conservative representing the worst case scenario. However, such Assessment is appropriate for safety-critical equipment that must exhibit high operation reliability, such as the BOP 8.

Optimizing System Operation

Typically MUA is part of a system which can be viewed as a complex MUA as discussed earlier. Again, it should be understood that following the analysis, the Assessment of complex MUA closes the loop by starting from the simplest MUA components progressing upwards in complexity. For example, a tool joint is a component of a drill pipe 7, which in turn is a component of the drilling process along with casing, derrick, BOP 8, Risers 9 etc. It is a unique feature of the present invention that the Mathematical Description of the MUA may be further manipulated to address system specific requirements and to optimize the system operation.

For example, the Mathematical Description of each drill pipe 7 joint coupled with their specific location would result in the Mathematical Description of the as-is drill string, a unique feature of the present invention. While drilling, the drill string endures high tensile loads at the surface and high compressive loads at the bottom and therefore, AutoCV knows by some detail the type of loading and the duration each drill pipe 7 joint endured, assess the drill pipe 7 Features under the measured loading and estimates an FFS and RULE. While tripping out of the well, AutoCV 10A would then scan the drill pipe 7 and compare the actual Features, FFS and RULE to the predicted Features by the Assessment while drilling and fine tune the Assessment through these continuous measurements. The Mathematical Description of the as-is drill string may be further manipulated to a CFP to address specific drilling process and equipment needs, such as the specific needs of the BOP 8 rams or other well features or equipment.

For example, in order to address the specific needs of the BOP 8 rams, at least one computer 20 may reprocess the drill string to a special string array of numbers such as {10, 8, 8, . . . 1, 1, 3, 1, 1, . . . 1, 4, 8, 8, 10, 10, 8, 8 . . . 1, 1, 1, . . . 8, 8, 10} where 10 may be assigned to a tool joint or a drilling collar (red—do not close BOP 8 rams), 8 may be assigned to safety selected lengths on either side of a tool joint (orange—safety length), 4 may be assigned to lengths with higher hardness (yellow), 3 may be assigned to lengths with thicker than nominal wall (yellow), and 1 to lengths with nominal material (green—preferred length to close the rams). Furthermore, at least one computer 20 may monitor the string weight through data acquisition system 35 to determine if the drill pipe 7 is under tension or compression. The optimal condition to shear the drill pipe 7 is when body wall it is centered in the shear rams, under tension and with nominal or less hardness and wall thickness. The driller's display may then combine all such data in a simplified color scheme appropriate for an emergency. Preferably, the emergency driller's monitor would be separate from the other monitors and will not use overlapping windows, as a critical but rarely used window may be hidden behind a more often used window. In addition to the display, at least one computer 20 may utilize stored expert knowledge, sound, voice and speech recognition to aid or even guide the driller in case of an emergency.

It should be understood that if part or the whole drill string is replaced by a higher strength drill string, AutoCV will detect the change and assess automatically the drilling system using the new drill string data.

It should also be understood that the lengthwise drill pipe lengths are in reference to the surface AutoCV 10A assessment head 12. At least one computer 20 through data acquisition system 35 may measure Deployment Parameters such as, but not limited to, angle, direction, distance, heave, position, location, speed and similar items to calculate instantly the location of the surface assessment head 12 in reference to other locations such as the BOP 8 rams or a dogleg and therefore reference said flagged lengths to said other locations. This calculation may be utilized alone and/or may provide a backup for the subsea AutoCV 10C when one is deployed. In addition, AutoCV may calculate the drill pipe stretch using measured Deployment Parameters and Historical data.

The above is an example of how AutoCV may use data from one system component, the as-is drill string for example, to examine its impact on the overall system. Another unique and novel feature of the present invention is that it may also assess the impact of the overall process upon a component. For example, computer 20 may monitor, log and evaluate the overall drilling performance and its impact on the MUA by measuring the power consumption of the drilling process, the string weight, weight on bit, applied torque, penetration rate and other related parameters. Such information, an indication of the strata and the efficiency of the drilling process, may be processed and used as a measure to further evaluate and understand the impact of the process upon the MUA, the as-is drill string imperfections, FFS and RULE.

Optimizing a Process

In addition, MUA is part of a system which, most likely, is part of a process. For example, a pitot tube is after all part of the flight from Rio to Paris. This failure-chain is fairly easy to establish.

The components involve the Pilot Tube working, who is flying the plane, whether the Aircraft Autopilot Pilot is used and has a recovery procedure built into software, training for RecoveryOverspeed, and similar factors.

The worst Failure-chain then is: {No (Pitot Tube not working), Unknown (no other type of air speed indicator), Off (disconnect auto pilot), Passenger flying the airplane, No training for recovery/overspeed, and no software built into the auto pilot for overspeed/recovery or to provide help to the flight crew} while the particular Failure-chain was {No, Unknown, Off, Trainee, No, Yes}. This Failure-chain could have been disrupted with adequate airspeed backup indicator of different type, with a Senior Captain in the controls, with training of the flight crew to recover from the pilot tube failure, with a recovery procedure programmed in the Autopilot or even the computer advising the flight crew on probable causes and suggesting recovery techniques. It should also be noted that AutoCV could utilize an accelerometer and/or other sensors to measure the sharpness of the storm jolts and bumps and convert them to an estimated aircraft (or watercraft) speed. After all, the Autopilot did detect the failure and disconnected instead of advising the crew of a recovery procedure(s) while monitoring critical flight data. Furthermore, review of historical data revealed that these particular pitot tubes freeze with increased frequency during a storm in the Intertropical Convergence Zone where the disaster occurred. An Assessment would then have concluded that the pitot tube heaters were not sufficient, also disrupting the failure-chain. Flying around the storm would also have disrupted the Failure-chain but it would have delayed the flight and consumed more fuel.

Again, this failure-chain can easily be translated to a numerical string, such as {10, 10, 10, 6, 10, 10} where 10 represents the worst possible scenario, 6 represents a trainee and 1 represents the best possible scenario. One may add 8 for flight through the Intertropical Convergence Zone resulting in {8, 10, 10, 10, 6, 10, 10}. It is clear from this numerical string that this was a disaster waiting to happen.

A backup speed sensor adept to harsh conditions or a more powerful heater would change the numerical string to {8, 10, 1, 1, 6, 10, 1} disrupting the failure-chain. This is also an example of using identical systems as a backup resulting in a double or triple failure, not increased reliability and safety. Another example is stacking two or three BOPs d on top of each other that will fail simultaneously when dealing with high strength pipe resulting again in a double or triple failure, not increased reliability and safety.

AutoCV Operable Model

Another unique and novel feature of the present invention is the functional model of the as-is MUA that may be operated by the software. For example, the software may close and open a BOP 8 ram (will operate the software model of BOP 8) and verify that the as-is BOP 8, under the measured Loads and Deployment Parameters, is still operable. This involves at minimum, assembling a system using preferably the as-is components; calculating the effects of the Loads and Deployment Parameters on each component and verifying that there is no undue deterioration or interference between the components during the operation.

For example, when two concentric tubes slide in reference to each other, the model operation may be limited to examining the ODs of the inner and the IDs of the outer tube using the corresponding string arrays, all referenced to a common centerline. For simplicity, the model operation may be carried-out using a 2D cutout comprising of the minimum outer ID and the maximum inner OD as shown below.

{5.007, 5.009, . . . 5.006, 5.004} ID of outer tube (minimum values)

{4.999, 5.003, . . . 5.001, 4.998} OD of inner tube (maximum values)

However, the inner tube may be subjected to a fixed or, most likely, varying bending moment when it slides out. This action alone would fatigue and deform the inner tube over time. In addition, the inner tube may endure thermal-cycling along with the cyclic bending. A measure of the inner tube fatigue may be as simple as keeping track of the number of cycles, Loads and Deployment Parameters sufficient for the RULE calculation of the inner tube. It should further be understood that fatigue is not equally distributed throughout the material, so a conservative RULE value should be utilized until additional data is obtained following subsequent Assessment scans.

Furthermore, the extended inner tube (or rod) may be subjected to a corrosive environment resulting in additional deterioration. For example, during drilling, repeated scans of the drill pipe 7 may establish a measure for the corrosive environment. It would be safe to assume that the wellbore side of BOP 8 and the Risers 9 are subjected to the same environment leading to deterioration calculation for the exposed BOP 8 components and the ID of the Risers 9. These estimates may be further fine-tuned with subsequent Assessment scans and the findings may further be stored in a Longitude and Latitude reference for use in future drilling operations. This is another example of AutoCV assessing the impact of the overall process upon a component.

It is well known that material deterioration due to loading is magnified when the loads are applied in a corrosive environment. Particularly, the problem of fatigue cracks rapidly magnifies when the material is subjected to cyclic loading in corrosive environments. The environment the BOP 8, the drill pipe 7, the Risers 9 and the welds are exposed may change as the drilling progresses. Exposed rods of the BOP 8 or tensioner pistons may corrode slightly undermining the seals resulting in a hydraulic leak. This is an example of a subtle change that may impact the drilling equipment but it will go unnoticed until a failure occurs or an oil sheen is observed.

Preferably, AutoCV knows by some detail the components deterioration mechanism(s) and its effects over time or number of cycles etc. This knowledge may also be applied on the as-is model to calculate, for example, a BOP 8 shear-efficiency constant Kse and to create an as-predicted model, thus calculating FFS and RULE through a different path.

Preferably, the Deployment Parameters of MUA, along with the operable as-designed and as-built model will be stored onboard the AutoCV to facilitate an operational comparison of the as-is and/or as-predicted to the as-designed and/or as-built MUA model. It should be understood that on a subsequent Assessment, the new as-is model would be compared to the as-predicted model which would be appropriately updated.

BOP Assessment

The BOP 8 pressure rating only applies to the pressure containment vessel, not the valve closure mechanisms or the overall BOP 8 operation. Therefore, minimal 1D-NDI is performed on the pressure containment vessel, none of which takes into account the actual static and dynamic conditions the BOP 8 endures during deployment and especially during a blowout where the BOP 8 is the last line of defense. For example, subsea BOP 8 inspection does not account, among many others, for simple issues like the pressure and temperature difference between the outside of the BOP 8 (seafloor) and the inside of the BOP 8 (wellbore). Yet, this Deployment Parameters difference alone could even render the BOP 8 inoperable during deployment.

As a result, subsea BOPs fail to pass a "good test" 50% of the time, as documented by SINTEF, MMS and other organizations and studies. Following a SINTEF study of the Norwegian sector of the North Sea, MMS began a review of the BOP testing around 1993. MMS study determined that BOP failure rates were substantially greater than those recorded by SINTEF. Despite two decades of studies, MMS, API, SINTEF, DNV and other participants are not reporting any BOP performance improvement. The failure of the Deepwater Horizon BOP was consistent both with the industry observations/tests and the findings and reports of the regulatory agencies (like MMS, now renamed BOEMRE).

Where safety-critical high-reliability equipment is concerned, such as the BOP 8, the risk is increased significantly when sporadic 1D-NDI is used as a substitute for Assessment. Another faulty approach is the use ill-defined backup equipment as a substitute for a high-reliability Assessment. For example, stacking two BOPs, one on top of the other, may give a false sense of security and increased safety. However, both BOPs are typically made by the same manufacturer, both BOPs suffer from the exact same idiosyncrasies and shortcomings and both BOPs will fail exactly the same way when dealing with high-strength drill pipe or a drilling collar, a reliability problem that will never be solved by stacking BOPs. Therefore, backup systems do not necessarily result in a high-reliability fault-tolerant system because backup systems come with their own idiosyncrasies and shortcomings and they are more difficult to test. Failures of backup systems resulted in the Three Mile Island, Chernobyl and Fukusima disasters, all three of which could have been avoided with high-reliability Assessment methods and controls.

Therefore, meticulous Assessment of safety-critical high-reliability equipment, systems and processes should pave the way for the selection of backup. Selection of backup, following a meticulous Assessment, would most likely result in fine-tuned backup system(s) capable of recovering whole or partial functionality after a failure, such as the mid-level AutoCV 10B. Typically, a fine tuned backup system is less expensive to implement and does increase reliability and safety. On the other hand, ordering two of the same would most likely result in a double failure, not increased reliability and safety. For example, the A330 uses more than 2 pitot tubes that are also heated to avoid freezing and yet, it should be expected that all will fail the same way when the temperature drops below a certain level.

The "Fog-of-Emergency"

Lack-of-knowledge controls an emergency, particularly at the onset. Preferably, AutoCV would foresee a failure that may lead to an emergency through the Mathematical Description of the system and alert the operator before the failure occurs. However, AutoCV does not scan all of the system components continually and for some components AutoCV relies on predicting their deterioration through indirect means. Furthermore, an emergency may be the result of circumstances beyond the realm of AutoCV, such as another vessel colliding with a floating drilling rig. Even under those circumstances, AutoCV preferably would be programmed to aid the operator by lifting the Fog-of-Emergency within its realm ("Fog-Of-Emergency" or "FOE" are trademarks of STYLWAN). For example, if the mishap did not damage the drilling equipment, systems and process, the operator or other crew members could instantly access their status through the AutoCV with a simple "status" verbal command where the AutoCV will display and recite the status of critical parameters. This will enable the operator and crew to focus on other emergency issues, even away from the control room, with the AutoCV monitoring the drilling equipment, system and process and keeping in touch with operator and crew through the multiple remote communication links.

Preferably AutoCV will also be programmed to interpret the data and recognize the root-cause of an emergency or identify some most-likely causes. AutoCV would then be programmed to recite the findings to the operator and the crew and suggest corrective actions to disrupt the failure-chain. It should be understood that the operator may move to a safe(r) location and still stay in touch with AutoCV through speech, sound and the remote communication links. Furthermore, AutoCV access to remote experts may be utilized during an Emergency with the experts having access to all AutoCV data.

It should further be understood that AutoCV systems may be distributed throughout the rig as communication backups. For example, a failure or a fire may disable the rig floor AutoCV 10A, however, AutoCVs 10B and 10C would still be fully functional and capable of duplicating multiple AutoCV 10A functions therefore, the distributed communication capability may recover whole or partial AutoCV functionality. Subsea power is limited and expensive and therefore AutoCV may configure assessment heads 12 of AutoCVs 10B and/or 10C to function in a passive detection mode without inducing power consuming excitation or inducing reduced excitation during normal operation. After the failure though, AutoCV may instruct AutoCVs 10B and/or 10C to enter the active mode to safely perform an Emergency Disconnect Sequence (herein after referred to as "EDS") for example.

In offshore drilling there may be a need for an emergency disconnect between a drilling rig and the sea-floor wellhead. In addition to an equipment failure, a dynamically positioned rig may no longer be able to maintain its position above the sea-floor wellhead due to inclement weather. A properly executed EDS allows the rig to move off location without damaging the subsea equipment and still maintaining control of the well. A typical EDS mandates that the drill string is picked up and hung off in the BOP 8 pipe rams. Thus, it becomes necessary to know the exact drill pipe length in the BOP 8 rams.

The present invention provides four different means to monitor the material inside the BOP 8 rams: a) Scanning the drill pipe with the rig floor AutoCV 10A and/or the mid-level AutoCV 10B and calculating the instantaneous drill pipe length in the BOP 8 rams using other Deployment parameters such as, but not limited to, angle, direction, distance, heave, position, location, speed and similar items; b) Monitoring the BOP 8 rams with the subsea AutoCV 10C; c) preparing the drill pipe on the surface for a BOP 8 rams passive tool joint monitor and d) utilizing a mid-level AutoCV 10B passive or active mode or a combination thereof. On the other hand, providing two surface AutoCV 10As would most likely result in a double failure, not increased safety and reliability. In this particular example, a simple and less expensive communicator(s) increased the safety and reliability.

It may be seen from the preceding description that a novel Autonomous Constant Vigilance system and control has been provided that is simple and straightforward to implement. Although specific examples may have been described and disclosed, the invention of the instant application is considered to comprise and is intended to comprise any equivalent structure and may be constructed in many different ways to function and operate in the general manner as explained hereinbefore. Accordingly, it is noted that the embodiments described herein in detail for exemplary purposes are of course subject to many different variations in structure, design, application and methodology. Because many varying and different embodiments may be made within the scope of the inventive concept(s) herein taught, and because many modifications may be made in the embodiment herein detailed in accordance with the descriptive requirements of the law, it is to be understood that the details herein are to be interpreted as illustrative and not in a limiting sense.

A computer program may evaluate the impact of the MUA Features upon the MUA by operating on the MUA Features, said operation guided by a database constraints selected at least in part from knowledge and/or rules and/or equations and/or MUA historical data. The AutoCV system may acquire Loads and Deployment Parameters by further comprising of a data acquisition system. A computer program may evaluate the impact of the Loads and Deployment Parameters upon the MUA by operating on the MUA Features, said operation guided by a database constraints selected at least in part from knowledge and/or equations and/or rules. A computer program may convert the MUA data to a data format for use by a Finite Element Analysis program (herein after referred to as "FEA"), also known as an FEA engine, or a Computer Aided Design program (herein after referred to as "CAD").

Regardless of the MUA name, which may comprise any of the above mentioned elements, AutoCV: a) scans the MUA to detect a plurality of Features; b) recognizes the MUA detected Features and therefore "knows by some detail" the MUA Features; c) associates and connects the recognized MUA Features with known definitions, formulas, risks and MUA historical data, preferably stored in a database; d) creates an MUA mathematical and/or geometrical and/or numerical description compiled through the mathematical, geometrical and numerical description of the MUA recognized Features (herein after referred to as "Mathematical Description"); e) converts the MUA recognized Features into a data format for use by an FEA and/or a CAD program; f) calculates Feature change-chain and compares with stored failure-chains for a match; g) calculates a remediation to disrupt the Feature change-chain (disrupt the failure-chain early on) and h) updates the MUA historical data database.

The MUA Mathematical Description is then acted upon by the theoretical Loads and Deployment Parameters, sufficient for calculating an MUA FFS and RULE to predict an MUA behavior under deployment in accord with an embodiment of AutoCV operation under various loads, for example the loads result in bends of the riser, pipe, or umbilical, for example depending on the length and water currents. Furthermore, the MUA Mathematical Description may be converted to an MUA functional model or prototype which may be operated to verify MUA functionality directly and/or through a CAD program and/or through an FEA program.

AutoCV assesses accurately the risk factors associated with the specific riser joint under the specific deployment loads and thus, it disrupts a failure-chain with exact knowledge that is continually updated.

In the event of an emergency, AutoCV preferably will announce the emergency and the corrective action in multiple languages preferably to match the native languages of all the crew members.

The flaw spectrum is then processed by a system of identifier equations, as illustrated in FIG. 3B, resulting in a Mathematical Description of the MUA compiled through the Mathematical Description of its Features. At least one computer 20 utilizes stored constraints and/or knowledge and/or rules and/or equations and/or MUA historical data to identify the nature and/or characteristics of MUA Features so that at least one computer 20 knows by some detail the MUA Features and connects and associates the MUA Features with known definitions, formulas, Mathematical Description, FEA, CAD and similar items resulting in Identification Coefficient(s) Ki. It should be understood that Ki may be a number and/or an equation, an array of numbers and/or equations, a matrix, a table or a combination thereof (see Page 24).

At least one computer 20 further calculates and verifies that the MUA is operating within the safe-operating zone(s) of the operational-envelop.

Furthermore, comparison of historical data similar strings and Failure-chains may reveal a Feature change, a Feature morphology migration, a Feature propagation and the calculation and identification of a subtle change-chain that matches an early stage of at least one of stored Failure-chains that may be disrupted through remediation before it progresses to a Failure-chain and eventually to an Accident-chain.

Computer 20 may further calculate a simpler flaw spectrum by combining all Features of a section, such as a circumference, into an equivalent flaw spectrum using Ki, Kn, Kf coefficients, stored formulas, charts, tables and historical data.

FIG. 4 illustrates the MUA resulting simpler flaw spectrum, a Critically-Flawed-Path (Herein after referred to as "CFP") (Critically-Flawed-Path and CFP are trademarks of STYLWAN). It should be understood that there is no physical correspondence between the CFP and the MUA Features as CFP is a mathematical construct that only preserves the MUA performance.

It is a unique feature of the present invention that the Mathematical Description of the MUA may be further manipulated to address system specific requirements and to optimize the system operation.

While tripping out of the well, AutoCV 10A would then scan the drill pipe 7 and compare the actual Features, FFS and RULE to the predicted Features by the Assessment while drilling and fine tune the Assessment through these continuous measurements.

It should also be understood that the lengthwise drill pipe lengths are in reference to the surface AutoCV 10A assessment head 12. At least one computer 20 through data acquisition system 35 may measure Deployment Parameters such as, but not limited to, angle, direction, distance, heave, position, location, speed and similar items to calculate instantly the location of the surface assessment head 12 in reference to other locations such as the BOP 8 rams or a dogleg and therefore reference said flagged lengths to said other locations. This calculation may be utilized alone and/or may provide a backup for the subsea AutoCV 10C when one is deployed. In addition, AutoCV may calculate the drill pipe stretch using measured Deployment Parameters and Historical data.

The above is an example of how AutoCV may use data from one system component, the as-is drill string for example, to examine its impact on the overall system. Another unique and novel feature of the present invention is that it may also assess the impact of the overall process upon a component.

It should also be noted that AutoCV could utilize an accelerometer and/or other sensors to measure the sharpness of the storm jolts and bumps and convert them to an estimated aircraft (or watercraft) speed.

Another unique and novel feature of the present invention is the functional model of the as-is MUA that may be operated by the software. For example, the software may close and open a BOP 8 ram (will operate the software model of BOP 8) and verify that the as-is BOP 8, under the measured Loads and Deployment Parameters, is still operable. This involves at minimum, assembling a system using preferably the as-is components; calculating the effects of the Loads and Deployment Parameters on each component and verifying that there is no undue deterioration or interference between the components during the operation.

AutoCV would then be programmed to recite the findings to the operator and the crew and suggest corrective actions to disrupt the failure-chain.

It should be understood that the present invention Assessment of complex MUA (complex system) starts with the complex MUA analysis to define the operational-envelope of the sub-systems and the components and then, to define failure-chains. It may take multiple iterations to complete this first step. Then, Assessment scans and measures the components with sufficient resolution so that Assessment knows by some detail the as-is component structure, its Fitness-For-Service (herein after referred to as "FFS") and its Remaining-Useful-Life (herein after referred to as "RUL") within its operational-envelop. FFS estimation is herein after referred to as "FFSE" and RUL estimation is herein after referred to as "RULE". Assessment then closes the loop by starting from the simplest components and progress upwards in complexity. Assessment may assemble and assess an as-is sub-system and eventually the complex MUA by assembling the as-is components into an MUA functional model.

For example, an offshore drilling rig is a sea going vessel that comprise of most MUA listed above including, but not limited to BOP, casing, CT, DP, engine, pump, Riser, structure, tensioner each further comprising, at least in part, of simpler components such as beam, enclosure, fastener, frame, piston, rod and tube.

Loads act upon the "as-built" and/or "as-is" MUA features impacting its FFS and RULE. A list of MUA features includes, but is not limited to, ballooning, blemish, blister, boxwear, coating, collar, corrosion, corrosion-band, coupling, crack, crack-like, critically-flawed-area (herein after referred to as "CFA"), critically-flawed-path (herein after referred to as "CFP"), cross-sectional-area (herein after referred to as "CSA"), defect, deformation, dent, density, dimension, duration, eccentricity, erosion, fatigue, flaw, geometry, groove, groove-like, gauge, gauge-like, hardness, key-seat, lamination, loss-of-metallic-area (herein after referred to as "LMA"), metallic-area, mash, misalignment, neck-down, notch, ovality, paint, pit, pitting-band, pit-like, profile, proximity, rodwear, scratch, seam, sliver, straightness, stretch, surface-finish, surface-profile, taper, thickness, thread, threaded-connection, tool joint, wall, wall-thickness, wall-profile, wear, weld, wrinkles, a combination thereof and similar items, (herein after referred to as "Features").

An MUA Feature that was not in the MUA design is herein after referred to as "Imperfection". Imperfections are undesirable and often arise due to fabrication non-compliance with the design, transportation, deployment conditions, mishaps and MUA degradation. An Imperfection that exceeds an alert-threshold is herein after referred to as "Flaw". Typically a Flaw places the MUA in the category of in-service monitoring. An Imperfection that exceeds an alarm-threshold is herein after referred to as "Defect".

In addition, it should be understood that even MUA that is free of any damage may still be unfit for service in a particular application and/or deployment as design assumptions and/or knowledge, such as Mean-Time-Between-Failures (herein after referred to as "MTBF") and similar measures and/or statutory requirements, and/or operating conditions and/or mishaps may render the MUA unfit for service. This is the reason FFS and RUL estimation should preferably monitor and/or measure MUA deployment parameters, a non-limiting list involving one or more of absorption, AC parameters, acceleration, amplitude, angle, brittleness, capacitance, conductivity, color, critical-point temperature, cyclic loading, DC parameters, deformation, density, depth, diameter, dimension, direction, distance, ductility, ductile-brittle transition temperature, eccentricity, eccentric loading, echo, flow, flow rate, fluid level, force, frequency, geometry, impedance, heave, horsepower, image, impedance, impulse, inductance, length, loads, load distribution, location, longitude, misalignment, moments, motion, number of cycles, number of rotations, number of strokes, opacity, ovality, penetration rate, permeability, ph, phase, plastic deformation, position, power, power consumption, pressure, propagation, proximity, radius, reflectivity, reluctance, resistance, rotation, rpm, shear, size, sound, specific gravity, speed, static loading, strain, stress, temperature, tension, thermal loading, torque, torsion, twisting, velocity, vibration, volume, wave, weight, weight on bit, width, relative values of the above, combinations of the above and similar items (herein after referred to as "Deployment Parameters").

Maintenance

Typically MUA is maintained on an interval, such as time or number of cycles, commonly referred to as preventive maintenance. Predictive maintenance theoretically uses a data analysis to determine when the MUA requires maintenance. Theoretically, this approach appears to be more efficient and cost effective. In practice however, predictive maintenance requires MUA diagnostic data and detailed knowledge of the MUA deployment loads that, at best, are difficult and/or expensive to obtain resulting in over maintaining MUA that does not need maintenance and under maintaining MUA that does need maintenance. Predictive maintenance is not a realistic option for most MUA and would most likely result in repair maintenance because of the lack of useful data. Repair maintenance refers to MUA that is used until it fails. Lack-of-(detailed) knowledge of the as-is MUA n is the weakest link among all the maintenance programs which primarily rely on inspection, such as Non-Destructive Inspection (herein after referred to as "NDI"). NDI is also referred to as Non-Destructive Evaluation and as Non-Destructive Examination, both shortened to "NDE" in the literature.

The following further provides additional information regarding use of the present invention with risers and umbilicals as used in offshore operations so that the Riser stress-engineering-assessment equipment, referred to herein as "RiserSEA, is a more specific embodiment of Autonomous Constant-Vigilance System, referred to herein as AutoCV.

Figure 5A:
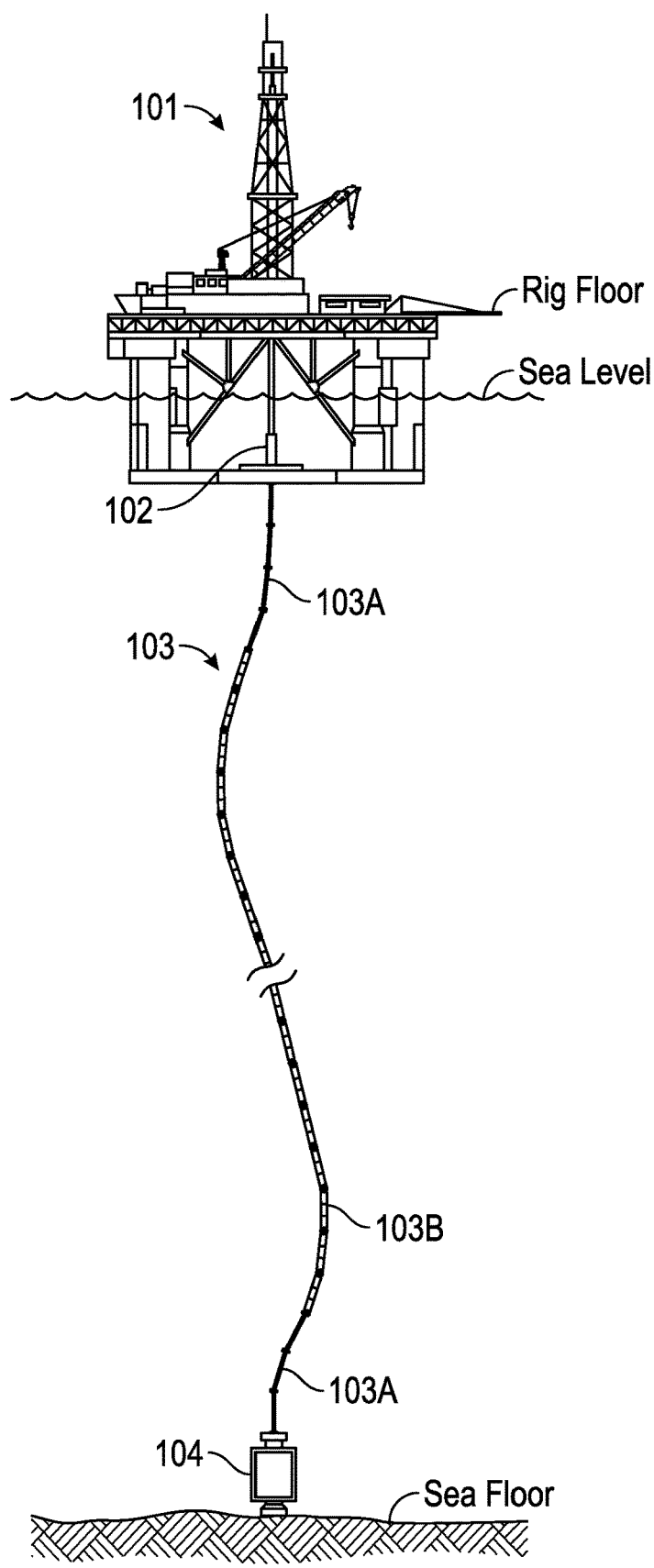
FIG. 5A is an elevational view of a floating drilling rig with a deployed riser connecting to a subsea BOP.
Figure 5B:
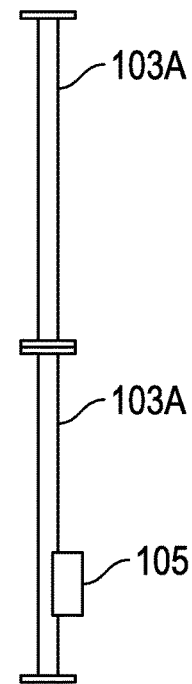
FIG. 5B is an elevational view of a floating drilling rig of risers such as those as indicated in FIG. 1A that do not include buoyancy jackets.
Figure 5C:
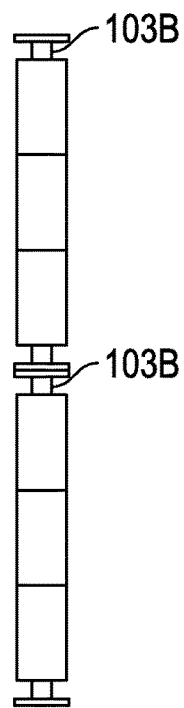
FIG. 5C is an elevational view of a floating drilling rig of risers such as those as indicated in FIG. 1A that do include buoyancy jackets.

Referring now FIG. 5A, FIG. 5B, and FIG. 5C, there is shown a floating drilling rig 101 with a Riser string extending to the blowout preventer 104. For illustration purposes the Riser string comprises of the telescopic joint 102 and Riser joints 103. Riser joints comprise of joints without buoyancy 103A, joints with buoyancy 103B and joints with instrumentation 105. During deployment, the Riser string may be treated as a slender flexible structure without inherent stability.

Figure 6A:
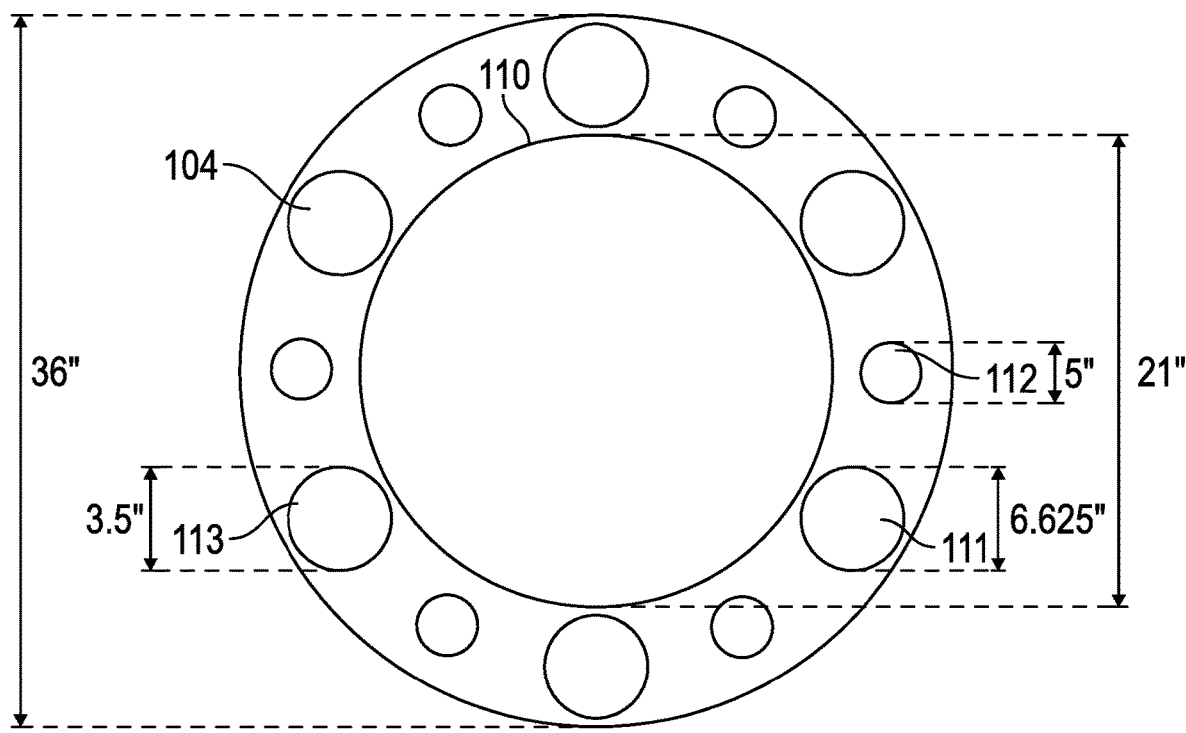
FIG. 6A is an end view of a possible marine drilling riser coupling.
Figure 6B:
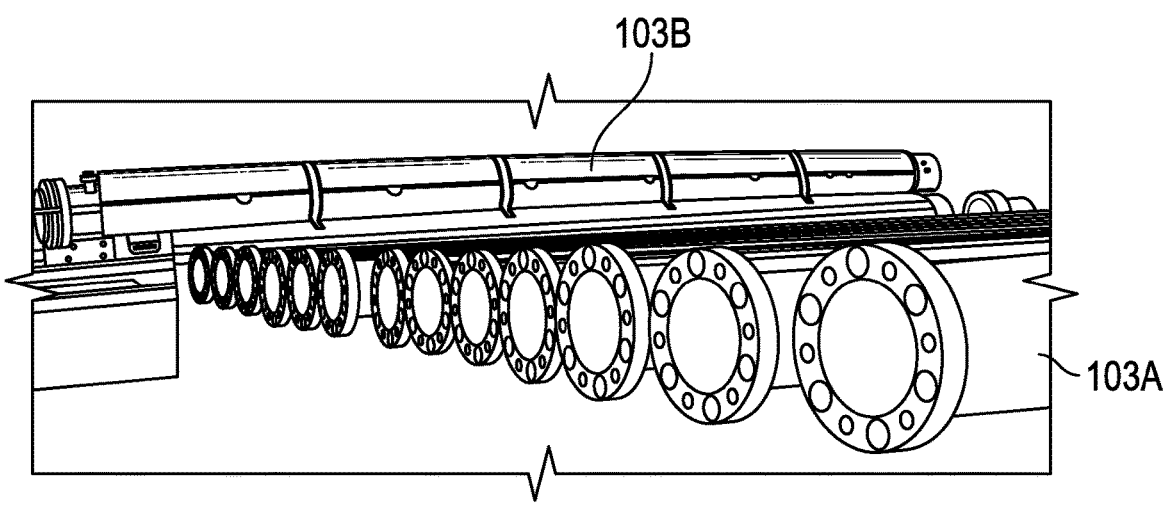
FIG. 6B is a view of risers in a shipyard prior to deployment.

FIG. 6A and FIG. 6B illustrates the end area (coupling) of a typical marine drilling riser joint comprising of the main tube 110, hereinafter referred to as "MT", and the auxiliary lines, hereinafter referred to as "AUX". The AUX lines comprise of the Choke and Kill lines 111 hereinafter referred to as "C&K", the Booster line 112 and the hydraulic line 113. Riser joints without any AUX lines or different combinations of AUX lines are also in use.

A Riser under deployment is subjected to multiple static, dynamic, transient and cyclic Loads from applied tension, pressure, rig motion, sea currents, weight of fluids and gases (drilling, production, control), waves, wind and similar items, in addition to the biological, chemical, electrochemical and mechanical actions of the environment and the drilling, control and production fluids and gases, hereinafter referred to as "Actions". Actions are mostly time dependent deterioration processes excluding accidents, such as a collision. The utilization of Risers in greater water depths amplifies significantly the effects of the Loads and Actions. Calculation details that until recently could be omitted, are now becoming important. However, the Riser 1D-NDI spot-checks and analysis still relies on old concepts, addressing old materials that do not reflect the modern day needs of deep-water Riser deployment and use.

A partial list of variables that influence the Riser integrity comprise of: a) Pressure; b) Geometry (diameter, wall thickness, ovality); c) material properties such as composition, yield strength and other; d) shape and neighborhood of Imperfections and e) Loads and Actions.

As the water depth increases, Riser designs share the Loads between the MT and the AUX, thus significantly complicating the RiserSEA that should also calculate the MT and AUX multidimensional stresses corrected for the MT and AUX material properties and geometry.

Figure 7:
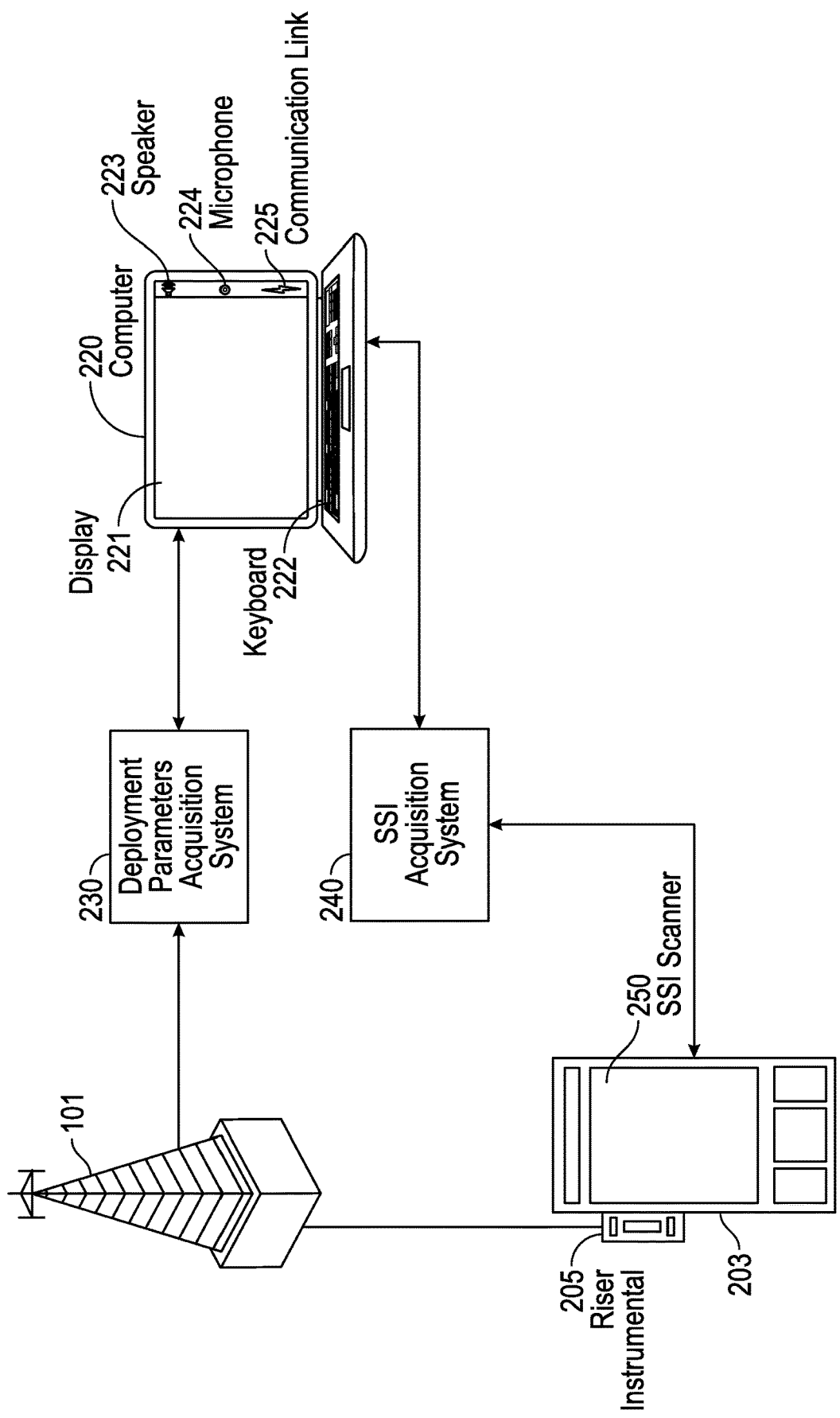
FIG. 7 is a RiserSEA and/or component of AutoCV block diagram in accord with one embodiment of the present invention.

FIG. 7 illustrates one embodiment of the RiserSEA comprising of at least one computer 220, at least one deployment parameters acquisition system 230 and at least one stress-significant-imperfection (hereinafter referred to as "SSI") acquisition system 240. Examples of deployment acquisition system 230 and acquisition system 240 are shown in my previous patents. In this example, riser 103, which are types of risers 103A or 103B, is being examined, typically each tube of one riser at a time with each of the risers separate and available for examination, such as at a depot as indicated in FIG. 6B. SSI scanner 250 is run through each of the tubes 110, 111, 112, and 113 of each riser. Once this is done, the combination of information can be utilized as explained above, to determine the fitness of the riser (or umbilical), what type of bends it can sustain, whether it should be removed or possibly placed where less bending will occur. This process could involve transporting the mathematical description of the riser to an FEA model where an analysis is made utilizing anticipated stresses applied to the riser. Using such an analysis, or other measurements, a Riser fitness Certificate can then be issued based on the results of the testing as indicated in FIG. 9A. In FIG. 9A, it will be seen that wall thickness is measured for each tube (such as center tube 110), minimal wall thickness variations, cross-sectional variations, estimated remaining strength, and the like.

It should be understood that SSI detection may include, but is not limited, to the API 16F "geometric stress amplifiers" and ASME B31.4 "stress intensification factors". Computer 220 comprises of a local and/or remote display 221, keyboard 222, permanent or removable storage, local and/or remote speaker 223 and/or earphone, local and/or remote microphone 224 and at least one communication link 225. The deployment parameters acquisition system 230 and SSI acquisition system 240 monitor sensors distributed around the rig 1, including but not limited to acoustic, barcode, chemical, color, conductivity, current, deformation, density, depth, density, direction, distance, eddy-current, electrical, EMAT, field, flow, flux-leakage, force, frequency, geometry, laser, length, level, location, motion, magnetic, optical, physical properties, pressure, rate, rfid, reluctance, resistance, rig motion, rpm, speed, stress, temperature, time, vibration, voltage, weight, similar items and combinations thereof and/or along with the instrumentation 205 on the riser joints.

Instrumentation 205, if utilized, comprises sensors for the above listed items that measure these items on the deployed risers so that instrumentation 205 effectively comprises SSI sensors. Wiring connections, umbilicals, acoustic mud modems, and the like, may be utilized to connect to/from RiserSEA surface processors 220 (or processors in AutoCV 10A, 10B riser processors, 10C subsurface processors) and the instrumentation 205 in the risers/umbilicals.

In one embodiment, each riser or selected risers in the riser string would include an instrumentation 205. At a minimum, the instrumentation 205 could be used to determine the overall angles of the deployed riser string and/or stresses on the riser string 3 as indicated by the bends shown in FIG. 1 or FIG. 5A. The SSI acquisition system 240 may induce programmable excitation into the SSI scanner 250 and monitor the SSI sensors 203.

Solving the Elasticity Equations

The main function of RiserSEA is to calculate Riser stress and strain. In the study of elasticity, stress and strain are typically expressed as systems of (x, y, z) partial differential equations that can be found throughout the literature along with some solutions using boundary conditions. A simpler approximation is to replace the partial differential equations with partial difference equations as published by C. Runge (Z. Math. Phys. Vol. 56, p. 225, 1908) or, preferably, even simpler equations or look-up tables. Reference 3, Appendix C "Compendium of Stress Intensity Factor Solutions" provides a number of practical approximations and solutions.

Figure 8:
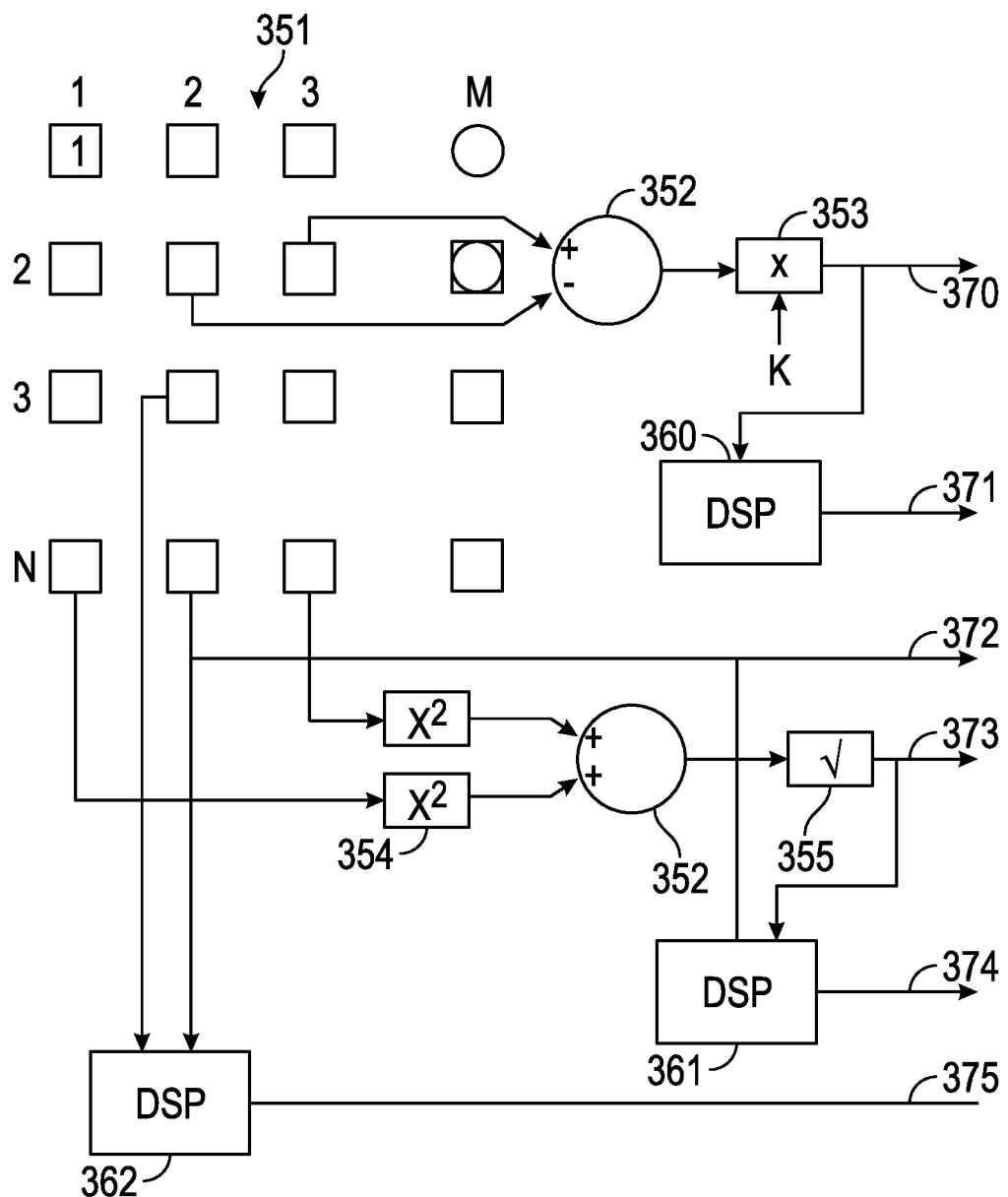
FIG. 8 is an illustration of an addressable sensor array in accord with one embodiment of the present invention.

The selection of the RiserSEA sensors and sensor configuration 351 for SSI scanner 350, shown in FIG. 8, starts by defining the SSI parameters that are Riser integrity-significant and stress-significant. This involves solving the stress equations for the multitude of SSI parameters and defining the minimum value(s) to be detected early on so preventive maintenance can be effective. This may involve FEA, test samples, experimentation or a combination thereof.

Therefore, the main function of computer 220 is to acquire a sufficient number of good quality specific SSI data from the sensor array of SSI scanner 350 through the SSI acquisition system 240 (see for example our prior applications for more details); to process and translate the data to an individual Riser 103 or other OCTG description; store said description in a lengthwise format; derive the Riser 103 boundaries; acquire Riser 103 deployment parameters through the deployment parameters acquisition system 230 and solve the elasticity equations to decide if Riser 103 is still fit for deployment in a string location, should be moved to another string location, should be re-rated, should be removed from deployment for remediation or be retired from service. Computer 220 may further suggest the type of remediation to return Riser 103 to service.

FIG. 8 illustrates a M×N addressable two-dimensional (hereinafter referred to as "2D") sensor array 351 of physical sensors, hereinafter referred to as "Sensors" or "SM,N", preferably installed on the inside or outside of the SSI scanner 250 or both. It should be understood that M and N represent the number of sensors that provide 100% inspection coverage and, therefore, the greater the OCTG size the greater the number of sensors for constant resolution. A three-dimensional (hereinafter referred to as "3D") sensor array comprises of at least two stacked sensors, such as SM,2, or a partial or complete 2D sensors arrays. 3D sensors are addressed as SL,M,N. The sensor arrays are preferably deployed with length measurement or time measurement converted to the length of the Riser pipe or other OCTG. In other words, scanner 250 is lowered through each tube 110, 111, 112, 113 of each individual riser such as when the risers are on the surface.

It should be understood that a particular sensor array 351 may comprise similar or different types of sensors and that each type of sensor may require a different type of fixed or programmable excitation from the SSI acquisition system 240. The excitation may be deployed inside SSI scanner 250, may be separately applied on the inside or outside of Riser 103, may be applied as a bias prior to the scan or any combination thereof. It should further be understood that the fixed or programmable excitation and the Sensors may be disposed on the inside of a Riser pipe(s), the outside of a Riser pipe(s) or any combination thereof.

Configuring the Sensor Array

Each inspection technique has advantages and disadvantages. Most require thorough cleaning of the Riser 103 and/or the removal of paint/coating and the re-application of paint/coating after the inspection. Again, this generates air and water contaminants in addition to high cost and low productivity. Once the inspection technique and the sensor(s) are selected, a number of Riser test samples with a number of pertinent preferably natural or man-made SSI may be used to define the excitation, sensor(s) mounting, detection range, sensor array configuration and the required signal processing. The sensor(s) excitation, detection range, the SSI sensor array configuration and signal processing would then define the spacing among sensors and the overall configuration of the sensor array 351. It should be understood that this process may be fine-tuned through a number of iterations.

Sensor Array Signal Processing

Computer 220 signal processing may address, read and combine signals from any of the Sensors from array 250 as shown in Equation 1 (70) through Equation 4 (73) resulting in virtual sensors, hereinafter referred to as "VSensor" or "VSN".

$$VS(70)=K^*(S3,2-S2,2) \quad \text{(Eq. 1)}$$

$$VS(01)=S3,1+S3,2+ \ldots +S3,N \quad \text{(Eq. 2)}$$

$$VS(01avg)=VS(01)/N \quad \text{(Eq. 3)}$$

$$VS(73)=\sqrt{[(SN,1)2+(SN,3)2]} \quad \text{(Eq. 4)}$$

Equations 1, through 4 and other equations may be a) hardwired using analog components such as amplifiers, filters, adder/subtractor 352, multiplier/divider 353, integrator/differentiator, similar items and combinations thereof; b) analog computers such as the [354, 352, 355] processing array; c) implemented in software by a digital signal processor 360 with at least one analog front end, hereinafter referred to as "DSP"; d) implemented with field-programmable-gate-array, hereinafter referred to as "FPGA" or any combination thereof. Constant K may be of fixed value, variable value through a potentiometer, variable or fixed value under computer 220 controls or DSP 360 control or any combination thereof.

The VSensor signals preferably correspond to different types of SSI and/or may form a system of equations that allows for the calculation of SSI critical parameters. It should be understood that certain physical sensors may be omitted, be replaced by VSensors or any combination thereof. For example, VS (373) may be an adequate replacement for S (N, 2) thus eliminating physical sensor S (N, 2), or allowing for a different type of sensor to be installed in the physical location S (N,2) generating signal 372. The relationship of Signals 372 and 373, generated by different types of sensors that are focused on the same location, may provide additional detailed knowledge about the material condition through the solution of a system of equations.

It should also be understood that sensor processing similar to the [VS(373), 372] pair or any other combination thereof may be reproduced in all three dimensions, thus giving rise to systems of multiple equations focused on specific material locations or material characteristics. For example, S(2,2) may be reproduced in one direction by $\sqrt{[(S2,1)2+(S2,3)2]}$ and in another direction by $\sqrt{[(S1,2)2+(S3,2)2]}$, the combination of all three signals giving rise to a another system of equations and a more-focused VSensor. Small area resolution requires fine-focus sensors, physical or virtual, that may be calculated by combining adjacent physical sensors such as above or even more focused such as the VSensor $\sqrt{[(S2,1)2+(S2,2)2]}$.

It should be apparent from the above that finer resolution results in a higher number of systems of equations that must be solved simultaneously and therefore, finer resolution requires much higher processing speed. It should also be understood that not all signals are useful all the time. For example, in one instance signal 370 may be meaningful and significant while in another instance signal 375 may be meaningful and significant. Instead of relying on computer 220 for the entire signal processing, a distributed approach, as shown in FIG. 4, is a preferable method to increase processing speed. For example, instead of computer 20 digitizing and processing signals 372 and 373, a local DSP 361 may digitize and process the signals and alert computer 220 only when signal 374 is meaningful and significant. It should also be understood that a single FPGA may comprise of multiple DSPs.

Again, it should be understood that the sensor array would comprise of a sufficient number of sensors and processing elements to provide 100% inspection coverage and, therefore, the greater the OCTG size the greater the number of sensors for constant resolution. It should further be understood that the number and configuration of Sensors 351 and signal processing should acquire a sufficient number of good quality specific data to facilitate the RiserSEA calculation of maximum stresses and strains. Computer 20 may further use the DSPs 360, 361, 362 for fast processing of the stresses and strains.

Sensor Array Assembly

Metallurgy and fatigue signal comprise critical SSI parameters. They are mostly very low magnitude, typically order(s) of magnitude lower than signals from visible Imperfections. In order to detect and recognize such critical signals, the Sensor array must maintain a constant 3D relationship with the excitation inducer, a constant 3D relationship among the Sensors, a constant 3D shape and preferably exhibit no resonance frequencies within the range of SSI. It should be noted that the ride chatter of the sensors in U.S. Pat. No. 2,685,672 overshadows the metallurgy and fatigue signals. The ride chatter is the result of the spacing variations between the sensor and the material.

The final RiserSEA sensor array 251 configuration would most likely be complex resulting in a complex sensor holder that is best manufactured through machining, molding, additive manufacturing, similar techniques and combinations thereof. The sensor holder may comprise of a single or multiple segments. Additive manufacturing, such as using a 3D printer, allows for greater assembly flexibility, customization and rapid production. For example, the 3D printer may be paused; dimensions may be measured and adjusted; components, including but not limited to cooling, electronics, heating, hydraulics, pneumatics, sensor(s), storage and wiring may be installed; 3D printing may resume and be paused again for adjustments and the installation of additional components and so on and so forth until the Sensor array or a segment is completed.

The testing and qualification of the completed Sensor array may include but is not limited to detection testing, electrical testing, environmental testing, isolation testing, insulation testing, mechanical testing, scanning speed testing, and testing for resonance frequencies similar tests and combinations thereof. These tests would result in calibration coefficients that normalize the performance of the Sensor assembly including, but not limited to, resonance frequencies correction factors. The Sensor calibration coefficients may be stored on non-volatile storage onboard the Sensor array, on portable storage, on an on-line secure database, similar items and combinations thereof.

System Signal Processing

Again, computer 220 would preferably assemble and solve the Riser 103 elasticity equations using the good quality specific data that are sufficient in number to facilitate the RiserSEA calculation of maximum Riser stresses and strains.

Good Quality Specific Data: The selection of the Riser-SEA sensors and sensor configuration 251 starts by defining the minimum SSI parameters that is stress-significant. This involves solving the stress equations for the multitude of specific SSI parameters and defining the minimum value(s) to be detected. It should be noted that the remaining-wall-thickness alone is just one of the parameters, not the ultimate decision yardstick.

Good Quality: Refers to data resolution, such as pre-processing, sampling rate, the analog-to-digital conversion bits and SSI detection repeatability. It should be understood therefore that the definition of good quality is Imperfection specific.

Sufficient number of Inspection Data: A Sufficient Number of good quality specific data refers to Inspection Coverage, the volumetric percent coverage of each Riser pipe and subsystem. Inspection Coverage preferably may be defined by the combination of minimum SSI parameters to be detected, the detection sensor configuration and the desired scanning speed (one of the financial considerations along with the transportability and ease of deployment of the RiserSEA equipment).

Often, the inspection technique and/or the detection sensors are the controlling factors that redefine the minimum SSI parameters that can be detected. The minimum detectable SSI parameters are preferably defined as a geometric function of wall thickness (T) like (0.05*T) L×(0.05*T) W×(0.1*T) D (Length, Width and Depth) that may then be translated to a VSensor equation(s). The following examples discuss the Inspection Coverage of a 21.0″ OD, 75′ length MT with 0.750″ wall thickness. The inspection is performed from the ID:

Sensor overlap method: A 20% sensor reading overlap with a 0.5″ diameter sensor (typical Ultrasonic sensor) results in one reading every 0.4″ or a total of about 346,500 readings for 100% MT inspection coverage.

Minimum SSI dimensions: Assuming that the minimum SSI dimensions were calculated as 1.0″×1.0″×0.05″, it would translate to about 109,800 readings for 100% MT inspection coverage.

Number of readings per minimum SSI: It is preferable that a minimum of 2 readings per minimum SSI are obtained resulting in about 219,600 readings for 100% inspection coverage (from the ID). The minimum number of readings threshold is typically set between 5 and 9 in order to eliminate false sensor readings.

API 579-1/ASME FFS-1 formula 4.1: Although 4.1 addresses General Metal Loss, not stress analysis, it could be used as a starting point resulting in one reading every 1.29″ or about 33,500 readings for the detection of MT general Metal loss. Requiring a minimum of 20% sensor overlap would result in about 52,400 readings. Requiring a minimum of 2 readings would result in about 105,000 readings for 100% MT inspection coverage.

Once the number of sufficient readings is established, the scanning speed (production rate) may be calculated from the data acquisition speed of the RiserSEA or the RiserSEA may be designed to meet the required scanning speed. Again, one way to increase the production rate (scanning speed) is through distributed signal processing whereby analog computers, discreet logic; DSP(s), FPGA(s) and ASIC process certain signals, solve certain equations or any combination thereof as shown in FIG. 8.

As discussed earlier, RiserOEMs preferably take four (4) Ultrasonic wall thickness readings (90° apart) around the MT circumference every two (2) to five (5) feet of length. The maximum number of readings on a 75′ joint MT would then be 152 readings, four readings every 2′; indeed an insufficient Inspection Coverage for stress-analysis or even General Metal Loss fitness calculations.

Calculating Stresses

A unique and novel feature of the present invention is the tuning of the Sensor 250 configuration and excitation, the signal pre-processing, the sampling rate and the final processing to the specific characteristics of SSI Imperfections to facilitate and optimize the solution of the stress and strain equations by substituting the equation(s) variables with processed sensor signals. For example, the CSA of each Riser joint MT may be calculated from the inspection data by one or more of VS(01) (Eq. 2), VS(01avg) (Eq. 3) and other equations using absolute, average, corrected, coverage, differential, integral, local, maximum (peak), minimum and remaining values, rate of change values, time dependent values, similar items and combinations thereof. Again, the calculated CSA and other calculated values of each Riser joint may be stored in a lengthwise array in computer 20 memory. Rate of change values, time dependent values and other ratios, differences, propagation and similar items may be calculated from the stored Riser joint lengthwise arrays of prior inspections.

In another example, stress is defined as ($\sigma$=Force/Area); where Area may be substituted by the calculated CSA of each Riser joint. Force may comprise of one or more of bending, buckling, compression, cyclic loading, deflection, deformation, drilling induced vibration, dynamic linking, dynamic loading, eccentricity, eccentric loading, elastic deformation, energy absorption, feature growth, feature morphology migration, feature propagation, impulse, loading, misalignment, moments, offset, oscillation, plastic deformation, propagation, shear, static loading, recoil, strain, stress, tension, thermal loading, torsion, transient loading, twisting, vibration, vortex induced vibration and a combination thereof. A force, such as tension, may be monitored in real-time by deployment parameters acquisition system 30, thus, by monitoring the Riser instantaneous tension, the instantaneous stress may be calculated for each Riser joint in the string. Alarm(s) may be raised when the calculated stresses exceed preset levels.

The stored CSA values along with all other stored values of each Riser joint may be used to arrange the Risers into a Riser string. When the string configuration is completed, computer 20 may automatically create a string model using the joint identification and its location in the string translated to water depth. With the mud density known, computer 20 may calculate, for example, hoop and other stresses for each Riser joint in the string.

It should be understood that computer 20 may calculate multiple solutions before reaching an optimal solution. Computer 20 may be programmed with assessment procedures and Stress and Strain equations and approximations found in the literature, including but not limited, to the following references.

API 16F Section 5: Design
API 16F Section 17: Operation and Maintenance Manuals
API 16F Appendix A: Stress Analysis
API 16F Appendix B: Design for Static Loading
API 16F Appendix D: Bibliography
API 16Q Section 3: Riser Response Analysis
API 16Q Appendix B: Riser Analysis Data Worksheet
API 16Q Appendix D: Sample Riser Calculations
API 16Q Appendix F: References and Bibliography
API 579-1/ASME FFS-1 is herein below referred to as "API 579"

API 579 Section 2: Fitness-For-Service Engineering Assessment Procedures

API 579 Section 3: Assessment of Equipment for Brittle Fracture

API 579 Section 4: Assessment of General Metal Loss

API 579 Section 5: Assessment of Local Metal Loss

API 579 Section 6: Assessment of Pitting Corrosion

API 579 Section 7: Assessment of Blisters and Laminations

API 579 Section 8: Assessment of Weld Misalignment and Shell Distortion

API 579 Section 9: Assessment of Crack-Like-Flaws

API 579 Section 12: Assessment of Dents, Gouges and Dent-Gouge Combinations

API 579 Appendix B: Stress Analysis overview for a FFS Assessment

API 579 Appendix C: Compendium of Stress Intensity Factor Solutions

API 579 Appendix D: Compendium of Reference Stress Solutions

API 579 Appendix E: Residual Stress in Fitness-For-Service Evaluation

API 579 Appendix F: Material Properties for an FFS Assessment

API 579 Appendix G: Deterioration and Failure Modes

ASME B31.4 Chapter II Design

ASME B31.402 Calculation of Stresses

ASME B31.403 Criteria

ASME B31.4 Chapter VI Inspection and Testing

ASME B31.4 Chapter VII Operation and Maintenance Procedures

ASME B31.4 Chapter IX Offshore Liquid Pipeline Systems

As the water depth increases, Riser designs share the tension between the MT and the AUX, thus significantly complicating the RiserSEA. For example, sea currents bend the riser string as illustrated in FIG. 5A. When pipe bends, its major-axis is under tension and its minor-axis is under compression. In order to minimize the stored energy, the pipe assumes an oval shape, referred to as out-of-roundness or ovality. When the Loads are shared between the MT and the AUX, one of the AUX lines could be on the outside of MT's major axis (under higher tension) and one on the outside of MT's minor axis (under higher compression). In order to minimize those stresses, the Riser joint would tend to rotate in order to place the AUX in the neutral axis thus resulting in multidimensional stress. Furthermore, each AUX would also bend and thus it would undergo ovality under the influence of higher tension and compression. Therefore, RiserSEA must also translate the MT bending stresses to AUX multidimensional stresses corrected for the AUX material properties and geometry.

Scan the Riser—

Recognize Features and deterioration mechanism—

Apply time-depended deterioration mechanism correction factors resulting in updated inspection data.

Use the Formulas in FIGS. 3A and 3B to calculate Critical Deployment Parameters for each Riser joint using the updated inspection data.

Create a Riser string Model using the Critical Deployment Parameters of each Riser joint and calculate Critical Deployment Parameters for the Riser String.

Monitor Deployment Parameters and calculated Maximum Stresses.

Alarm if Maximum stresses exceed a preset Threshold.

Riser Fitness Certificate

Figure 9B:
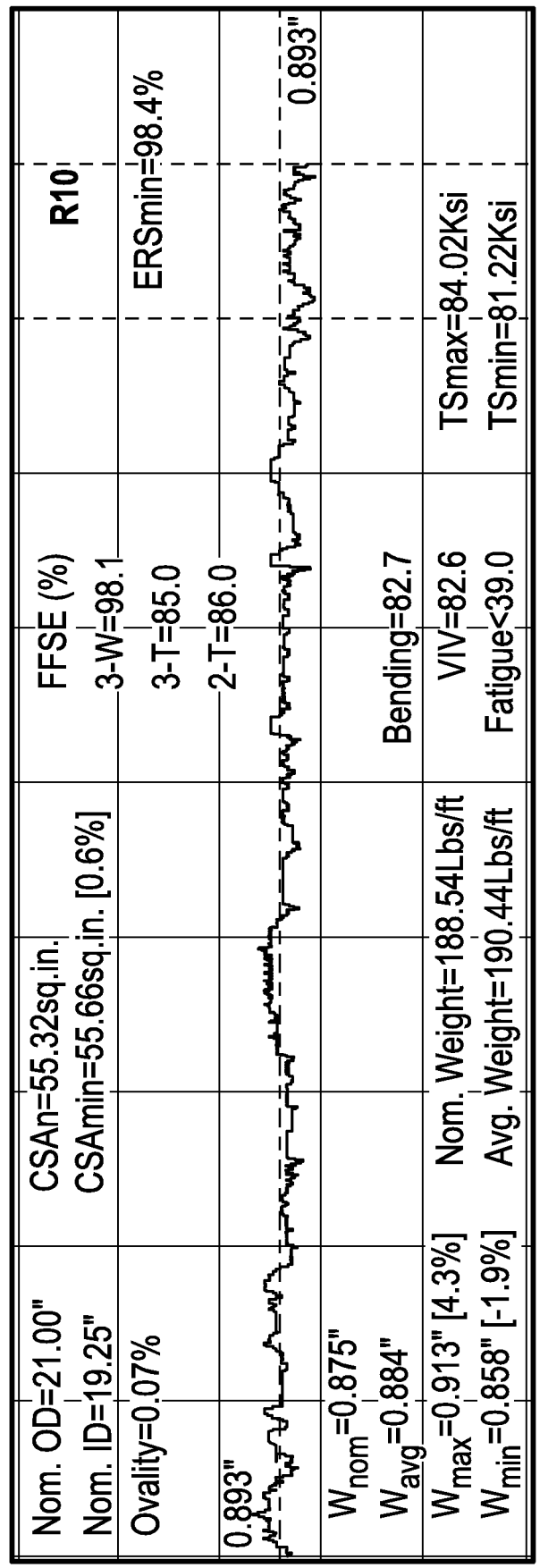
FIG. 9B is an example of signals produced in accordance with RiserSEA in accord with one possible embodiment of the present invention.

As discussed earlier, FIG. 9A and FIG. 9B illustrates a fitness certificate, with FIG. 9B showing readings on, for example, riser 10. The certificate duration is set to 75% of the Riser estimated remaining useful life. Readings may be made for each of the pipes as indicated by MT, C, K and B (main tube 110, two choke and kill lines, 111, 111, booster line 112) wherein the nominal outer diameters and wall thickness are known. Various parameters are measured from each tube. FIG. 9B shows various information including a graph of the wall thickness profile for the main tube. The main tube is the main load bearing structure of the riser. The analysis may comprise use of the critically flawed path of FIG. 4.

Figure 10:
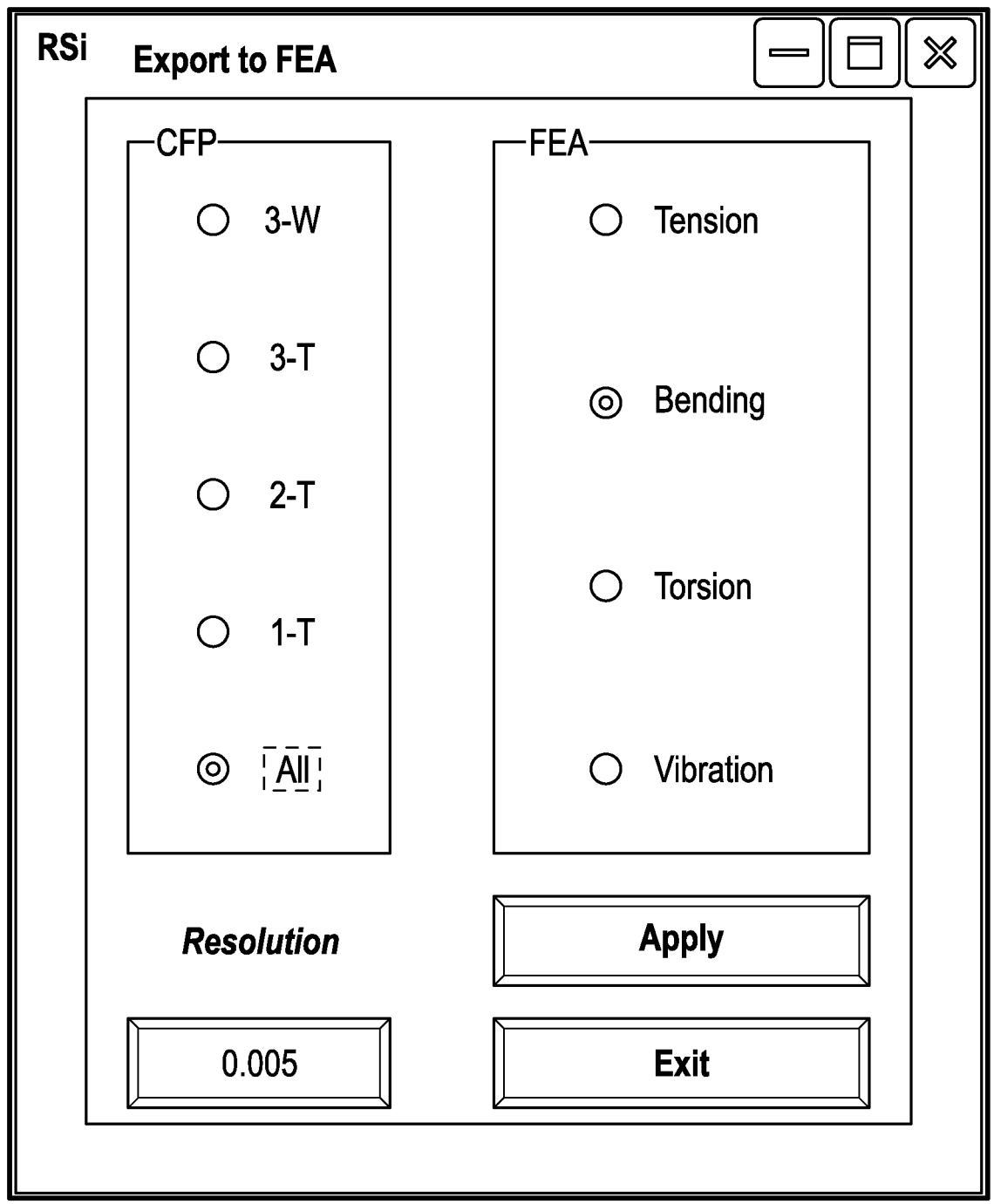
FIG. 10 is an example of an export to FEA analysis of pipes, risers, umbilicals, and the like in accord with one possible embodiment of the present invention.

FIG. 10 shows export of measured data to an FEA engine screen is shown. A resolution is selected. A type of FEA analysis is selected. CFP refers to critically flawed path.

FIG. 10 shows a particular type of signals that may be produced by the system shown in FIG. 2 but the invention is not limited to particular types of signals but any signals produced in conjunction with such an analysis that are then used for export to an FEA machine. In this case, 3-W signals refers to signals related to thickness changes, tapers, rodwear, and so forth regarding general and local metal loss. 3-T signals refer to metallurgy, hardness changes, corrosion, pitting, critically flawed areas, and so forth. 2-T signals measure approximately ⅛ inch regarding local metal loss, pitting corrosion, blisters and laminations regarding pitting corrosion, crack-like flaws, and fatigue.

The various types of FEA analysis creates a theoretical string and subjects the theoretical string to various theoretical forces, e.g. bending, tension, torsion, and vibration, to test the theoretical string. Any of these theoretical forces can be used or multiple forces. For example, any two of bending, tension, torsion, and vibration could be used or more. Cyclical loads can be used. The weights of fluids may be part of the calculations. Water currents can be considered. A range of operational loads is therefore available. However because the string is based on as-is measured values (rather than the values when manufactured) the analysis is representative of actual strings that have wear due to use as detected by the signals discussed above. The resolution is selected where smaller resolution requires longer FEA analysis.

1D-EMI Inspection Equipment Description

Figure 11:
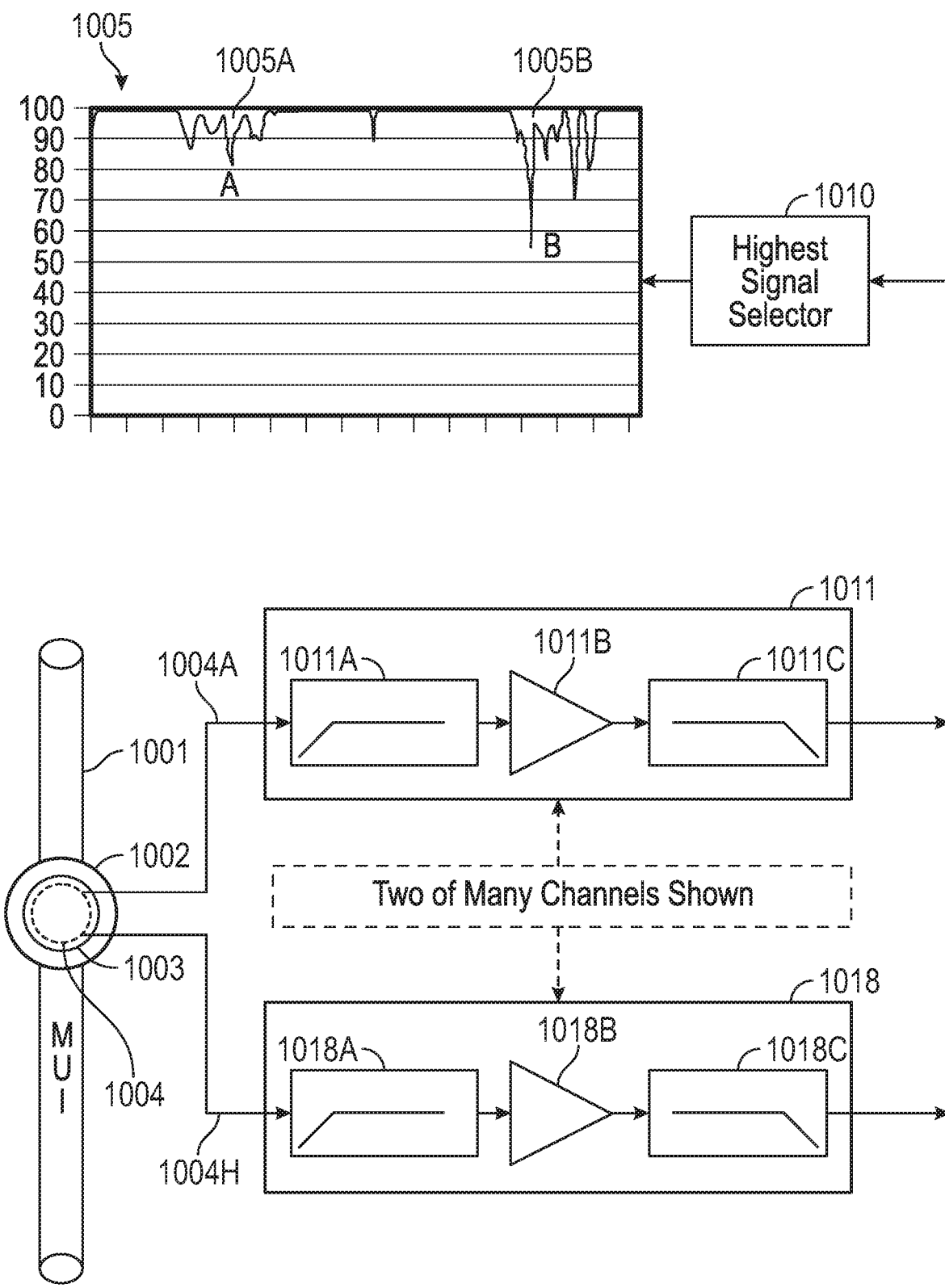
FIG. 11 illustrates a block diagram of a 1D-EMI non-destructive inspection system.

FIG. 11 illustrates a block diagram of an eight channel 1D-EMI inspection system similar to the one in U.S. Pat. No. 2,685,672 utilizing the MFL principle. In particular, the sensors and their arrangement as described in 672 FIGS. 5 and 6 are still in use with hundreds of units employed worldwide in portable or stationary configurations. The same sensor configuration is also illustrated in FIG. 7 of U.S. Pat. No. 2,881,386 and similar sensors configuration is also used in the pipeline pig of U.S. Pat. No. 3,225,293.

The magnetizing coil 1003 of the inspection head 1002 induces excitation into MUI 1001. It should be understood that the magnetic field can be applied in any direction. U.S. Pat. No. 2,685,672 shows the induction of a longitudinal magnetic field while U.S. Pat. No. 3,202,914 shows the induction of a transverse magnetic field. It should further be understood that one or more permanent magnets may be use instead of a magnetizing coil or a combination thereof. The inspection sensors 1004 signals 1004A through 1004H are processed by the high-pass filters 1011A through 1018A to eliminate low frequencies and any dc components. The signals 1004A through 1004H are then amplified by amplifiers 1011B through 1018B and are then filtered by the low-pass filters 1011C through 1018C to eliminate high frequencies. The highest signal selector 1010 compares the highest of the band-limited signals 1004A through 1004H to a preset threshold level and eliminates all signals below the threshold level. Thus, the inspection trace 1005 that is presented to the inspector typically shows the frequency band-limited highest signal that exceeds a preset threshold level. This type of signal acquisition and processing creates detection dead-zones and it is not suitable for RULE assessment or screening.

The MFL principle of operation is eloquently described in U.S. Pat. No. 2,194,229: "It is old in the art to test magnetic material for flaws by passing therethrough a magnetic flux, providing means responsive to variations in the flux, and thereby locating regions of abnormal magnetic reluctance"; and herein lies the problem that has plagued the 1D-NDI all along. 1D-EMI units flag " . . . regions of abnormal magnetic reluctance" in ferromagnetic materials and UT units flag regions of echoes. They do not identify the material features; they do not detect the failure-potential of any feature, including but not limited to imperfection, and most importantly, they do not assess the material fitness for service under the application constraints or the material RUL. Instead, they rely upon an inspector to monitor and interpret the MFL or UT traces and instruct a manual verification crew to locate the flagged " . . . regions of abnormal magnetic reluctance" or echoes on the MUI for further manual investigation, but only for MUI regions that give rise to signals that exceed a preset magnitude threshold, a 1D-NDI shortcoming that can still be found, for example, in U.S. Pat. No. 6,594,591 FIG. 9 and will be discussed in detail further below. Thus, OCTG owners typically specify that the verification crew investigate at least .+-.six inches on either side of an indication. It is not uncommon for the verification crew to miss entirely the flagged MUI region or even the flagged MUI from a simple miscount. This manual verification problem is exemplified on pipelines that are miles long or railroads, a two vehicle inspection/verification solution described in U.S. Pat. No. 5,970,438.

Once an imperfection is located by the verification crew and sufficient measurements are recorded, the information is forwarded to the owner of the MUI to decide its disposition. In order to decide the disposition of the MUI, the owner preferably performs an RULE assessment with the limited data the verification crew was able to gather. Often, a single pass/fail approach is implemented.

It is therefore desirable to provide means to retrofit AutoRULE to the hundreds of 1D-EMI units deployed worldwide. It is imperative therefore, that AutoRULE detects and recognizes the "as-is" MUA features impacting its FFS and RUL including, but not limited to, imperfections. The imperfection recognition was discussed in the AutoNDI prior application Ser. No. 10/995,692 (U.S. Pat. No. 7,155,369) using the extraction matrix and application Ser. No. 11/079,745 (U.S. Pat. No. 7,231,320) using spectral analysis to derive a frequency based flaw spectrum for further use by the AutoNDI.

A Brief 1D-EMI History

The one to one correspondence of FIG. 11 1D-EMI elements to the elements illustrated in FIG. 1 of U.S. Pat. No. 1,823,810 is as follows: A magnetic field (excitation) is induced into MUI 1001 (810 FIG. 1 magnetizable material 6) by a coil 1003 (810 FIG. 1 exciting coil 14). The sensor 4 (810 FIG. 1 search coil 19) signal is processed by the high-pass filter 1011A (810 FIG. 1 capacitor and resistor connected to the grid of the vacuum tube) and it is then amplified by amplifier 1011B (810 FIG. 1 dual triode vacuum tube) and presented to the inspector (810 FIG. 1 indicator 21) instead of an inspection trace 1005. The limited frequency response of (810 FIG. 1 indicator 21) acts as a lowpass filter 1011C. Since U.S. Pat. No. 1,823,810 depicts a single channel NDI system, there is no need for a highest signal selector 1010. However, the sensor 1004 (810 FIG. 1 search coil 19) signal is compared to an operator adjustable threshold level (810 FIG. 1 the resistor connected to the grid of the first vacuum tube is connected to a negative (threshold) voltage). Only sensor signals that exceed this threshold (negative voltage) would propagate and be shown to the inspector (810 FIG. 1 indicator 21).

The prolific 1D-EMI unit of U.S. Pat. No. 2,685,672 essentially consists of eight U.S. Pat. No. 1,823,810 channels with the addition of a highest signal selector. It should be understood that 1D-EMI units consisting of two to forty eight channels have also been constructed and the number of channels any 1D-EMI deploys should not be interpreted as a limitation to this invention. In the 1960s the vacuum tubes were replaced by transistors, as shown in U.S. Pat. No. 3,202,914 FIG. 6, and in the 1970s by integrated circuit amplifiers. Meters and chart recorders were used for the operator readout until the mid-1980s when they were replaced by computers with their colorful displays and printouts. However, no matter how sophisticated the operator readout is, it will never show information that was lost during the acquisition and processing of the sensor signals.

The brief 1D-EMI history shows that although the electronic circuits have followed the advances in technology, the inspection philosophy and methods have not. The 1D-EMI limitations and pitfalls of a century ago still plague the modern 1D-EMI, regardless of the inspection technique used. For example, U.S. Pat. No. 6,594,591 applies the combination of sensor signal filtering and threshold prior to any signal evaluation to both EMI and UT.

1D-EMI Loss of Sensor Signal Frequency Spectrum Information

As discussed earlier, the 1D-EMI high-pass filters 1011A through 1018A eliminate low frequencies and dc components for system stability and the low-pass filters 1011C through 1018C to eliminate high frequencies to remove the "noise". Useful frequency components of the sensor signal are therefore discarded before being evaluated and any useful information they may contain is prematurely and irreversibly lost rendering this type of signal acquisition and processing unsuitable for AutoRULE. Referring to FIG. 6 of U.S. Pat. No. 3,202,914, capacitor 51 and its associated components form a high-pass filter that prematurely and irreversibly discards low-frequency components of the sensor signal while capacitor 48 and its associated components form a low-pass filter that prematurely and irreversibly discards high-frequency components of the sensor signal. Other such examples can be found in U.S. Pat. No. 2,582,437 (see FIG. 1 capacitor 13 and resistor 40); in U.S. Pat. No. 1,823,810 (see FIG. 1, amplifier 20) as well as in U.S. Pat. No. 5,671,155 (see FIG. 1, AC-couplers 6) and U.S. Pat. No. 5,943,632 (see FIG. 1, AC-couplers 6). Another such example using digital filters is shown in FIG. 8 of U.S. Pat. No. 5,371,462 showing a " . . . flow chart of an algorithm for pre-processing to remove DC and low frequency components" from the sensor signal.

Scanning Speed Effects on the Sensor Signal

U.S. Pat. No. 2,770,773 also encompasses many elements of the above to detect corrosion pitting and clearly states a frequency spectrum processing essential element: the imperfection frequency spectrum versus scanning speed interdependence. The high-pass filters of FIG. 7 (capacitors 66, 67 and resistors 69, 70) remove many unwanted " . . . signal producing variables such as separation from the casing wall, wall roughness, misfit . . . " [Column 6, Line 15]. Following the high-pass filter is a band-pass filter " . . . to pass frequencies in the band between about 3 and 20 cycles per second, as this is the characteristic frequency range of signal due to the passage of the shoe 15 across a casing corrosion pit at a transverse speed of twenty feet per minute. This frequency band related to the speed of traverse of the instrument 10 through the casing 12 will, of course, be varied to suit any other traverse speed selected" [Column 6, Line 33]. Therefore, it is well known in the art that the same imperfection will appear differently in the sensor signal frequency spectrum depending on the scanning speed. It is also well known in the art that fixed frequency filters always pass/discard the same frequency band, thus 1D-EMI systems, such as the ones in U.S. Pat. Nos. 5,671,155 and 5,943,632, always propagate for further processing undefined frequency components of the sensor signal again, rendering this type of signal acquisition and processing unsuitable for AutoRULE.

Another early observation of the NDI industry is the scanning speed versus signal amplitude proportional interdependence for coil sensors. U.S. Pat. No. 2,881,386 (see FIGS. 10 and 11) provides a technique for amplitude compensation for the scanning speed variations.

AutoRULE can only be carried out when the MUA features, including but not limited to imperfections, are recognized and are identified. Automatic features recognition demands that the features signal amplitude and frequency spectrum be compensated for the idiosyncrasies of the scanning system and the effects of the different scanning speeds. It is one possible objective of this embodiment of the invention to determine the inspection system response characteristics, to track the scanning speed and preserve, normalize and automatically analyze the sensor signal frequency spectrum for all the spectrum components that include non-redundant information spanning from Fatigue to wall thickness.

1D-NDI Calibration Limitations

Figure 12A:
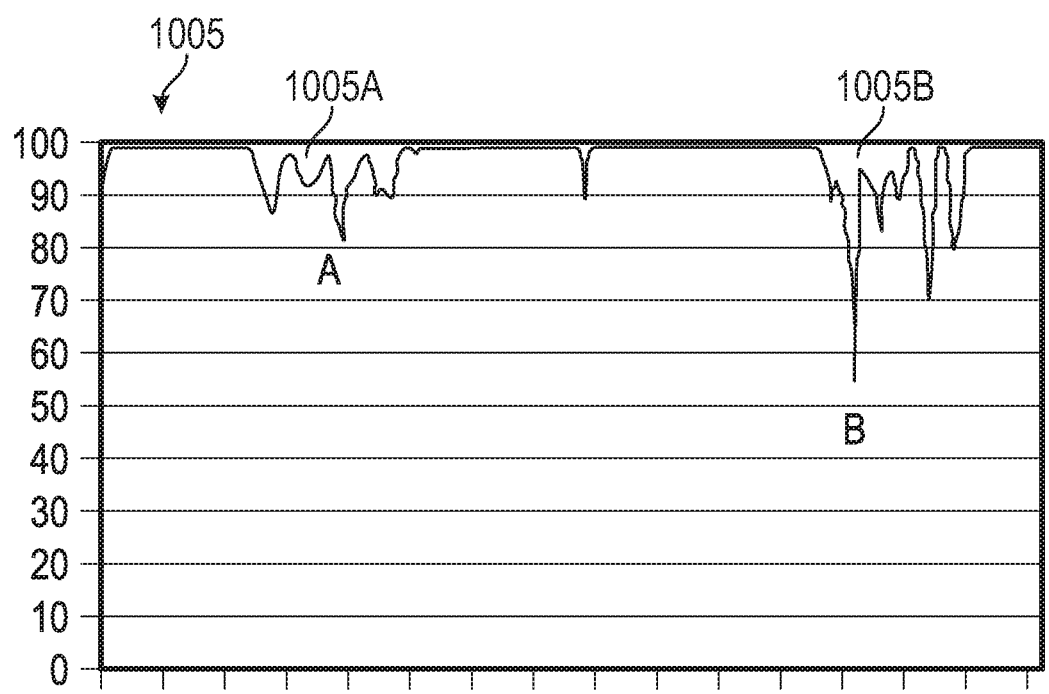
FIG. 12A illustrates a 1D-EMI inspection trace for a mid-wall imperfection.
Figure 12B:
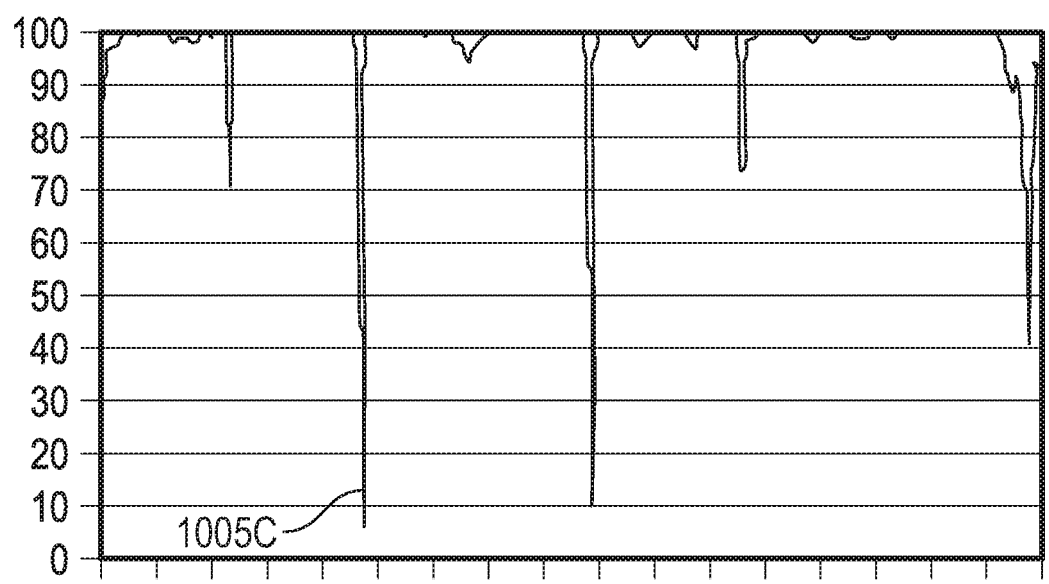
FIG. 12B illustrates a 1D-EMI inspection trace for machined (man-made) calibration notches.

FIG. 12A illustrates the 1D-NDI inspection trace 1005 of an OCTG that failed at imperfection 1005B. The OCTG had two mid-wall imperfections 1005A and 1005B and failed during hydro testing. Prior to assembly into a marine drilling riser, the OCTG was inspected by a state of the art 1D-NDI. The 1D-NDI system was calibrated using a calibration joint with machined notches, a 1D inspection industry standard but faulty practice further illustrated in FIG. 26C. FIG. 12B illustrates the 1D-NDI inspection trace of a calibration notch 1005C.

Figure 12C:
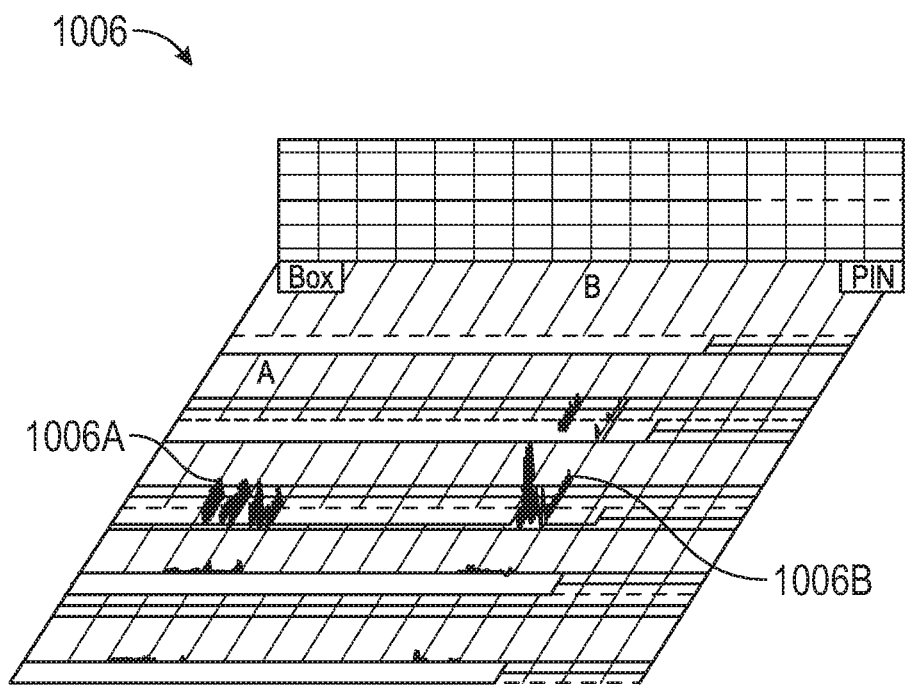
FIG. 12C illustrates the flaw spectrum of the mid-wall imperfection of FIG. 12A.
Figure 12D:
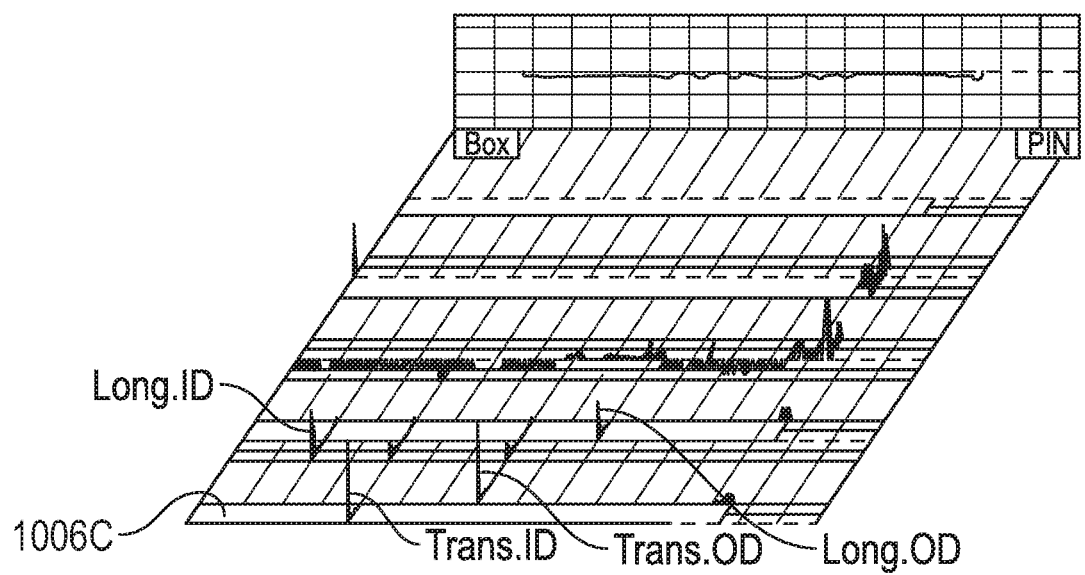
FIG. 12D illustrates the flaw spectrum of the machined (man-made) calibration notches of FIG. 12B.

FIG. 12C illustrates the flaw spectrum of the same OCTG mid-wall imperfections 1006A and 1006B, corresponding to 1005A and 1005B, and FIG. 12D illustrates the Stylwan flaw spectrum of the calibration notch 1006C, corresponding to 1005C. The reason of this failure can easily be deduced from FIGS. 12C and 12D. The Stylwan flaw spectrum of FIG. 12C clearly shows that the mid-wall imperfections 1006A and 1006B are utterly unrelated to the calibration notches 1006C of FIG. 12D. It is also easy to see how 1D-NDI would mislead someone to believe that the mid-wall imperfections 1005A and 1005B of FIG. 12A are somehow related to the calibration notches 1005C of FIG. 12B and setup the 1D-NDI equipment erroneously, having no way of knowing any better (Knowing that the high threshold level set by the calibration will hinder the detection of the mid-wall imperfections 1005A and 1005B with 1D-NDI until they burst during hydro testing). Imperfections 1005A and 1005B were missed by 1D-NDI because their signal amplitude did not exceed the threshold level that was erroneously set to detect machined calibration notches. It should also be noted that when a single pass/fail measure is utilized, it would eventually lead to equipment that focus on passing the particular single measure. This is also the case with 1D-NDI. Closer scrutiny of the 1D-NDI sensor structure and signal processing would show that both are fine tuned to pass the calibration notches test while they are likely to miss imperfection 1007B of FIG. 13, yet another 1D-NDI problem root cause. It is another possible objective of an embodiment of the invention to establish a scanning/inspection system calibration means and methods adept for AutoRULE 1D-NDI Remediation Limitations FIG. 13A illustrates a section of MUT with an imperfection 1007A. A typical 1D-NDI remediation practice states: "An external imperfection may be removed by grinding . . . . Where grinding is performed, generous radii shall be employed to prevent abrupt changes in wall thickness . . . . The area from which the defect is removed shall be reinspected . . . to verify complete removal of the defect". This statement further illustrates the limitations of 1D-NDI.

"Grinding" actually does not "remove" an imperfection. It just shifts the imperfection 1007A morphology (shape) from one with high stress concentration 1008A (due to the "abrupt changes in wall thickness") to imperfection 1007B with lower stress concentration 1008B (due to the "generous radii"). For example, if the depth of the original external imperfection 1007A was 10% of the material wall thickness, the wall loss in the OCTG region 1007B would still be 10% (or greater) even after the imperfection 1007A was morphed ("completely removed") into 1007B by "grinding", resulting in an OCTG with altered FFS and reduced RUL.

As discussed earlier, the 1D-EMI high-pass filters 1011A through 1018A eliminate low frequencies and dc components and therefore prematurely and irreversibly eliminate imperfection 1007B information thus, creating "detection dead-zones" misleading great many to believe and actually verify the "complete removal of the defect", when in fact, the form-shifted "external imperfection" 1007B is still clearly visible with the naked eye and the wall loss is still 10% (or more). If imperfection 1007B was the result of OCTG stretching, such as a neckdown, instead of grinding, 1D-NDI would miss imperfection 1007B entirely and classify the OCTG with the reduced cross sectional area erroneously. Strength of material knowledge teaches that the reduced cross sectional area of the material reduces the ability of the material to absorb energy thus altering its FFS and reduces its RUL.

FIG. 13C illustrates a dangerous condition where imperfection 1007A was partially morphed leaving behind a failure seed 1007C with increased stress concentration 1008C. A similar example is shown in FIG. 26D element 1159. 1D-NDI would miss imperfection 1007C as a result of the 1D-NDI detection dead-zones arising from the combination of filters and threshold. It should be understood that this recommended 1D-NDI remediation method does not take into account the imperfection neighborhood nor does it optimize the FFS or RUL of the OCTG. It is yet another possible objective of an embodiment of the invention to establish remediation means and methods adept for AutoRULE.

1D-NDI Magnitude Threshold Versus Imperfection Pattern Recognition

As FIG. 12C illustrates, the Stylwan flaw spectrum detection of imperfections 1006A and 1006B is based on pattern recognition, not signal amplitude alone. Therefore, failure seeds, like imperfection 1006A, can be detected early on regardless of their signal amplitude.

By now, it should be easy to recognize the calibration notches 1006C. However, those notches were machined on new defect-free material and they meet strict geometry standards, as it is further shown in FIG. 26C. Therefore, their flaw spectrum signature is extremely simple and easily recognizable. On the other hand, imperfections in nature are mostly found on used material, they are rarely alone, they are multifaceted and give rise to complex flaw spectrums that are not always easily recognizable. Furthermore, a key weaknesses of any manual process, such as the manual verification, is the uncontrollable "human factors". If imperfection 1006A was found instead on heavily used material along with other imperfections, would a trained inspector always distinguish it in the resulting flaw spectrum clutter? It is the aim of this invention to answer this question with confidence by providing a computer, a sensor interface and a program to scan the sensor signals for patterns to recognize material features, including but not limited to imperfections. Again, features recognition demands that the frequency spectrum of the sensor signals that include non-redundant information spanning from Fatigue to wall thickness is preserved and normalized.

Root Cause Identification Versus Simplistic Explanation

It should be apparent from the above that the 1D-NDI detection dead-zones, limitations and pitfalls of a century ago do not adequately address the material needs of the modern applications and they fall short in active failure prevention. Again, a century ago there was no drilling a 20,000 foot well in 10,000 feet of water in search for hydrocarbons or trains traveling at speeds in excess of 100 miles per hour or supersonic aircraft. These detection dead-zones, limitations and shortcomings of the 1D-NDI lead to a futile long term cycle as detailed below.

Often, when a failure occurs, the focus is on repairing/replacing the damaged material as rapidly as possible in order to reduce downtime and at the lowest possible cost. Occasionally, the obligatory "why?" is asked and a simplistic explanation like "fatigue cracks are a fact of life" is accepted as an adequate answer; a human decision that may lead to a catastrophic failure much later. Occasionally, an inspector or even a 1D-NDI service provider may be replaced with another one using the exact same methods and equipment. One should bear in mind the heavy dependence of 1D-NDI upon the inspector and the industry desire to preserve the 1D-NDI equipment "reputation". At some point, someone examines the number of failures over the years and discovers that there are a compatible number of failures with 1D-NDI as it is without 1D-NDI. The simplistic explanation then is that NDI is a pointless expense and it is therefore reduced or bypassed entirely; yet another human decision that may lead to a catastrophic failure much later. For example, the manufacturer and the owner of the marine drilling riser depicted in FIGS. 12A through 12D may reach such a conclusion. The compound effect of those decisions, often spanning many years, eventually leads to a spectacular catastrophic failure somewhere. The simplistic explanation for this spectacular failure is easily identified as the reduced or bypassed NDI and the simplistic motive is identified as "greed". Again, it should be noted that this string of latent root-causes typically spans many years and possibly different groups of individuals making it difficult, if not impossible, to pinpoint its origins. The "greed" simplistic explanation however, is readily accepted and after the obligatory hearings, firings and fines, 1D-NDI is mandated starting the vicious cycle all over again. The increased awareness is typically short-lived.

However, this approach treats the results of a problem and does not seek to identify and analyze the root-cause of the problem. Unless an excavator accidentally hits a pipeline for example, pipeline material deterioration occurs over time eventually leading to a failure. There is no single deterioration root-cause acting equally upon a 500 mile pipeline for example, with some of it falling within the 1D-NDI detection dead-zones. Along the pipeline length, different deterioration root-causes may be acting upon the pipeline resulting in different deterioration rates and different segment RUL, but 1D-NDI is inherently incapable of effectively identifying those root-causes as illustrated in FIGS. 12A and 12B. The objective of this invention to recognize features, including imperfections, is the first step in identifying the root-cause of material deterioration leading to effective failure preventive action and thus, extending the material RUL.

Description of AutoRULE Computer

Figure 14:
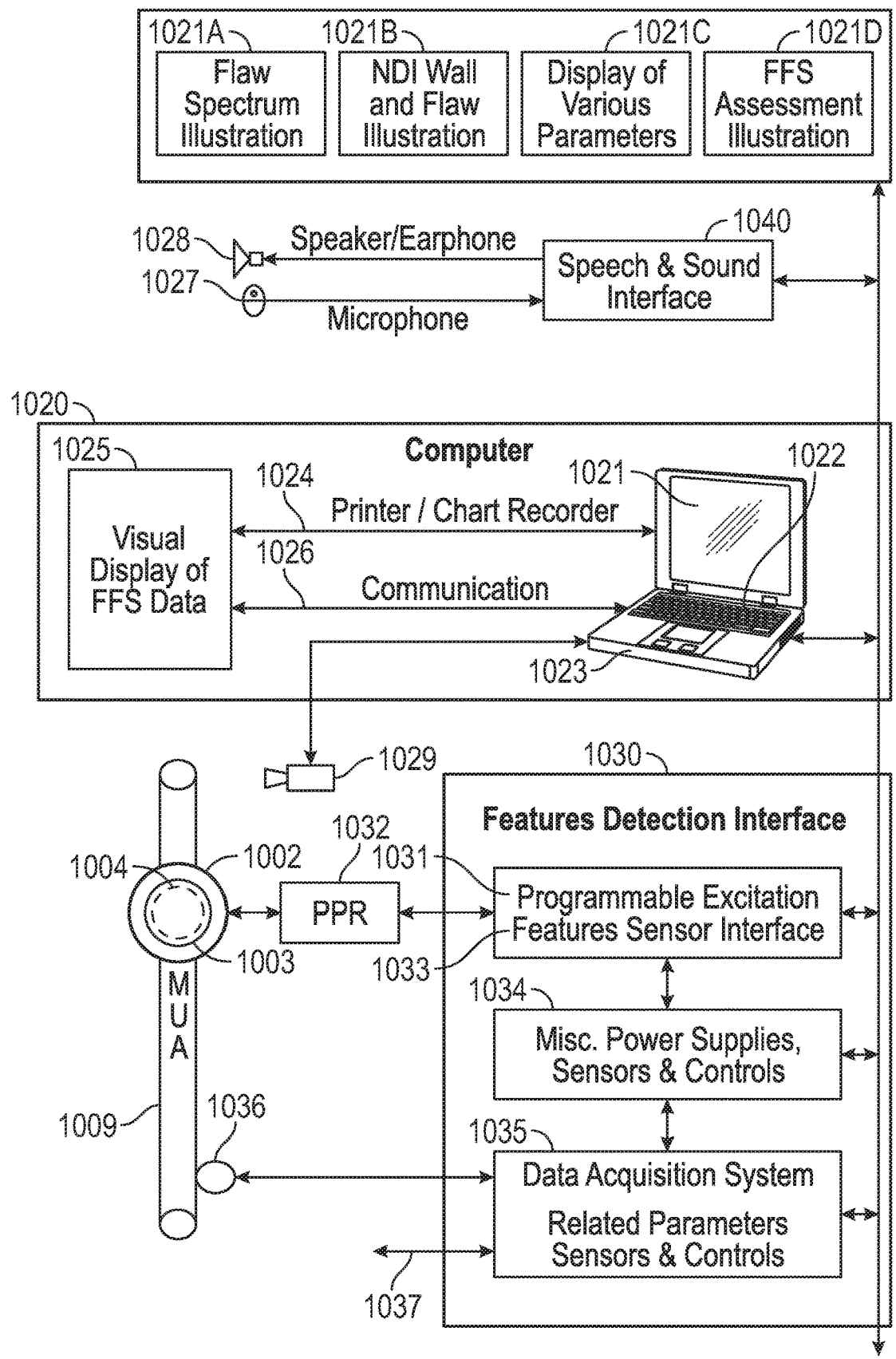
FIG. 14 illustrates a block diagram of the AutoRULE system according to the present invention.

FIG. 14 illustrates an AutoRULE block diagram further illustrating the computer 1020, the features detection interface 1030, the speech and sound interface 1040 and the preferable information exchange among the components of the AutoRULE. It should be understood that the AutoRULE computer 1020 may include more than just one computer such as a cluster of interconnected computers. It should be understood that the computer 1020 does not necessarily comprise a laptop or portable personal computer and such misinterpretation should not be made from the illustrations in the figures and shall not be read as a limitation herein. The computer 1020 preferably comprises a display 1021, keyboard 1022, storage 1023, for storing and accessing data, a microphone 1027, a speaker 1028 and a camera 1029. It should be understood that the display 1021, the keyboard 1022, the speaker 1028 and the microphone 1027 may be local to the computer 1020, may be remote, may be portable, or any combination thereof. It should be further understood that camera 1029 may comprise more than one camera. Further camera 1029 may utilize visible light, infrared light, any other spectrum component, or any combination thereof. The camera 1029 may be used to relay an image or a measurement such as a temperature measurement, a dimensional measurement (such as 3-G of the flaw spectrum), a comparative measurement, character and/or code recognition, such as a serial number, or any combination thereof including information to identify the MUA 1009 and/or the authorized operator through biometric recognition. It should be appreciated that the storage 1023 may comprise hard disks, floppy disks, compact discs, magnetic tapes, DVDs, memory, and other storage devices. The computer 1020 may transmit and receive data through at least one communication link 1026 and may send data to a printer or chart recorder 1024 for further visual confirmation of the inspection data 1025 and other related information. It should be understood that communication link 1026 may be in communication through wired or wireless means, including but not limited to RFID, optical links, satellite, radio and other communication devices. At least one communication link 1026 may facilitate communication with an expert or a group of experts in a remote location. The computer 1020 preferably provides for data exchange with the features detection interface 1030 and the speech and sound interface 1040.

Material Identification

At least one communication link 1026 may facilitate communication with an identification system or a tag, such as RFID, affixed to MUA 1009. Such identification tags are described in U.S. Pat. Nos. 4,698,631, 5,202,680 and 6,480,811 and are commercially available from multiple sources such as Texas Instruments, Motorola and others. Embedded RFID tags, specifically designed for harsh environments, are available with user read-write memory onboard (writable tag). It is anticipated that the memory onboard identification tags would increase as well as the operational conditions, such as temperature, while the dimensions and cost of such tags RFID tags are passive responders, deriving their power from the radio frequency of the reader, as described in U.S. Pat. No. 2,927,321. Again, all assemblies, subassemblies, components and software for the implementation of an RFID system are commercially available from multiple sources. RFID and other tags may be affixed to typical material that includes, but is not limited to, aircraft, bridges, cranes, drilling rigs, frames, chemical plant components, engine components, OCTG, pipelines, power plant components, rails, refineries, rolling stoke, sea going vessels, service rigs, structures, vessels, workover rigs, other components of the above, combinations of the above, and similar items. It should be understood that identification systems for most of such material, due to their large size, may comprise of a computer system attached to the material or multiple such identification computer systems.

The partial material list above comprises mostly of metallic objects and therefore the identification system tags would most likely be in close proximity to metals. The proximity to metals creates unique problems that must be addressed during the system design and testing time. For example, the metal in proximity with the tag and the reader may change the frequency of the ID system and therefore the system preferably would be designed for the changed frequency. Furthermore, when the tags are embedded into the material, the frequency would preferably be selected to maximize the read/write penetration, such as lower frequencies. Lower Q-factor antennas would preferably reduce some of the interference problems including the probability of read-write dead zones. Static testing of the identification system therefore may not accurately reproduce and measure the identification system field performance.

Computer 1020 preferably provides for data exchange with the material identification system, including but not limited to, material ID, material geometry, material database, preferred FEA model, preferred evaluation system setup, constraints, constants, tables, charts, formulas, historical data or any combination thereof. It should be understood that identification systems may further comprise of a data acquisition system and storage to monitor and record FFS and RUL related parameters. It should be further understood that the material identification system would preferably operate in a stand-alone mode or in conjunction with AutoRULE. For example, while tripping out of a well, computer 1020 may read such data from the drill pipe or tubing identification tag and while tripping into a well, computer 1020 may update the identification tag memory. It should be understood that computer 1020 may apply an excitation bias to the material while tripping into the well. The excitation bias places the material in a known state prior to the evaluation. Following the last trip out of the well, the identification tag of the racked drill pipe or tubing may be updated. Another example would be an identification computer with a data acquisition system affixed onto a riser joint or a crane. During deployment, such an identification system would preferably monitor and record FFS and RUL related parameters, such as pressure, temperature, loads, vibration and the like.

Speech and Voice Control

Speech is a tool which allows communication while keeping one's hands free and one's attention focused on an elaborate task, thus, adding a natural speech interface to the AutoRULE would preferably enable the operator to focus on the MUA 1009 and other related activities while maintaining full control of the AutoRULE. Furthermore, the AutoRULE natural speech interaction preferably allows the operator to operate the AutoRULE while wearing gloves or with dirty hands as he/she will not need to constantly physically manipulate the system. Although various types of voice interaction are known in the art, many problems still exist in an industrial setting due to the potential of an excessive noise environment. Thus, this invention preferably provides for natural speech interaction between the human operator and the AutoRULE capable of deployment under adverse conditions.

Figure 15:
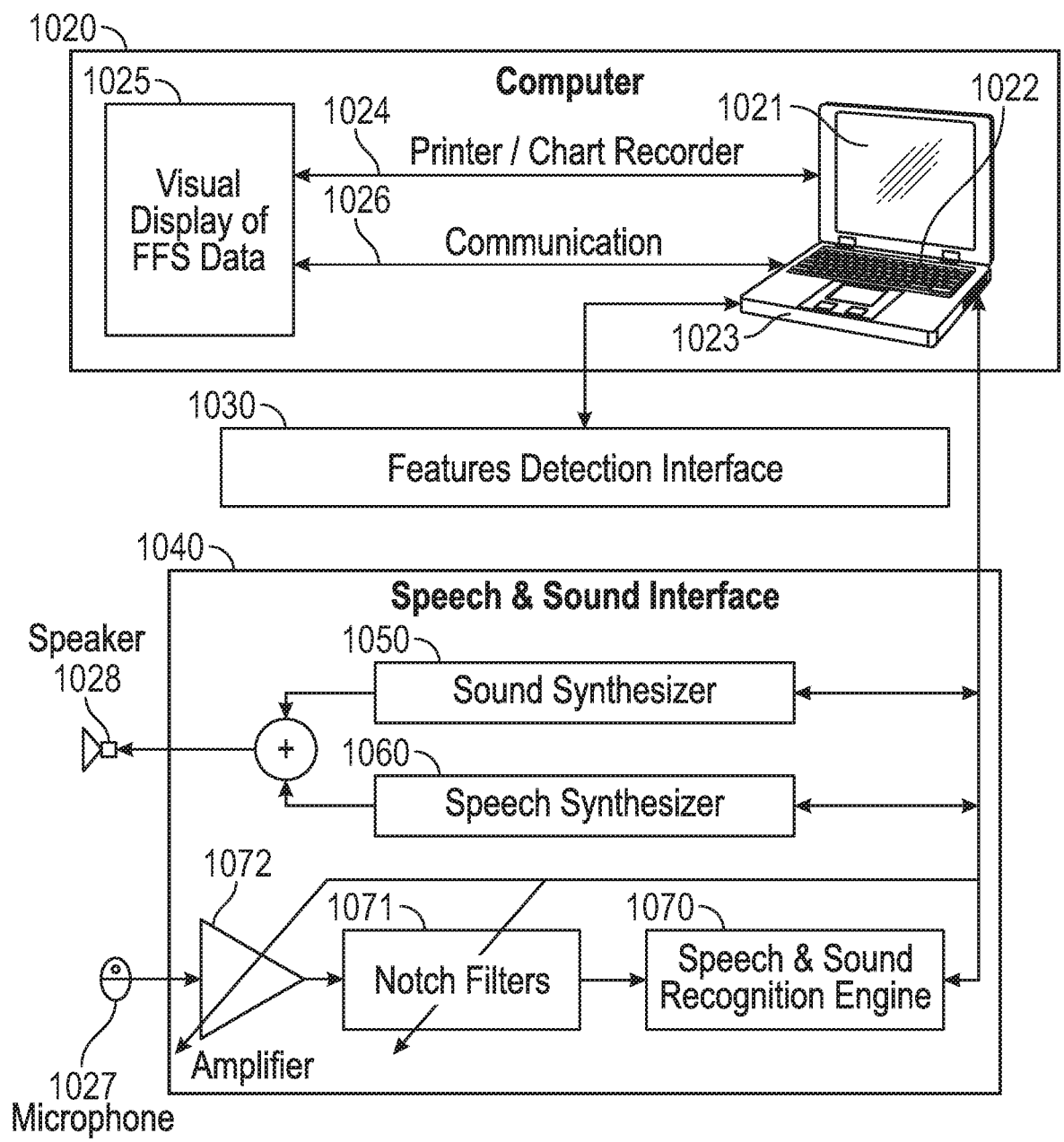
FIG. 15 illustrates a block diagram of the AutoRULE system and the speech and sound interface according to the present invention.

FIG. 15 illustrates a block diagram of the AutoRULE system and the natural speech and sound interface 1040 according to the present invention. Preferably, a natural speech command is received by the microphone 1027 or other sound receiving device. The received sound is preferably amplified, such as by the amplifier 1072. Amplifier 1072 may be a programmable gain amplifier 1080. A feature of the embodiment is that the microphone amplifier 1072 is followed by a bank of band-reject notch filters 1071. Preferably, the operator and/or the software can adjust the amplifier 1072 gain and the center frequency of the notch filters 1071. Such a notch filter may be constructed by moving the low-pass filter 1090 to the output 1108 of the high-pass filter 1100. Since industrial noise is primarily machine generated, it typically consists of a single frequency and its harmonics. Therefore, adjustable notch filters 1071 are well suited for the rejection of industrial noise. The notch filters 1071 are preferably followed by the speech and sound recognition engine 1070. The data from the speech and sound recognition engine 1070 is preferably exchanged with the computer 1020. Data from the computer 1020 may be received by a sound synthesizer 1050 and a speech synthesizer 1060. The data received by the speech synthesizer 1060 is converted into natural speech and is preferably broadcast through a speaker 1028 It should be understood that each synthesizer may be connected to a separate speaker or multiple speakers and that in a different embodiment the speech synthesizer 1060 and the sound synthesizer 1050 may be integrated into a single function, the speech and sound synthesizer.

AutoRULE may be deployed on location, such as a wellsite, a chemical plant or refinery, an airport tarmac or a bridge, a storage yard or facility, a manufacturing facility, such as a pipe mill, a locomotive and in general in a noisy industrial and/or transportation environment. AutoRULE rarely is deployed in a laboratory where typical sound levels, similar to a bank lobby, may be in the range of 40 dB to 50 dB while factory or industrial sound levels may exceed 80 db. A frequency bandwidth of substantially 300 Hz to 2500 Hz and a dynamic range of substantially 40 dB may be adequate for good quality speech with good quality listenability and intelligibility. Industrial noise may also be present in the same frequency range. The notch filters 1071 may be "parked" outside of this frequency range or bypassed altogether when the noise level is acceptable. When a machine, a jet engine, or other device starts suddenly, the notch filters 1071 would preferably sweep to match the predominant noise frequencies. The notch filters 1071 may be activated either manually or through a fast tracking digital signal processing algorithm. Narrow notch filters 1071 with a substantially 40 dB rejection are known in the art and can thus be readily designed and implemented by those skilled in the art. Furthermore, it should be understood that standard noise cancellation techniques could also be applied to the output of the sound synthesizer 1050 and the speech synthesizer 1060 when the speaker 1028 comprises a set of earphones such as in a headset.

Language Selection

It should be further understood that different AutoRULE may be programmed in different languages and/or with different commands but substantially performing the same overall function. The language capability of the AutoRULE may be configured to meet a wide variety of needs. Some examples of language capability, not to be viewed as limiting, may comprise recognizing speech in one language and responding in a different language; recognizing a change of language and responding in the changed language; providing manual language selection, which may include different input and response languages; providing automatic language selection based on pre-programmed instructions; simultaneously recognizing more than one language or simultaneously responding in more than one language; or any other desired combination therein. It should be understood that the multilanguage capability of the AutoRULE voice interaction is feasible because it is limited to a few dozen utterances as compared to commercial voice recognition systems with vocabularies in excess of 300,000 words per language.

Operator Identification and Security

Preferably, at least some degree of security and an assurance of safe operation, for the AutoRULE, is achieved by verifying the voiceprint of the operator and/or through facial or iris scan or fingerprint identification through camera 1029 or any other biometric device. With voiceprint identification, the likelihood of a false command being carried out is minimized or substantially eliminated. It should be appreciated that similar to a fingerprint, an iris scan, or any other biometric, which can also be used for equipment security, a voiceprint identifies the unique characteristics of the operator's voice. Thus, the voiceprint coupled with passwords will preferably create a substantially secure and false command immune operating environment.

It should be further understood that the authorize operator may also be identified by plugging-in AutoRULE a memory storage device with identification information or even by a sequence of sounds and or melodies stored in a small playback device, such as a recorder or any combination of the above.

Assessment Trace to Sound Conversion

The prior art does not present any solution for the conversion of the assessment signals, including but not limited to inspection signals, also referred to as "assessment traces", to speech or sound. The present invention utilizes psychoacoustic principles and modeling to achieve this conversion and to drive the sound synthesizer 1050 with the resulting sound being broadcast through the speaker 1028 or a different speaker. Thus, the assessment signals may be listened to alone or in conjunction with the AutoRULE comments and are of sufficient amount and quality as to enable the operator to monitor and carry out the entire assessment process from a remote location, away from the AutoRULE console and the typical readout instruments. Furthermore, the audible feedback is selected to maximize the amount of information without overload or fatigue. This trace-to-sound conversion also addresses the dilemma of silence, which may occur when the AutoRULE has nothing to report. Typically, in such a case, the operator is not sure if the AutoRULE is silent due to the lack of features or if it is silent because it stopped operating. Furthermore, certain MUI 1001 features such as, but not limited to, collars or welds can be observed visually and the synchronized audio response of the AutoRULE adds a degree of security to anyone listening. A wearable graphics display, such as an eyepiece, could serve as the remote display 1021 to further enhance the process away from the AutoRULE console.

It should be understood that the assessment trace(s) to sound conversion is not similar to an annoying chime indicating that an automobile door is open, or that there is a message in an answering machine. The time varying AutoRULE processing results are converted to sound of sufficient amount and quality through psychoacoustic principles and modeling, as to enable the operator to monitor and carry out the entire AutoRULE process from a remote location without annoying the operator or resulting in operator overload or operator "zone-out". It should further be understood that a switch contact closure indicating that an automobile door is open or a vending machine bin is empty does not constitute an RUL assessment as it is not different than turning on the lights in a room. Conversely, a chime may be attached to the light to indicate that it is on or even a voice synthesizer to say "the light is on". Similarly, lights may be attached to a doorbell switch closure to assist a hearing impaired person; however, none of these devices or actions constitutes a RUL assessment.

AutoRULE Speech

Text to speech is highly advanced and may be implemented without great difficulty. Preferably, when utilizing text to speech, the Auto AutoRULE can readily recite its status utilizing, but not limited to, such phrases as: "magnetizer on"; "chart out of paper", and "low battery". It can recite the progress of the AutoRULE utilizing, but not limited to, such phrases as: "MUA stopped" and "four thousand feet down, six thousand to go". It can recite readings utilizing, but not limited to, such phrases as "wall loss", "ninety six", "loss of echo", "unfit material", "ouch", or other possible code words to indicate a rejectable defect. The operator would not even have to look at a watch as simple voice commands like "time" and "date" would preferably recite the AutoRULE clock and/or calendar utilizing, but not limited to, such phrases as "ten thirty two am", or "Monday April eleven".

However, it should be understood that the primary purpose of the AutoRULE is to relay MUA 1009 information to the operator. Therefore, AutoRULE would first have to decide what information to relay to the operator and the related utterance structure.

AutoRULE Operation Through Speech

Preferably, the structure and length of AutoRULE utterance would be such as to conform with the latest findings of speech research and in particular in the area of speech, meaning and retention. It is anticipated that during the AutoRULE deployment, the operator would be distracted by other tasks and may not access and process the short term auditory memory in time to extract a meaning. Humans tend to better retain information at the beginning of an utterance (primacy) and at the end of the utterance (recency) and therefore the AutoRULE speech will be structured as such. Often, the operator may need to focus and listen to another crew member, an alarm, a broadcasted message or even an unfamiliar sound and therefore the operator may mute any AutoRULE speech output immediately with a button or with the command "mute" and enable the speech output with the command "speak".

The "repeat" command may be invoked at any time to repeat an AutoRULE utterance, even when speech is in progress. Occasionally, the "repeat" command may be invoked because the operator failed to understand a message and therefore, "repeat" actually means "clarify" or "explain". Merely repeating the exact same message again would probably not result in better understanding, occasionally due to the brick-wall effect. Preferably, AutoRULE, after the first repeat, would change slightly the structure of the last utterance although the new utterance may not contain any new information, a strategy to work around communication obstacles. Furthermore, subsequent "repeat" commands may invoke the help menu to explain the meaning of the particular utterance in greater detail.

The operator may remain in communication with the AutoRULE in a variety of conventional ways. Several examples, which are not intended as limiting, of possible ways of such communication are: being tethered to the AutoRULE; being connected to the AutoRULE through a network of sockets distributed throughout the site including the inspection head(s); being connected to the AutoRULE through an optical link (tethered or not); or being connected to the AutoRULE through a radio link. This frees the operator to move around and focus his/her attention wherever needed without interfering with the production rate.

It should be appreciated that the present invention may be a small scale speech recognition system specifically designed to verify the identity of the authorized operator, to recognize commands under adverse conditions, to aid the operator in this interaction, to act according to the commands in a substantially safe fashion, and to keep the operator informed of the actions, the progress, and the status of the AutoRULE process.

AutoRULE Sound Recognition

AutoRULE would preferably be deployed in the MUA 1009 use site and would be exposed to the site familiar and unfamiliar sounds. For example, a familiar sound may originate from the rig engine revving-up to trip an OCTG string out of a well. An indication of the MUA 1009 speed of travel may be derived from the rig engine sound. An unfamiliar sound, for example, would originate from an injector head bearing about to fail. It should be noted that not all site sounds fall within the human hearing range but may certainly fall within the AutoRULE analysis range when the AutoRULE is equipped with appropriate microphone(s) 1027. It should also be noted that an equipment unexpected failure may affect adversely the MUA 1009 RUL, thus training the AutoRULE to the site familiar, and when possible unfamiliar sounds, would be advantageous.

As discussed earlier, the notch filters 1071 would preferably sweep to match the predominant noise frequencies, thus, a noise frequency spectrum may be derived that may further be processed for recognition using standard AutoRULE recognition techniques.

Description of Speech and Sound Interface

Figure 16:
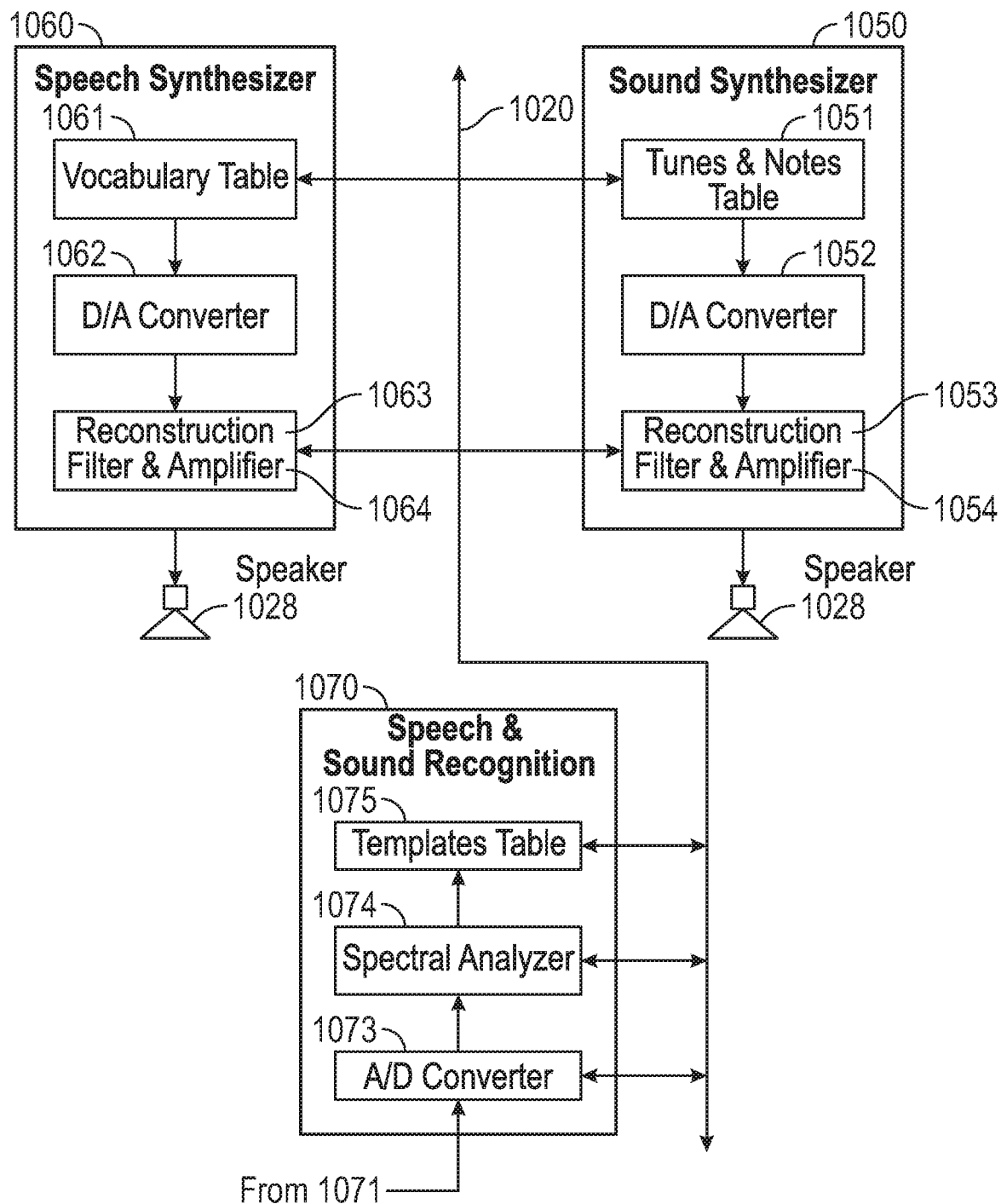
FIG. 16 illustrates a block diagram of a speech synthesizer, a sound synthesizer and a Speech recognition engine.

FIG. 16 illustrates a block diagram of a preferred sound synthesizer 1050, speech synthesizer 1060, and speech and sound recognition engine 1070. It should be understood that these embodiments should not be viewed as limiting and may be tailored to specific inspection constraints and requirements.

Figures 18A, 18B, 18C, 18D:
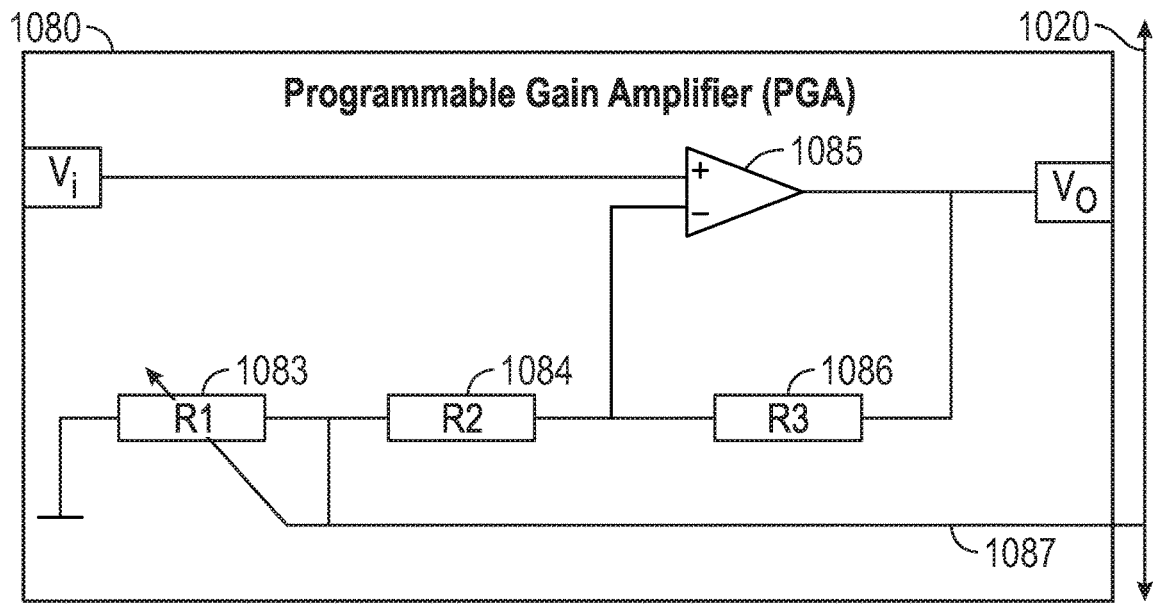
FIG. 18A illustrates a programmable gain amplifier according to the present invention.
FIG. 18B illustrates the design mathematical formula for the programmable gain amplifier of FIG. 18A according to the present invention.
FIG. 18C illustrates a mathematical formula for the programmable gain of FIG. 18A according to the present invention.
FIG. 18D illustrates a mathematical formula for the programmable gain of FIG. 18A according to the present invention.

The sound synthesizer 1050 and the speech synthesizer 1060 may comprise a tunes and notes table 1051 and a vocabulary table 1061 respectively. The digital-to-analog (herein after referred to as "D/A") converter 1052, 1062, the reconstruction filter 1053, 1063, and the variable gain output amplifier 1054, 1069 are in communication with computer 1020. The tunes and notes table 1051 and a vocabulary table 1061 may be implemented in a read only memory (ROM) or any other storage device. The computer 1020 preferably sequences through the entire address sequence so that the complete digital data of the utterance (word, phrase, melody, tune, or sound), properly spaced in time, are converted to an analog signal through the D/A 1052, 1062. The analog signal is then preferably band-limited by the reconstruction filter 1053, 1063, amplified by the amplifier 1054, 1064, and sent to the speaker 1028. Preferably, the computer 1020 can vary the bandwidth of the reconstruction filter 1053, 1063 and adjust the gain of the amplifier 1054, 1064 which may be programmable gain amplifiers 1080 as depicted in FIG. 18A. In a different embodiment, the gain of the amplifier 1054, 1064 may be adjusted by the operator.

It should be understood that the tunes and notes table 1051 and a vocabulary table 1061 may incorporate a built in sequencer with the computer 1020 providing the starting address of the utterance (word, phrase, melody, tune, or sound). It should be further understood that the sound synthesizer 1050 and the speech synthesizer 1060 may comprise separate devices or even be combined into one device, the speech and sound synthesizer, or even be part of a complete sound and video system such devices being commercially available from suppliers such as YAMAHA. It should be understood that an utterance may comprise of a word, a short phrase and/or sound effects such as melodies, tunes and notes. A variable length of silence may be part of the utterance, which may or may not be part of the vocabulary table 1061 and/or the tunes and notes table 1051 in order to save storage space. Instead, the length of the silence may be coded in the table 1051 and 1061 and then be produced through a variable delay routine in computer 1020.

The speech and sound recognition engine 1070, may comprise an analog-to-digital (herein after referred to as "A/D") converter 1073, a spectral analyzer 1074, and the voice and sound templates table 1075 which may be implemented in a read only memory (ROM) or any other storage device. The description of the sequence of software steps (math, processing, etc.) is well known in the art, such as can be found in Texas Instruments applications, and will not be described in detail herein. An exemplary hardware device is the YAMAHA part number 4MF743A40, which provides most of the building blocks for the entire system.

Voiceprint speaker verification is preferably carried out using a small template, of a few critical commands, and would preferably be a separate section of the templates table 1075. Different speakers may implement different commands, all performing the same overall function. For example "start now" and "let's go" may be commands that carry out the same function, but are assigned to different speakers in order to enhance the speaker recognition success and improve security. As discussed herein above, code words can be used as commands. The commands would preferably be chosen to be multi-syllabic to reduce the likelihood of false triggers. Commands with 3 to 5 syllables are preferred but are not required. Further reduction of false triggers can be accomplished by a dual sequence of commands, such as "AutoRULE" and upon a response from AutoRULE, such as "ready", followed by the actual command such as "Start" issued within a preset time interval. It should be understood that command pairs may or may not share trigger commands. Hardware trigger, such as a switch closure, followed by a speech command will be most effective in reducing false triggers.

Description of the Features Detection Interface

Computer 1020 also controls and monitors a plurality of power supplies, sensors and controls 1034 that facilitate the AutoRULE process including but not limited to MUA 1009 identification and safety features. Further, computer 1020 monitors/controls the data acquisition system 1035 which preferably assimilates data from at least one sensor 1036 and displays 1021C and stores such data 1023. The sensor 1036 preferably provides data such as, but not limited to, MUA 1009 location (feet of MUA 1009 that passed through the head 1002), penetration rate (speed of MUA 1009 moving through the head 1002), applied torque, rate of rotation (rpm), and coupling torque. It should be appreciated that the data to be acquired will vary with the specific type of MUA 1009 and application and thus the same parameters are not always measured/detected. For example, the length of the MUA 1009, such as a drill pipe joint, may be read from the MUA 1009 identification markings or from the identification tag embedded in the MUA 1009. Furthermore and in addition to the aforementioned techniques, computer 1020 may also monitor, through the data acquisition system 1035, parameters that are related to the assessment or utilization of the MUA 1009 and/or parameters to facilitate RULE. Such parameters may include, but not be limited to, the MUA 1009 pump pressure, external pressure, such as the wellhead pressure, temperature, flow rate, tension, weight, load distribution, fluid volume and pump rate and the like. Preferably, these parameters are measured or acquired through sensors and/or transducers mounted throughout the MUA 1009 deployment area, such as a rig. For ease of understanding, these various sensors and transducers are designated with the numeral 1037. The STYLWAN Rig Data Integration System (RDIS-10) is an example of such a hybrid system combining inspection and data acquisition. For instance, computer 1020 may monitor, log and evaluate the overall drilling performance and its impact on the MUA 1009 by measuring the power consumption of the drilling process, the string weight, weight on bit, applied torque, penetration rate and other related parameters. Such information, an indication of the strata and the efficiency of the drilling process, may be processed and used as a measure to further evaluate the MUA 1009 imperfections and its FFS and RUL.

It should be understood that sensors, measuring devices and/or a data acquisition system may already be installed in the MUA 1009 deployment area, such as a drilling rig, measuring at least some of the aforementioned parameters, which may be available to AutoRULE through storage devices and/or through a communication link 1026 as real time data and/or as historical data.

It should be appreciated that the RDIS-10 uses the extraction matrix and multidimensional sensors 1004. When however, the multidimensional sensors and extraction matrix are replaced with a different sensor interface and a bank of frequency filters, as described herein below, the RDIS-10 will substantially work as described herein below utilizing the frequency derived flaw spectrum.

Regardless of the specific technique utilized, the AutoRULE device will preferably scan the material after each use, fuse the features data with relevant material use parameters, and automatically determine the MUA 1009 status. Thus, a function of the features detection interface 1030 is to generate and induce excitation 1031 into the MUA 1009 and detect the response, of the MUA 1009, to the excitation 1031. It should be understood that computer 1020 may first apply an excitation bias to the MUA 1009 prior to the evaluation of MUA 1009. The excitation bias preferably places MUA 1009 in a known state prior to the evaluation. Preferably, at least one assessment head 1002 is mounted on or inserted in the MUA 1009 and the head 1002 may be stationary or travel along the MUA 1009. It should be appreciated that the head 2 can be applied to the inside as well as the outside of the MUA 1009. It should be understood that the head 1002, illustrated herein, may comprise at least one excitation inducer 1003 and one or more features sensors 1004 mounted such that the RULE assessment needs of MUA 1009 are substantially covered. For features acquisition utilizing MFL, the excitation inducer 1003 typically comprises of at least one magnetizing coil and/or at least one permanent magnet while sensor 1004 comprises of sensors that respond to magnetic field. There is a plethora of sensors that respond to the magnetic field such as coils, Hall-probes, magneto diodes, etc. The computer 1020 preferably both programs and controls the excitation 1031 and the head 1002 as well as receives features data from the head sensors 1004 through the features sensor interface 1033. The head 1002, excitation 1031, and the features sensor interface 1033 may be combined within the same physical housing. In an alternative embodiment, the features sensors 1004 may comprise computer capability and memory storage and thus the sensors 1004 can be programmed to perform many of the tasks of the computer 1020 or perform functions in tandem with the computer 1020. It should be also understood that the application of the excitation 1031 and the assessment of the MUA 1009 may be delayed such as AutoRULE utilizing far-field or the residual magnetic field whereby the MUA 1009 is magnetized and it is scanned at a later time, thus the excitation inducer 1003 and the features sensor 1004 may be mounted in different physical housings. It should be further understood, that in such configuration, the excitation inducer 1003 may be applied on the inside or on the outside of MUA 1009 while the inspection sensor 1004 may be applied on the same side or on the opposite side of the excitation inducer 1003. It should be further understood that either or both the excitation inducer 1003 and the features sensor 1004 may be applied on both the inside and on the outside of MUA 1009 so that the assessment needs of MUA 1009 are substantially covered.

Sensor Signal Processing

Preferably, the head 1002 relates time-varying continuous (analog) signals, such as, but not limited to, echo, reluctance, resistance, impedance, absorption, attenuation, or physical parameters that may or may not represent a feature of the MUA 1009. For features acquisition utilizing MFL, head 1002 relates reluctance signals in an analog form. The processing of Eddy-Current amplitude and phase would also result in similar analog signal. Features generally comprise all received signals and may include MUA 1009 design features such as tapers, imperfections, major and minor defects or other MUA 1009 conditions such as surface roughness, hardness changes, composition changes, scale, dirt, and the like. Signals from three-dimensional sensors 1004 are processed by the extraction matrix, that was published in 1994 and it is beyond the scope of this patent. The exemplary RDIS-10 uses the extraction matrix to decompose the converted digital signals into relevant features.

Typically, those in the 1D-NDI art have always relied on both an inspector and a manual verification crew for the interpretation of the inspection signals and any subsequent disposition of the MUI 1001. However, based on extensive strength-of-materials knowledge, it is well known that the severity of an MUI 1001 imperfection is a function of its geometry, its location, and the applied loads. It is also well known, in the art, that this information cannot be readily obtained by a verification crew when the imperfections in question are located underneath coating, in the near subsurface, in the mid wall, or in the internal surface of the MUI 1001. Any destructive action, such as removing any coating or cutting up the MUI 1001 is beyond the scope of nondestructive inspection. Detailed signal analysis can extract the pertinent information from the NDI signals. Preferably, such detailed signal analysis would utilize signals that are continuously related in form, kind, space, and time.

AutoRULE Retrofit to 1D-NDI Equipment

As discussed earlier, it is desirable to provide means to retrofit AutoRULE to the hundreds of 1D-EMI units deployed worldwide. The analog signals from 1D-NDI or two-dimensional sensors are decomposed in frequency. This frequency decomposition can take place in continuous or discrete form. In the continuous form the signals are decomposed through a bank of analog frequency filters and they are then digitized by the computer 1020. In the discrete form the signals are digitized by the computer 1020 and they are then decomposed through a bank of digital frequency filters or mathematical transforms.

The list of 1D-NDI retrofit candidates includes, but is certainly not limited to, the OCTG inspection units described in U.S. Pat. Nos. 2,685,672, 2,881,386, 5,671,155, 5,914,596 and 6,580,268; the pipeline pigs described in U.S. Pat. Nos. 3,225,293, 3,238,448 and 6,847,207 and the rail inspection systems described in U.S. Pat. Nos. 2,317,721, 5,970,438 and 6,594,591 and derived or similar units. The simplest retrofit would store the sensor information in a memory or transmit the sensor information through a communication link and the AutoRULE would post-process the data. The retrofit may consist of three-dimensional sensors and signal processing or frequency decomposition and signal processing as described herein below.

Frequency Decomposition with Analog Filters

Figure 17:
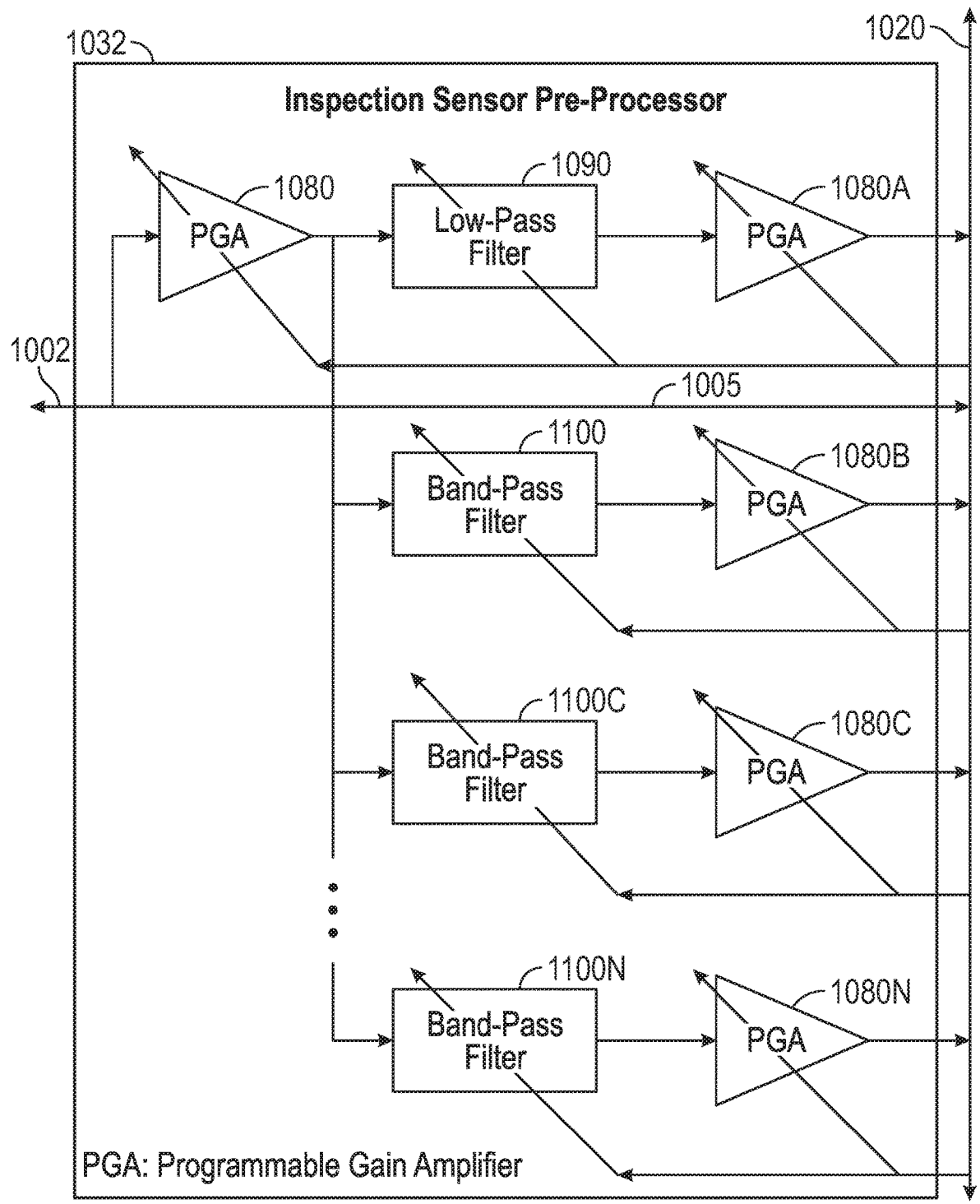
FIG. 17 illustrates a block-diagram of the inspection sensor pre-processor and the filter arrangement according to the present invention.

FIG. 17 illustrates a block-diagram of the addition to the exemplary RDIS-10 imperfection sensor interface 1033, illustrated as preprocessor 1032, and the filter arrangement to decompose the inspection signals frequency spectrum and extract relevant features in an analog format. The features extraction of the present invention is accomplished through a filter bank comprising of a low-pass filter 1090 and a number of band-pass filters 1100 through 1160N. There is no limit on the number of band-pass filters that may be used, however six to eight filters are adequate for most applications thus dividing the sensor frequency spectrum into seven to nine features, the exact number depending on the specific application. For a scanning speed of 60 feet/minute a typical alignment time shift (also known as time delay) is 42 milliseconds and a typical nine filter sequence comprises one 12 Hz low-pass filter 1090 and eight band-pass filters 1100 through 1100N with center frequency (bandwidth) of 15 Hz (6 Hz), 25 Hz (10 Hz), 35 Hz (15 Hz), 50 Hz (21 Hz), 70 Hz (30 Hz), 100 Hz (42 Hz), 140 Hz (58 Hz) and 200 Hz (82 Hz). The attenuation of the filters depends on the resolution of the analog-to-digital converter and the processing with 40 to 60 decibels been sufficient for common applications.

The passband ripple is another important filter consideration. In the past, the 1D-EMI industry has mostly used Butterworth (also known as maximally-flat) filters. These are compromise filters with a 3 dB passband variation. For typical 1D-NDI applications, better performance is achieved with Chebyshev or Elliptic filters. For example, a 0.5 dB Chebyshev filter has less passband variation and sharper rolloff, thus resulting in a lower order filter than an equivalent Butterworth. The above specifications (filter type, center frequency, bandwidth and attenuation) are sufficient to design the filters without additional experimentation. Filter design software, some available free of charge, is also available from multiple component vendors such as, Micro-Chip, Linear Technology, and many others.

Preferably, the computer 1020 may read and gather relevant sensor 1004 information from the sensor 1004 onboard memory and may write new information into the sensor 1004 onboard memory. It should be understood that the sensor 1004 relevant information may also be stored in other storage media, such as hard disks, floppy disks, compact discs, magnetic tapes, DVDs, memory, and other storage devices that computer 1020 may access. The sensor 1004 analog signal 1004A is amplified by a programmable gain amplifier (herein after referred to as "PGA") 1080. This Gain of the PGA 1080 is controlled by the computer 1020. FIG. 18A through 18D illustrate a PGA 1080 and its design equations for clarity. PGAs are well known in the art and multiple designs can be found throughout the literature. PGA integrated circuits are also commercially available from such vendors as Analog Devices, Linear Technology, Maxim, National Semiconductors, Texas Instruments, and many others. In its simplest form a PGA comprises a differential amplifier 1851 with a variable resistor 1083 inserted in its feedback loop. Preferably, the variable resistor 1083 is a digitally controlled potentiometer such as the ones offered by XICOR. Computer 1020 may vary the variable resistor 1083 value thus adjusting the gain of the PGA 1080. The PGA 1080 gain adjustment is primarily controlled by the sensor 1004 information, the instantaneous scanning speed derived by the computer 1020 from sensor 1036 and the specific MUI 1001. The output of PGA 1080 is connected to a filter bank in order to decompose the inspection signals frequency spectrum and extract relevant features.

Figures 19A, 19B, 19C:
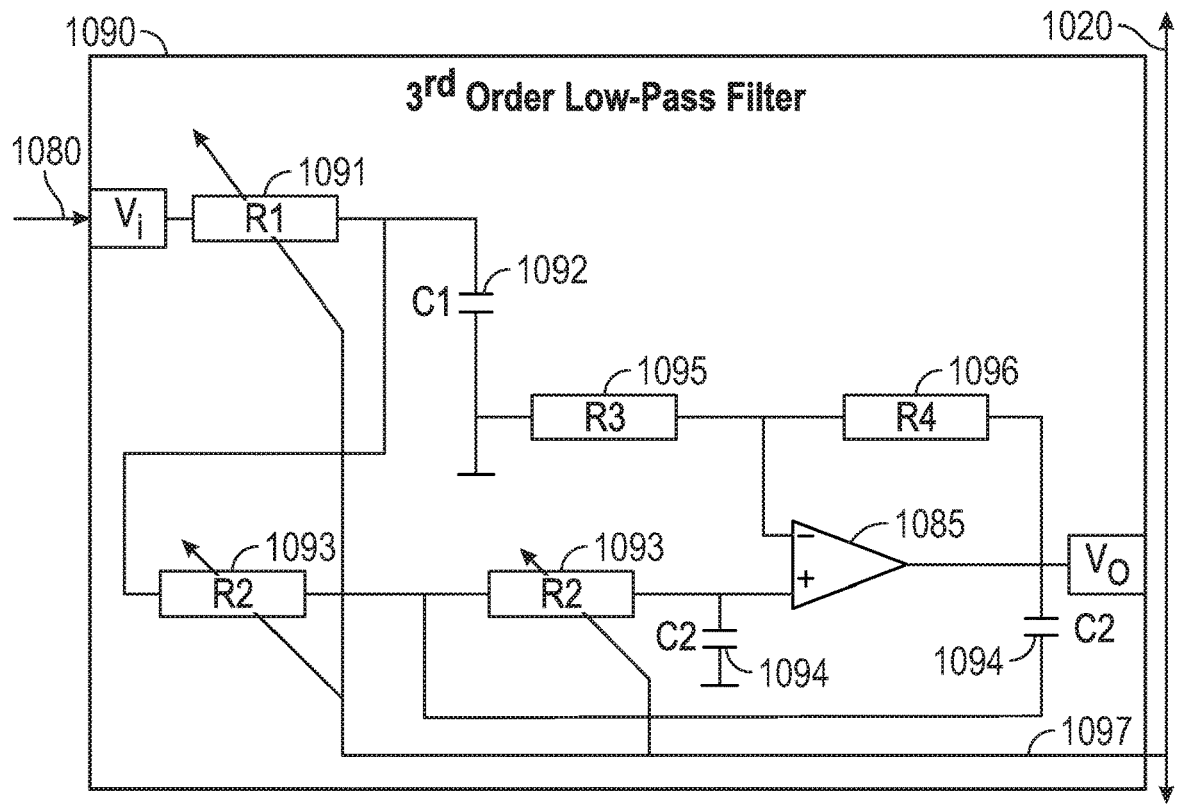
FIG. 19A illustrates a programmable third order low-pass filter according to the present invention.
FIG. 19B illustrates the design mathematical formula for a 1st order low pass filter of FIG. 19A according to the present invention.
FIG. 19C illustrates the design mathematical formula for a 2nd order low pass filter of FIG. 19A according to the present invention.

The low frequency components are extracted by the low-pass filter 1090. It should be understood that the term low-frequency features are not in absolute terms but in relative terms to the scanning speed. Therefore, the cutoff frequency of the low-pass filter 1090, denoted as Fc in FIGS. 19B and 19C, may be set to 5 Hz for one scanning speed and to 50 Hz for a higher scanning speed. The exact cutoff frequency of the low-pass filter 1090 depends on the sensor information 1004, the instantaneous scanning speed derived by the computer 1020 from sensor 1036, and the specific MUI 1001. FIGS. 19A, 19B and 19C illustrate a programmable third order low-pass analog filter and its design equations for clarity. Low-pass filters are well known in the art and their design can be found throughout the literature. Filter design software, some available free of charge, is also available from multiple component vendors such as, Micro-Chip, Linear Technology, and many others. The low-pass filter of FIG. 19A consists of two sections. A first order filter comprising of resistor 1091 and capacitor 1092 cascaded with a second order low-pass analog filter. It should be understood that all other filter orders can be obtained by cascading additional filter sections. Preferably, the variable resistors 1091 and 1093 are digitally controlled potentiometers such as the ones offered by XICOR and a fixed resistor value (not shown) similar to the FIG. 18A network 1083 and 1084. Computer 1020 may vary the variable resistor 1091 and 1093 value thus adjusting the cutoff frequency of the low-pass filter.

All other frequency components of the sensor signal 1004 are extracted by the band-pass filters 1100 through 1100N.

Figures 20A, 20B, 20C:
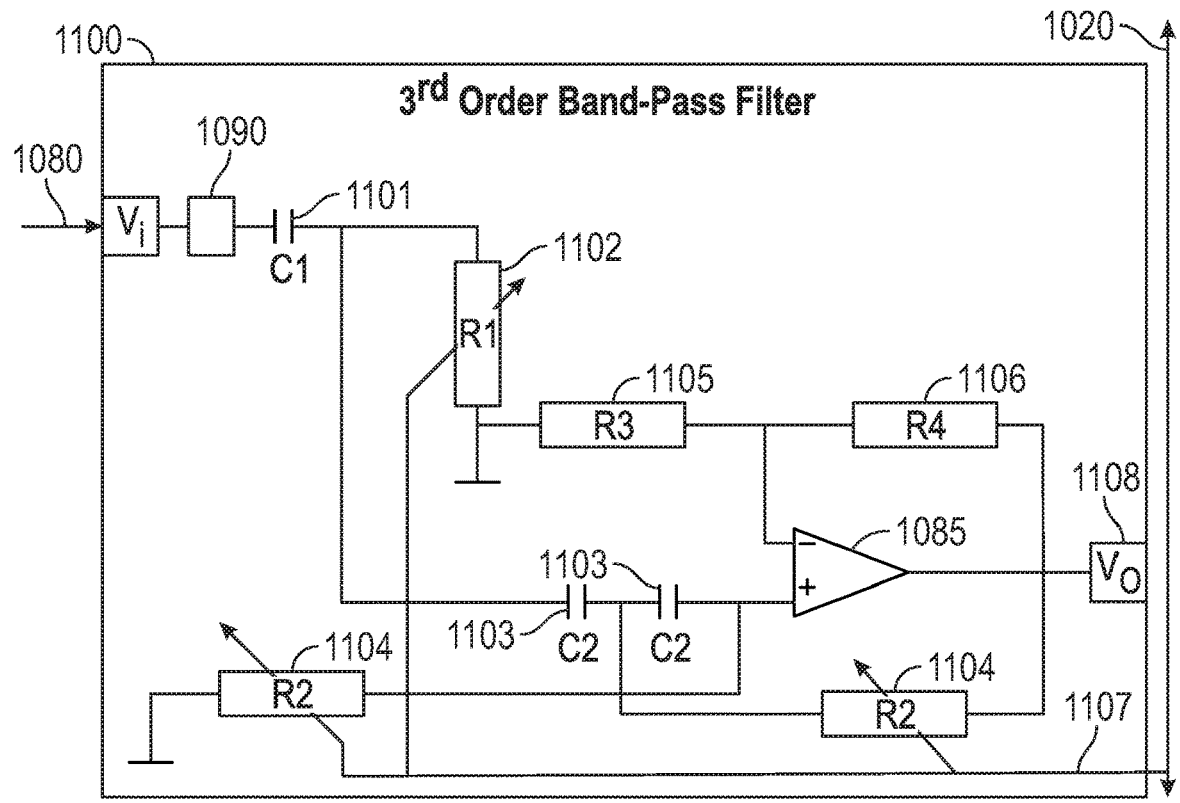
FIG. 20A illustrates a programmable band-pass filter and a 3rd order high-pass filter according to the present invention.
FIG. 20B illustrates the design mathematical formula for a 1st order high-pass filter of FIG. 20A according to the present invention.
FIG. 20C illustrates the design mathematical formula for a 2nd order high-pass filter of FIG. 20A according to the present invention.

Again, it should be understood that the frequency bands are not stated in absolute terms but in relative terms to the scanning speed. Therefore, the center frequency of a band-pass filter 1100 may be set to 40 Hz for one scanning speed and to 200 Hz for a higher scanning speed. The exact center frequency of the band-pass filters 1100 through 1100N depends on the sensor information 1004, the instantaneous scanning speed derived by the computer 1020 from sensor 1036 and the specific MUI 1001. FIG. 20A illustrates a programmable third order band-pass filter that is made up from a low-pass filter 1090 cascaded with a third order high-pass filter. The third order high-pass filter and its design equations are shown for clarity. High-pass filters are well known in the art and its design can be found throughout the literature. Filter design software, some available free of charge, is also available from multiple component vendors such as, MicroChip, Linear Technology, and many others. The high-pass filter of FIG. 20A includes two sections. A 1firstst order filter comprising of capacitor 1101 and resistor 1102 cascaded with a 2firstnd order high-pass filter. It should be understood that all other filter orders can be obtained by cascading additional filter sections. Preferably, the variable resistors 1102 and 1104 are digitally controlled potentiometers such as the ones offered by XICOR and a fixed resistor value (not shown) similar to the FIG. 18A network 1083 and 1084. Computer 1020 may vary the variable resistor 1102 and 1104 value thus adjusting the cutoff frequency of the high-pass filter. It should be further understood that this band-pass filter configuration allows for individual adjustment of both the leading and trailing transition bands. Other band-pass filter configurations can also be found throughout the literature.

Frequency Decomposition in the Digital Domain

The features extraction filter bank that was described above using analog filters may also be realized with switched capacitor filters and/or digital filters and/or mathematical transforms or any combination thereof. Switched capacitor filters may be substituted for the analog filters 1090 and 1100 through 1100N with the computer 1020 varying the clock frequency to program the resulting switched capacitor filter bank.

It should be understood that no modification to the front end of the inspection sensor interface 1033 (i.e. no preprocessor 1032 as described hereinabove) of the exemplary RDIS-10 is required in order to implement the present invention using digital filters and/or mathematical transforms as the exemplary RDIS-10 is designed for digital domain operation.

The sensor signal therefore, is converted to digital format and the analog filters described above may be converted to their digital counterpart using bilinear transform which is well known to the art and well publicized resulting in Infinite Impulse Response digital filters (known to the art as BR filters) and is illustrated in FIGS. 21A, 21B and 21C. The block diagram of FIG. 17 may then be used to derive the flowchart of the digital signal processing form of the present invention. In another implementation, digital filters may be designed using direct synthesis techniques that are also well known to the art and well publicized. Finite Impulse Response digital filters (known to the art as FIR filters) may also be employed at the expense of computing power. FIR implementations, such as Kaiser, Hamming, Hanning etc., are also well known to the art and well publicized.

There are many mathematical transforms that are well known and well publicized. However, not all are useful for features extraction for the transient NDI signals. The NDI industry in the past has proposed the use of Fourier Transform or its Fast Fourier Transform (FFT) implementation, a misapplication for the brief transient NDI imperfection signals. Fourier Transform, in all of its implementations, is useful to analyze long periodic signals (long waves). Furthermore, the Fourier Transform provides information in the frequency domain and none in the time domain which is essential for the analysis of NDI signals. This drawback of the Fourier Transform was noted by the French Academy and in particular by J. L. Lagrange who objected to the Fourier Transform trigonometric series because it could not represent signals with corners such as the ones often encountered in NDI. Subsequently, the Academy refused to publish the Fourier paper. In order to overcome the drawbacks of the Fourier Transform, alternatives were developed over the years, notably the Short Time Fourier Transform (commonly referred to as STFT), wavelets and coiflets all of which are well known to the art and well publicized. The main disadvantages of the transforms are their fixed resolution and their demand for higher computer power.

The STFT offers uniform time and frequency resolution throughout the entire time-frequency domain using a fixed window size, which results in its main drawback. A small window blind the STFT to low frequencies while a large window blinds the STFT to brief signal changes mostly associated with use induced MUI 1001 imperfections.

Figures 22A, 22B, 22C:
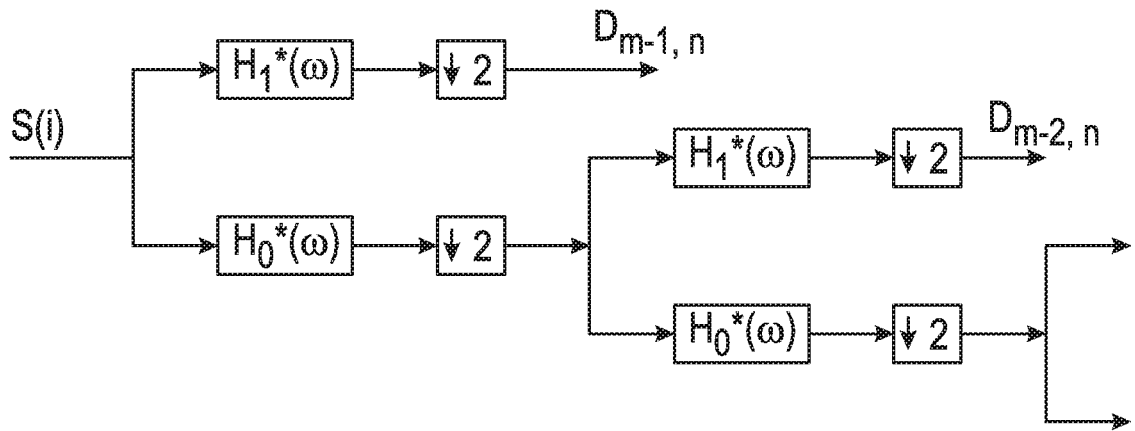
FIG. 22A illustrates the block-diagram to implement the discrete wavelet transform decomposition through digital filter banks according to the present invention.
FIG. 22B illustrates a mathematical formula for a low-pass filter of a HAAR wavelet of FIG. 22A according to the present invention.
FIG. 22C illustrates a mathematical formula for a high-pass filter of a HAAR wavelet of FIG. 22A according to the present invention.

Wavelets (short waves) are better tuned to the needs of NDI. Wavelets vary the width of the window thus offer better time resolution for the higher frequencies that are typically associated with use induced MUI 1001 imperfections. Wavelets are typically implemented using filter banks and they are also well known in the art and well publicized. FIGS. 22A, 22B and 22C illustrate the implementation of the discrete wavelet transform decomposition using filter banks and down sampling.

Sensor Signal Normalization

Referring back to FIG. 17, the bank of PGAs 1080A through 1080N follows the frequency decomposition filter bank. The frequency response of the inspection sensors 1004 is typically non-linear. The response of the inspection sensor 1004 to the same MUI 1001 feature would then vary depending on the scanning speed and level of excitation which is continuously monitored by computer 1020. The sensor 1004 response to different scanning speeds, in the unique setting of the inspection head 1002 under varying excitation 1003 levels, can be characterized. This is accomplished by scanning MUI 1001 samples with test imperfections at different speeds and different levels of excitation while recording the sensor 1004 signals. Preferably, these sensor characterization tests would be repeated multiple times so that a sufficiently large database for the specific sensor is obtained. The characteristics of the particular sensor 1004 are then preferably stored in the memory onboard the sensor 1004. Computer 1020 reads the sensor 1004 characteristics and adjusts the bank of PGAs 1080A through 1080N to normalize the sensor signal. This band signal amplitude compensation along with the capability of computer 1020 to adjust both the pass-band width and the transition slopes of the filters allows computer 1020 to fully normalize the imperfection signals.

The outputs of the bank of PGAs 1080A through 1080N are then converted to digital form through an analog-to-digital converter of sufficient resolution, typically 10 to 14 bits, and speed which is defined by the number of channels and maximum scanning speed.

AutoRULE Processing

AutoRULE processing operates upon the flaw spectrum that was derived from signals, such as, but not limited to, echo, reluctance, resistance, impedance, absorption, attenuation, sound or physical parameters acquired through one-dimensional or multi-dimensional sensors. The processing of Eddy-Current amplitude and phase, for example, may also be utilized to derive the flaw spectrum as well as frequency decomposition as described herein above. Regardless of the signal origin or the frequency decomposition method used, the frequency components of the signals then become the flaw spectrum for use by the AutoRULE in a manner illustrated by element 1021A in FIG. 23. It should be understood that computer 1020 can manipulate and present the signals in any desirable format. It should be further understood that the signals of geometrically offset sensors, such as the ones shown in FIG. 7 of U.S. Pat. No. 2,881,386, are aligned by computer 1020 through time shifting (time delay) primarily controlled by the scanning speed preferably derived from sensor 1036. This may comprise memory, a bucket-brigade, or any combination of the above. Variable length analog delay lines may also be deployed, the delay length controlled primarily by the scanning speed. It should be understood that sensor 1036 may comprise a number of sensors distributed along the length of MUI 1001 for direct measurement or coupled to MUI 1001 transport components, such as the lifting cable, or a combination thereof.

It should be understood that the exemplary RDIS-10 extraction matrix is compiled through a software program, that was published in 1994 and it is beyond the scope of this patent, and decomposes the converted digital signals into relevant features. The extraction matrix may be adjusted to decompose the signals into as few as two (2) features, such as, but not limited to, the 1D-NDI presentation of wall and flaw. It should be understood that no theoretical decomposition upper limit exists, however, fifty (50) to two hundred (200) features are practical. The selection of the identifier equations, further described herein below, typically sets the number of features. In the exemplary RDIS-10, the decomposed signals, regardless of their origin, are known as the flaw spectrum 1006 (see FIG. 12C).

Feature Recognition

Humans are highly adept in recognizing patterns, such as facial features or the flaw spectrum 1006 and readily correlating any pertinent information. Therefore, it is easy for the inspector to draw conclusions about the MUI 1001 by examining the flaw spectrum 1006, as further illustrated in FIGS. 25A through 25E. During the inspection, the inspector further incorporates his/her knowledge about the MUI 1001 present status, his/her observations, as well as the results of previous inspections. The success of this inspection strategy of course, solely depends on how well the inspector understands the flaw spectrum 1006 data and the nuances it may encompass.

Computers can run numerical calculations rapidly but have no inherent pattern recognition or correlation abilities. Thus, a program has been developed that preferably derives at least one mathematical procedure to enable the computer 1020 to automatically recognize the patterns and nuances encompassed in decomposed inspection and/or sound data streams such as presented in the flaw spectrum 1006. The detailed mathematical procedures are described hereinbelow and enable one skilled in the art to implement the AutoRULE described herein without undue experimentation.

Figure 23:
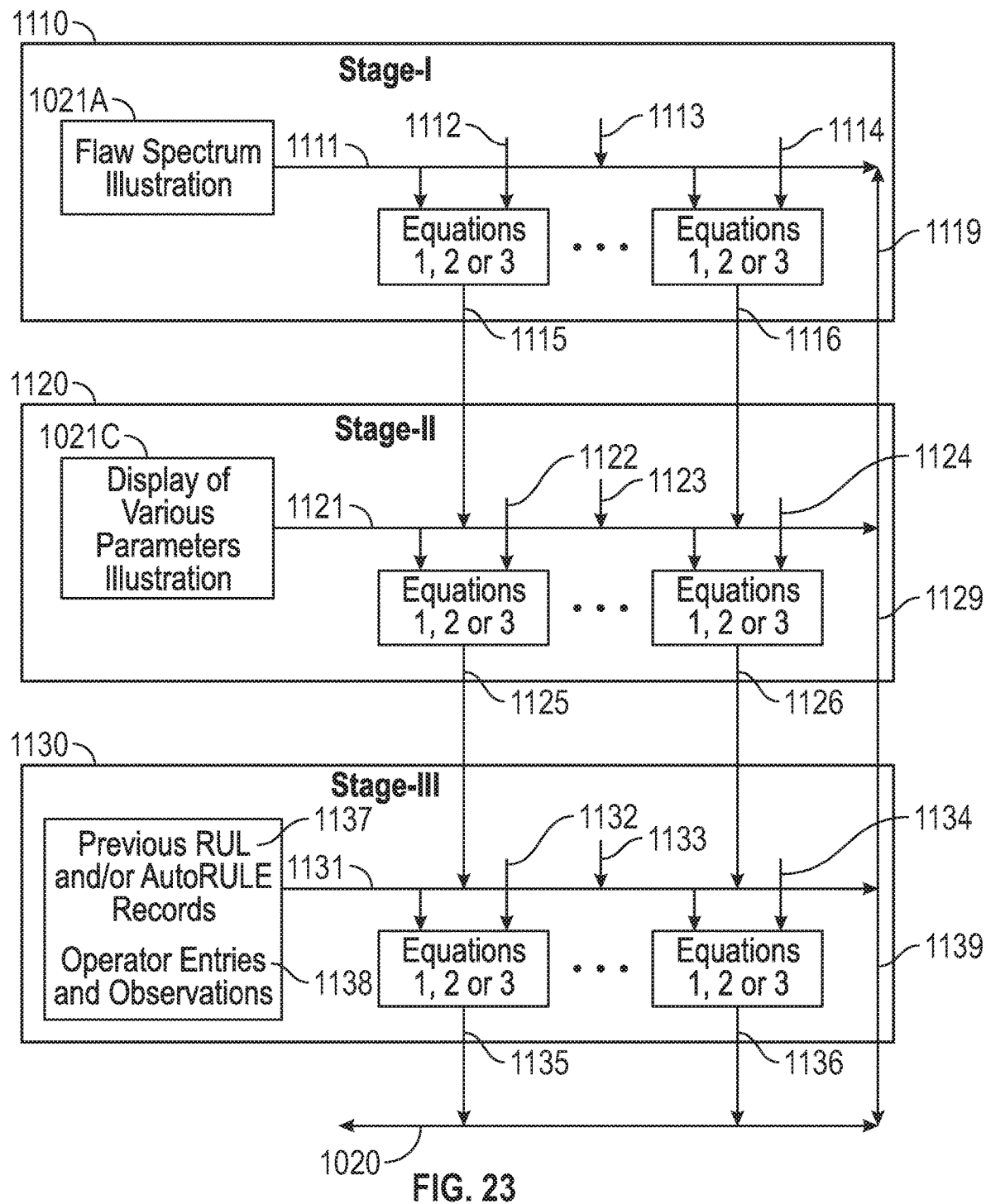
FIG. 23 illustrates a block diagram of the signal processing of AutoRULE system according to the present invention.

FIG. 23 illustrates a block diagram of an AutoRULE data processing sequence that allows the creation of a software flowchart and the translation of the practice to a computer program. For stand-alone operation, the AutoRULE must be optimal in regard to the RULE criteria and application limitations, commonly defined by approximations and probabilities which are referred to herein as constraints. It should be understood therefore, that the AutoRULE state variables must be tuned for optimal performance under different constrains depending on the MUA 1009 and its application. The fundamental operation of the AutoRULE is performed by the identifier equations which preferably capture the optimal mutual features in accordance to the constraints. It should be understood that a number of identifier equations may be paralleled and/or cascaded, each one utilizing a different set of optimal mutual features. Furthermore, it should be understood that the processing of the identifier equations may be carried out by a single computer 1020 or by different computers in a cluster without affecting the overall result.

The first stage identifier equations, with elements denoted as $a.sub.jk$ 112, 114, use for input N features 1111 mostly derived from the flaw spectrum 1021A. Additional features may be provided by fixed values referred to herein as bias 1113, 1123, 1133. Bias may be a single constant or a sequence of constants that may be controlled, but not limited, by time or by the MUA 1009 length. Backwards chaining 1119 limits irrelevant processing and enhances stability while forward chaining 1139 propagates features to later stages or it may inform computer 1020 that an MUA 1009 condition has been determined and no further analysis is required. It should be further understood that both forward and backward chaining may be direct, through memory, through a bucket-brigade, or any combination of the above. It should be further understood that all or any subsystem of the AutoRULE may be implemented as a casual system or as a non-casual system. In a casual implementation only past and present features 1111 are utilized. In a non-casual implementation, features 1111 are utilized through memory, through a bucket-brigade, or any combination of the above thus allowing for the use of future values of the features 1111. Future values of the features 1111 may be used directly or indirectly as signal masks and may be propagated through the forward chaining 1139. Utilization of future values of features 1111 increases the AutoRULE stability and reduces the probability of a conflict In Equations 1-3, shown below, such features are denoted as Xa. Based on the constrains, the identifier equations reduce the features 1111 and bias 1113 to identifiers 1115, 1116 denoted as Ya. Please refer to U.S. Pat. No. 8,831,894 B2 Col. 26, lines 25-45 for equations 1-3.

The identifiers Ya 1115, 1116 can be fed back through the backwards chaining 1119, can be used directly through the forward chaining 1139, can be used as variables to equations or as features 1121, 1131 in following stages or in their most practical form, as indexes to tables (arrays) which is shown in Equation 2 for clarity. Another useful identifier form is shown in Equation 3.

It should be understood that each stage may comprise multiple identifier equations utilizing equations 1, 2, or 3. There is no theoretical upper limit for the number of identifiers calculated, however, five (5) to ten (10) identifiers are practical.

Some of the identifiers Ya 1115, 1116 may be sufficient to define the disposition of the MUI 1001 alone and thus propagate to the output stage 1139 while others may become features for the second stage 1120 of identifier equations along with features 1121 pertinent to the Ya identifiers, all denoted as Xb. It should be appreciated that in the exemplary STYLWAN RDIS-10, depending on the constrains, those features can be obtained from the operator interface, from the computer 1020 memory, from the camera 1029, or by connecting directly to the STYLWAN RDIS-10 Data Acquisition System transmitters that measure various parameters illustrated FIG. 23 (1021C). Examples of such transmitters include the OCI-5000 series manufactured by OLYMPIC CONTROLS, Inc., Stafford, Tex., USA, such as transmitters that measure pressure (OCI-5200 series), temperature (OCI-5300 series), speed and position (OCI-5400 series), weight (OCI-5200H series), fluid level (OCI-5200L series), flow (OCI-5600 series), dimensions (OCI-5400D series), AC parameters (OCI-5400 series), DC parameters (OCI-5800 series), as well as other desired parameters. The second stage 1120 identifier equations, with elements denoted as $b_{tm}$, produces identifiers 1125, 1126 denoted as Yb of similar form as the Ya identifiers 1115, 1116.

Again, some of the identifiers Yb may be sufficient to define the disposition of the MUI 1001 alone and thus propagate to the output stage 1139 while others may become features for the third stage 1130 identifier equations along with features pertinent to the Yb identifiers, all denoted as Xc. For the RDIS-10, depending on the constrains, those features can be obtained from data or functions entered by the operator 1138, stored in historical data 1137, or other predetermined sources (not illustrated). It should be understood that this process may repeat until an acceptable solution to the constrains is obtained, however, three stages are typically adequate for the exemplary STYLWAN RDIS-10. It should further be understood that each stage 1110, 1120 and 1130 may comprise multiple internal stages.

Determination of Coefficients

For the determination of the coefficients, the tuning of the identifier equations, a set of flaw spectrums 1006 of known similar imperfections that are pertinent to a current inspection application are required. These data sets, of flaw spectrums 1006, are referred to herein as baseline spectrums. Preferably, all the coefficients are initially set equal. It should be understood that because this is an iterative process the initial values of the coefficients could also be set by a random number generator, by an educated guess, or by other means for value setting.

Since the baseline spectrums are well known, typically comprising data taken for similar imperfections, the performance measure and the constrains are clearly evident and the coefficients solution is therefore objective, although the selection of the imperfections may be subjective. By altering the coefficient values through an iterative process while monitoring the output error an acceptable solution would be obtained.

There are multiple well-known techniques to minimize the error and most of these techniques are well adept for computer use. It should be appreciated that for the AutoRULE limited number of features a trial-and-error brute force solution is feasible with the available computer power. It should be further expected that different solutions would be obtained for every starting set of coefficients. Each solution is then evaluated across a variety of validation spectrum as each solution has its own unique characteristics. It is imperative, therefore, that an extensive library of both baseline spectrums and validation spectrums must be available for this evaluation. It should be further understood that the baseline spectrums cannot be used as validation spectrums and vice versa. Furthermore, it should be understood that more than one solution may be retained and used for redundancy, conflict resolution, and system stability. Still further in applications of the AutoRULE, the terms "acceptable" or "good enough" are terms of art to indicate that, in a computational manner, the computer has completed an adequate number of iterations to compile an answer/solution with a high probability of accuracy.

Once a set or sets of coefficients are obtained, the number of non-zero coefficients is preferably minimized in order to improve computational efficiency. This is important because each identifier equation is just a subsystem and even minor inefficiencies at the subsystem level could significantly affect the overall system real time performance. Multiple techniques can be used to minimize the number of non-zero coefficients. A hard threshold would set all coefficients below a predetermined set point to zero (0). Computers typically have a calculation quota, so a quota threshold would set to zero a sufficient number of lower value coefficients to meet the calculation quota. A soft threshold would subtract a non-zero constant from all coefficients and replace the negative values with zero (0). Since an error measure exists, the new set of coefficients can be evaluated, the identifier equations can be tuned again and the process could repeat until the admissible identifier equation is determined. It is preferred that multiple admissible identifier equations are determined for further use. It should be appreciated that although the preference for multiple admissible identifiers may appear to complicate potential resolutions, the use of computer power makes a large number of iterations feasible.

For the assessment of materials, an acceptable solution would always contain statistics based on false-positive and false-negative ratios. A false-positive classification rejects fit material while a false-negative classification accepts unfit material. Using more than one identifier equation lowers the false ratios more than the fine-tuning of a single identifier equation. It should be understood that this process theoretically provides an infinite number of solutions, as an exact formulation of the inspection problem is elusive and always based on constrains. Furthermore, for a solution that can be obtained with a set of coefficients, yet another solution that meets the performance measure may also be obtained by slightly adjusting some of the coefficients. However, within the first three to five proper iterations the useful solutions become obvious and gains from additional iterations are mostly insignificant and hard to justify.

Once all of the Stage-I 1110 admissible identifier equations have been determined, their identifiers become features in Stage-II 1120 along with the additional features 1121, bias 1123, and forward and backwards chaining 1129. The starting set of baseline spectrums is then processed through the admissible identifier equations and the results are used to tune the Stage-II 1120 identifier equations in a substantially identical process as the one described above for the Stage-I 1110. The process repeats for the Stage-III 1130 identifier equations and any other stages (not illustrated) that may be desired or necessary until all the admissible subsystems are determined and the overall system design is completed. It should be appreciated that in practice, preferably only two to five stages will be necessary to obtain required results. When the final coefficients for all of the equations are established, the overall system performance may be improved by further simplifying the equations using standard mathematical techniques.

A previous assessment with the same equipment provides the best historical data 1137. The previous RULE assessment, denoted as $Ys_{(-1)}$, is ideally suited for use as a feature 1131 in the current inspection as it was derived from substantially the same constrains. Furthermore, more than one previous RULE assessment 1137 may be utilized. Features 1131 may be backwards chained 1129, 1119. Multiple historical values may allow for predictions of the future state of the material and/or the establishment of a service and maintenance plan.

Determination of Bias

In conventional inspection systems, previous state data, that was derived through a different means under different constrains, could not necessarily be used directly or used at all. If utilized, the data would more likely have to be translated to fit the constrains of the current application. It should be appreciated that such a task may be very tedious and provide comparatively little payoff. For example, there is no known process to translate an X-Ray film into MFL pertinent data. However, the AutoRULE system described herein allows for the use of such data in a simple and direct form. In the X-Ray example, the opinion of an X-Ray specialist may be solicited regarding the previous state of the material. The specialist may grade the previous state of the material in the range of one (1) to ten (10), with one (1) meaning undamaged new material. The X-Ray specialist opinion is an example of bias 1113, 1123, 1133.

Bias 1113, 1123, 1133 may not necessarily be derived in its entirety from the same source nor be fixed throughout the length of the material. For example, information from X-Rays may be used to establish the previous material status for the first 2,000 feet of an 11,000 foot coiled tubing string. Running-feet may be used to establish the previous material status for the remainder of the string except the 6,000 foot to 8,000 foot range where OD corrosion has been observed by the inspector 1138. From the available information, the previous material status for this string (bias per 1,000 feet') may look like [2, 2, 4, 4, 4, 4, 7, 7, 4, 4, 4] based on length. Other constrains though may impose a hard threshold to reduce the bias into a single value, namely [7], for the entire string.

An example of a bias array would be a marine drilling riser string where each riser joint is assigned a bias based on its age, historical use, Kips, vortex induced vibration, operation in loop currents, visual inspection, and the like. The bias for a single riser joint may then look like [1, 1, 3, 1, 2, 2]. Identifier equations may also be used to reduce the bias array into a bias value or a threshold may reduce the bias into a single value.

FFS Assessment and RULE

AutoRULE provides means to move the FFS and RUL process from the laboratory or the engineering department to the field and apply FFS and RUL to the in-service material using actual as-is field data. Furthermore, it should be understood that AutoRULE may be utilized to gather actual field data to create FFS and RUL methods, charts, tables and formulas or to verify the validity of proposed or existing FFS and RUL methods, charts, tables and formulas. It should be understood that FFS utilizes information to derive the MUA 1009 present status and RULE is using knowledge and data to project the future status of MUA 1009 under deployment. The RULE higher inherent uncertainty can be minimized by frequent AutoRULE scans. Frequent data points verify the correctness of the original formulas, data and constraints. Furthermore, frequent AutoRULE scans shorten the look-forward time interval simplifying the AutoRULE significantly. For example, if drill pipe is scanned every six months, the look-forward interval is six months and multiple trips. On the other hand, if drill pipe is scanned on every trip, the look forward interval may be a few days and a single trip resulting in a much simpler AutoRULE. A simpler AutoRULE would certainly be less expensive and its RULE by far more reliable, therefore encouraging more frequent use. Furthermore, more frequent AutoRULE deployment would monitor and utilize actual data from related parameters 1021C that would not be available otherwise.

It should also be understood that RULE processing differs if the MUA 1009 is a serial or parallel structure and if the damage mechanisms act in series or in parallel. For example, a drill string, while drilling, is a serial structure that will fail as soon as one of the drill pipe joints fail. The drilling process will fail also. Therefore, at the end of the AutoRULE scan, AutoRULE should also evaluate the FFS and estimate a RUL for the drill string as a single MUA 1009 (a structure). On the other hand, when the exact same drill pipe is on a rack, it is a parallel MUA 1009. Failure of any drill pipe joint, only impacts the particular joint. Failure of more than one drill pipe joint may prevent the drilling process from starting (not enough drill pipe); however, there are different risks and costs associated with the two failures, failure-to-start and failure-while-drilling.

At first glance it may appear that an FFS assessment and RULE for the drill string as a single MUA 1009 (a structure) could also be obtained for example, through a formula that operated upon the individual FFS and RULE of each drill pipe joint on the rack. One should keep in mind that the position of each drill pipe joint in the drilling string affects its FFS and RULE significantly as the entire string does not endure the same loads. The entire string RULE is shown in element 1196 of FIG. 29B (and FFS is similarly shown in the corresponding FFS barograph).

AutoRULE may utilize industry standard or custom FFS and RUL methods, charts and formulas, utilize original design data and criteria, material test reports, deployment history, prior inspection records, prior FFS and RUL records, repair and/or alteration records along with FFS assessment and RULE techniques and/or formulas and/or data sets, imperfection allowance rules and/or formulas and/or data sets, acceptance criteria, remediation options and/or formulas and/or data sets. AutoRULE makes provisions to accept such information/data either as a mathematical or logical (crisp or fuzzy) formula, as a sequence of data, such as bias, or even as a single constant. The data set is representative of a material. For example a data set representative of risers, pipes, pipelines and strings of these may be created.

Typically and in addition to FDDim, AutoRULE would evaluate material utilizing: a) absolute values, such as actual wall thickness; b) parameter ratios or remaining ratios, such as (strength of damaged material)/(strength of undamaged material); c) coverage ratios, such as (pitted area surface)/(material surface) and d) rates of change, such as feature morphology, size, density, coverage and any combination thereof. Preferably, AutoRULE would also utilize a measure of the damage mechanism time-dependency. AutoRULE would apply FFS assessment and RULE for each feature and/or damage mechanism and then fuse the results of each FFS assessment and RUL estimation to determine the status of the material. It should be understood that the combination of FDDim with the other AutoRULE measured/calculated values would result in a multidimensional pointer sufficient to select the material status from a multidimensional group of tables or charts or to solve a system of equations. For example, remaining wall thickness RULE tables and charts may be indexed on the (maximum) operating pressure and temperature. By continuously monitoring the actual operating pressure and temperature, AutoRULE would then select the appropriate FFS assessment and RULE path and alert the operator when operating pressure and temperature exceed a limit, affecting the material FFS and RUL. In a different embodiment, AutoRULE could establish communication with a pressure and temperature monitor using communication port 1026 and download the pressure and temperature historical data from the monitor memory. Such data may also be available in a storage device 1023.

AutoRULE may also utilize each damage mechanism time-dependency to estimate the material RUL. Since AutoRULE would preferably be monitoring other controlling parameters, such as pressure, temperature, deflection etc., it should be understood that AutoRULE (prognosis and/or predictions) would be based on measured parameters instead of estimated parameters. It should be further understood that even small changes in the application and/or environment might result in significant RUL changes. Therefore, AutoRULE results would be bound by the monitored stability of the controlling parameters. This is a very important element when gathering field data to establish material/application FFS and RUL or when verifying proposed FFS and RUL.

AutoRULE preferably may a) scan the MUA 1009 after each use; b) identify the features of MUA 1009; c) quantify the features of MUA 1009; d) assess the impact of the features upon the MUA 1009, e) estimate the FFS and RUL of MUA 1009 under the constraints of the application and f) (optional) generate and export a file for use by an FEA engine. It should also be apparent that AutoRULE deployment and utilization should be economically sound.

Figure 24:
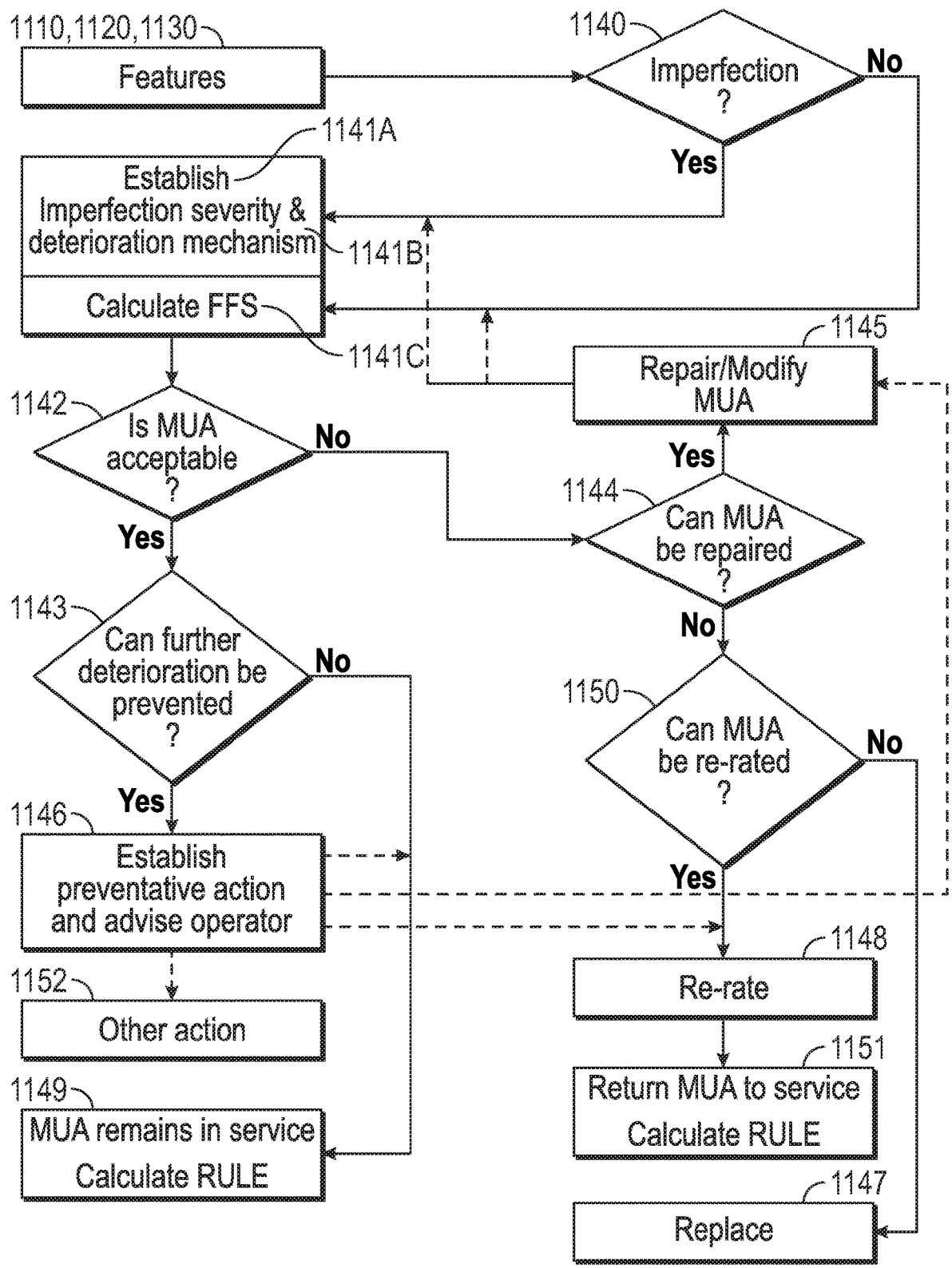
FIG. 24 illustrates a flow chart of a typical RULE assessment according to the present invention.
Figure 25A:
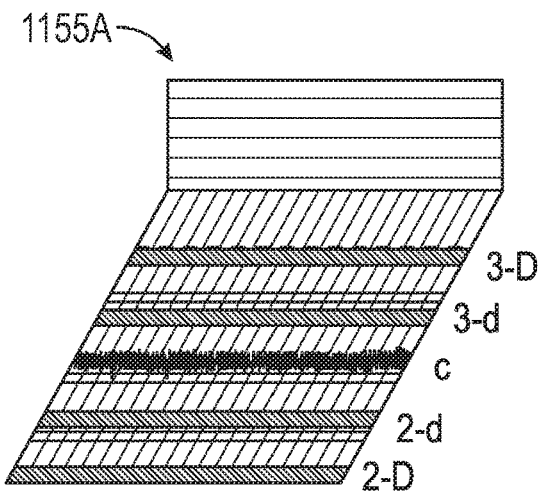
FIG. 25A illustrates a typical RULE assessment time sequence with a flaw spectrum of a new coil according to the present invention.
Figure 25B:
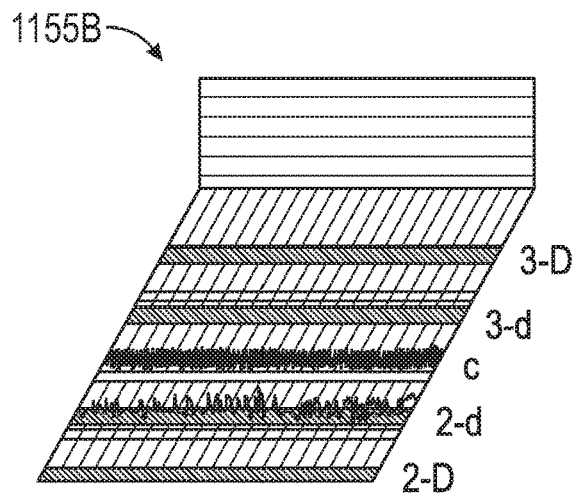
FIG. 25B illustrates a RULE assessment time sequence with a features morphology migration according to the present invention.
Figure 25C:
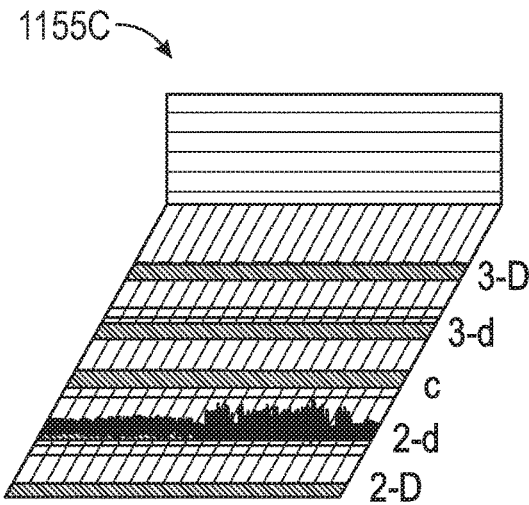
FIG. 25C illustrates a RULE assessment time sequence with a features morphology migration according to the present invention.
Figure 25D:
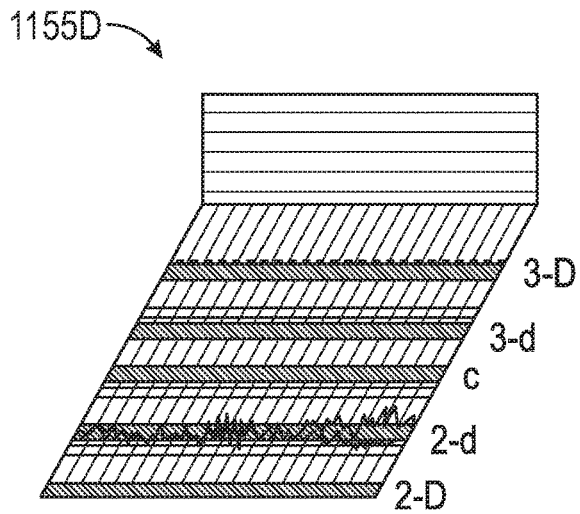
FIG. 25D illustrates a RULE assessment time sequence with a morphology shift toward fatigue according to the present invention.
Figure 25E:
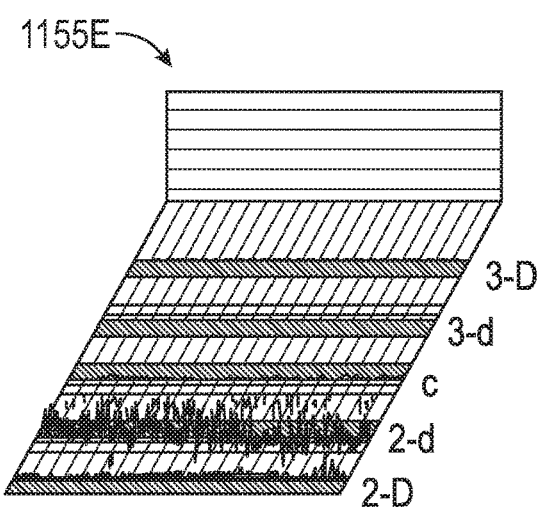
FIG. 25E illustrates a RULE assessment time sequence with a late fatigue life manifestation according to the present invention.
Figure 25F:
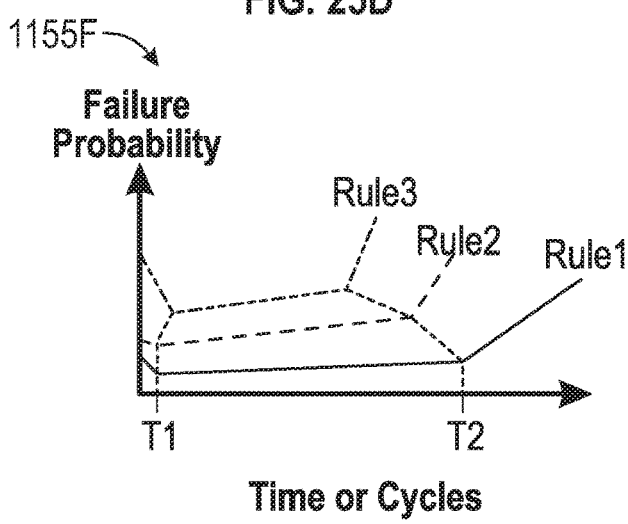
FIG. 25 F illustrates the probability of failure of similar coils divided in three major segments according to the present invention.

FIG. 24 illustrates a typical RULE flaw chart. As mentioned earlier, AutoRULE utilizes primarily as-built or as-is data 1110, 1120 and 1130. The first AutoRULE step is to separate design features and imperfections 1140. When design data is available, AutoRULE also monitors compliance with the design data 1142. Typically, once each imperfection has been identified, its severity 1141A may be established by applying stress concentration correction factors and neighborhood information correction factors. The imperfection identification may also be utilized to establish the MUA 1009 degradation mechanism 1141B. An FFS for the feature is then calculated 1141C. When multiple degradation mechanisms are identified, their interaction (in series or in parallel) affecting the MUA 1009 would also modify the AutoRULE processing path.

For each feature, including imperfections, the acceptance/rejection criteria are then applied 1142. When the degradation mechanism is known, preventive action 1146 may reduce/prevent further MUA 1009 deterioration, such as relocating the OCTG in a string, repairing damaged protective coating or using corrosion inhibitors. Conversely, comparison with previous RULE records 1137 may measure the effectiveness of any prior preventive action. Occasionally, re-rating 1148 the MUA 1009 early on may result in an extended useful life in service 1151.

When MUA 1009 does not meet the minimum acceptable criteria for the application and it cannot be repaired 1144, the MUA 1009 may be re-rated and used in a different application 1151. However, repeat AutoRULE scans should minimize the number of unanticipated MUA 1009 rejections. MUA 1009 deterioration should be tracked and preventive action 1146 and 1148 should maximize the MUA 1009 useful life.

FIGS. 25A-F illustrates a typical RUL time sequence of a coiled tubing work coil. The probability of failure 1155F of similar coils can be divided in three major segments marked by T1 and T2. Failures up to T1 are referred to as "infant mortality" while failures beyond T2 are primarily due to wear (end of useful life). The baseline 1155A shows the flaw spectrum of a new coil. Since CO2 is predominant in the work area, it is anticipated that future AutoRULE scans would detect CO2 type corrosion (2-d) and the coil is expected to follow RULE2 path of 1155F. The probability of this particular coil "infant mortality" is lower because of the baseline 1155A. Preferably AutoRULE would include imperfection growth paths, morphology migration evaluation paths and root-cause identification. For example, the depth of a corrosion pit may increase and/or the corrosion pitting density may increase and/or a crack forming at the bottom of the pit would result in a critically flawed area (herein after referred to as "CFA"). CO2 type corrosion pitting appears in scan 1155B exactly as expected and it is predominant by scan 1155C. Scans 1155B and 1155C show features morphology migration. Because the work coil is undergoing bending in the plastic region (plastic deformation), the pits act as stress concentrators increasing the cyclic fatigue built-up rapidly. The morphology shift toward fatigue cracking (2-D) is shown in 1155D along with significant growth. The work coil shown in 1155D has reached T2 in 1155F and it is no longer fit for service due to the imperfection severity (2-d). The only feasible remediation option is to remove the coil from service work and re-rate it 1148 as a production string where the coil will no longer be subjected to plastic deformation cycles. However, since the coil is under continuous in-service monitoring, the coil was subjected to a few extra cycles, shown in 1155E, when cracks (2-D) appeared, probably at the bottom of the CO2 corrosion pits (2-d). Cracks, a late fatigue life manifestation shown in 1155E, grow rapidly the coil would break within the next 3 cycles.

AutoRULE would preferably utilize a number of FFS and RULE paths. For example, when computer 1020 monitors, logs and evaluates the overall drilling performance, the RULE paths may be selected. The impact of the drilling may be established by measuring the power consumption of the drilling process, the string weight, weight on bit, applied torque, penetration rate and other related parameters. Such information, an indication of the strata and the efficiency of the drilling process, may dictate that a different FFS and RULE path and/or constraints should be utilized to further evaluate the MUA 1009 RUL including imperfections 1140. Furthermore, changes in the strata and/or in the efficiency of the drilling process may indicate conditions that primarily induce imperfection morphology migration, not just growth, thus AutoRULE should also include the anticipated deterioration mechanism acting on the imperfections.

Feature Duration

As mentioned earlier, it should be understood that the one to one correspondence of simple imperfections to the STYLWAN Flaw Spectrum occasionally applies to machined (man-made) imperfections and not to the complex form imperfections typically found in nature. Therefore, the STYLWAN Flaw Spectrum elements must be viewed as an entity identification signature, just like DNA, but not as a detailed chemical analysis. It would be erroneous for example to conclude that a weld is made up form a pit, three gouges and a wall thickness increase, the result of a chemical-analysis-like interpretation of the Flaw Spectrum data. The correct Flaw Spectrum interpretation would recognize the signature of a weld and therefore, the first AutoRULE task would be to recognize complex imperfections, such as welds.

It should be readily apparent that complex feature would have significant 3D dimensions, as opposed to a single crack for example, and therefore their Flaw Spectrum would have a much longer time and/or length duration. If the AutoRULE was allowed to interpret signals instantaneously, the AutoRULE would behave erroneously, in a chemical-analysis-like fashion, where a weld would be reported as a string of pits, gouges, CFAS and wall thickness changes. For example, the feature shown in 1155C is a corrosion band, not a large number of corrosion pits, and the root-cause of the corrosion band is identified as CO2. Therefore, preventive action 1146 should focus at minimizing the impact of the CO2 environment on the work coil. Similarly, 1155E shows multiple CFAs and borderline CFAs, not just pits and cracks. Therefore, interpreting 1155C through 1155E instantaneously may lead to erroneous conclusions and possible instability.

It is desirable therefore, that AutoRULE processing preferably incorporates feature duration data and/or trigger along with the ability to revisit prior data and/or decisions. It should be noted that any time delay between the feature passing through the head 1002 and an AutoRULE decision would be insignificant and unnoticeable by the operator. Furthermore, it should be noted that feature duration refers to sufficient duration that would lead to a valid AutoRULE conclusion and not necessarily for the duration of the entire feature.

For example, a coiled tubing taper (a wall thickness change) may be many thousands of feet long while a localized wall loss could be six inches long. On the onset of such a feature, it would be advisable to examine a greater MUA 1009 length, ten feet for example, before the AutoRULE makes a decision. At 180/minute scanning speed, ten feet delay would amount to about one third (⅓) of a second that would certainly go unnoticeable by the operator. Furthermore, even the AutoRULE shortest utterance, like "taper" or "weld", would take longer than one third (⅓) of a second. The scanning speed is selectable depending such as changing the speed of the sensor movement or the pipe movement.

Complex Features

Again, complex features may be included in the MUA 1009 by design, such as tapers, collars and welds, and therefore may be shown in the historical data records and/or may be anticipated; may reflect repairs and/or alterations that are not shown in the historical data records and may or may not be anticipated, such as a repair weld and lastly, they may reflect imperfections that were not encountered on previous AutoRULE scans. Once the complex features is recognized 1140, AutoRULE processing would then proceed with the evaluation tasks prescribed for the particular complex features and its ramifications upon the AutoRULE processing.

As discussed earlier, AutoRULE may retain more than one identifier for redundancy, conflict resolution, and system stability. It should then be understood that the recognition of complex features may involve more than one identifier. Furthermore, complex features are the most likely cause of AutoRULE instability and as a precaution therefore, AutoRULE, once it reaches a decision, may re-examine the same features under longer duration. This re-examination diminishes the probability of instability and increases the AutoRULE certainty, especially if different identifiers are implemented for the re-examination.

Assessment of Welds

Welding is the joining of two material pieces by applying heat with or without the use of filler material. Rarely used cold welding is accomplished by applying high pressure. Welding induces residual stresses that FFS and FEA typically assume to be uniform throughout the material thickness (uniform stain field). During multipass welding for example, the same point undergoes multiple thermal cycles multiple times and secondly, not all points undergo the same number of thermal cycles. Therefore, it would be erroneous to assume that the weld residual stresses are uniform throughout the material thickness. The heat-affected zone (herein after referred to as "HAZ") is the portion of the base material that did not melt during welding, but the welding heat altered its properties.

Welds are complex features that are very common, just like couplings. Often, material with welds is derated, such as coiled tubing with a butt weld. In addition, a different derating factor is used for factory butt welds and field butt welds. AutoRULE cannot make that distinction automatically. However, AutoRULE may search the local or remote history and/or alteration record and/or may inquire for an entry from the operator 1138 and/or an expert. In the absence of additional information, preferably AutoRULE would evaluate the weld as a complex feature, feature rating, and rate the material pessimistically, statutory rating. Preferably, AutoRULE would retain and report both ratings.

Fatigue Assessment

For centuries, practicing engineers recognized that subjecting metal to stress cycles resulted in fractures although the forces involved were a fraction of the forces required for static failure. The term Fatigue was introduced in the 19th century probably by J. V. Poncelet (1788-1867). Fatigue initiates at the crystal imperfections, commonly known as dislocations. Dislocations can be viewed as atomic level micro cracks that act as stress concentrators starting the slip mechanism. Fatigue is cumulative and with additional stress cycles, fatigue progresses to cracking as the micro cracks grow and bridge, a point where failure is rapid.

Even the most sophisticated prediction models lack most of the detailed information required for a valid prediction. For example, OCTG may contain 10 to the 10 tenth dislocations/third order on the average and while deployed may be subjected to unanticipated significant loads. Even if all the loads and the exact nature of each dislocation were precisely known, any type of calculation, such as FEA, would be prohibitive. Furthermore, the problem of fatigue cracks rapidly magnifies when the material is subjected to cyclic loading in corrosive environments.

The advantage of AutoRULE is the large number of repeated assessments and data that can be collected without interfering with the deployment of the MUA 1009 or the production rate. AutoRULE detects the actual condition of the MUA 1009 fatigue regardless of the underline causes. Fatigue build-up tests with the exemplary RDIS-10 revealed that fatigue up to .apprxeq.50% of the life cycle falls in the 2-D.alpha. spectrum segment, between .apprxeq.50% and .apprxeq.75% falls in the 2-D.beta. spectrum segment and above .apprxeq.75% falls in the 2-D.gamma. spectrum segment.

Most software failure prediction models are aimed at predicting the alpha failure location (herein after referred to as "(.alpha.FL)"); the location where the rate of fatigue build-up is the highest and therefore, it is the location where the first failure is expected to occur. RDIS-10 fatigue build-up tests revealed that multiple (aFL) can be identified at the boundary transition between 2-D.alpha. and 2-D.beta. while the failure location can be identified at about 65% of the life cycle when preventive action 1143 becomes extremely important.

The most catastrophic form of failure is Early alpha failure (herein after referred to as "(E.alpha.FL)") that is not predicted by any model but AutoRULE would easily detect 1142 the rapid fatigue build-up. An (EaFL) most likely would be the result of MUI 1001 that does not meet the specifications or material that was damaged during transportation and handling following the inspection.

Crack-Like Imperfection Assessment

In-service fatigue build-up typically initiates surface cracking. Cracks also initiate at the bottom of other imperfections, such as pits, that act as stress concentrator as shown in 155E. Modeling and predicting crack growth is extremely imprecise, just like modeling fatigue. Again, AutoRULE scans, preferably after every use, would track the actual crack growth and propagation regardless of the underline causes. A measure of the energy released per crack surface area may be calculated from the AutoRULE data. Without additional loads and when crack growth reaches its limit, AutoRULE may calculate the residual stresses that contributed to the crack growth. Such data may supplement the historical data of all materials deployed in similar applications. Preferably, such database would reside in a central remote location in communication with AutoRULE. Significant remaining useful life of the MUA 1009 may be recovered if the crack 1007A in FIG. 13A is morphed 1145 into a 3-D type imperfection 1007B (much lower stress concentration) as shown in FIG. 13B, but only if the neighborhood of crack 1007A is free from other imperfections. Therefore, effective preventive action 1146 is essential.

Crack growth and propagation is highly sensitive to changes in the application or the environment. As carried out, RULE assessment typically utilizes theoretical data and/or experimental data that were obtained in a laboratory under carefully controlled conditions. Such data are not always appropriate for field use. AutoRULE data on the other hand, reflect actual field conditions and material performance and therefore capture the actual material RULE for the particular application and/or environment.

Pitting Assessment

For isolated pits, 2-d through 3-d assessment would examine the proximity of other imperfections to the pit that may form a CFA under the regiment of anticipated loads as shown in 1155E. Once the material is determined to be free of CFAs, discussed further below, AutoRULE would then establish severity of the pit.

For corrosion bands, 2-d through 3-d assessment would first establish the boundaries of the corrosion region (imperfection duration and area coverage). Then AutoRULE would determine if the corrosion region damage is still acceptable 1142 and that the region is not growing at an unacceptable rate by utilizing previous RULE records 1137, such as 1155C and 1155D. AutoRULE would then attempt to identify the nature of the corrosion mechanism. Different mechanisms result in different types of corrosion pitting such as narrow base cylindrical pits all the way to broad based conical pits and FDDim may be used as a corrosion mechanism guide and thus a guide to the root-cause identification and the proper remediation 1145, 1146.

For example, when CO2 type pits appear on MUI 1001 that was free of CO2 pits in previous AutoRULE scans, it is reasonable to conclude that CO2 back flooding has reached the particular well site. This change in the operating environment significantly impacts the remaining MUA 1009 life which can be recalculated and extended by the proper application of inhibitors or by simply rearranging the tubing in a well. Furthermore, early detection of the CO2 presence may redefine the next preventive maintenance service interval. This unique and novel feature of the AutoRULE is not available with the sporadic inspections which more likely would take place after the MUA 1009 failed prematurely because of the accelerated CO2 corrosion.

This example also demonstrates another AutoRULE strength versus RULE and 1D-NDI as carried out. Let's assume that the production tubing was in a well for 4 years prior to CO2 reaching the well site and that a tubing failure occurs 1 year after CO2 reached the well site. RULE assessment and 1D-NDI would then reasonably conclude that the tubing time to failure in the particular well is 5 years (tube useful life), when in fact it is only 1 year. Due to costs involved, it is unlikely that 1D-NDI would be deployed during a workover and even if 1D-NDI is deployed, 1D-NDI could not detect the change in the environment. By the time the owner figures out the new oilfield realities, following multiple tubing failures, a vast number of production tubing strings may need replacing while an AutoRULE assessment would alert the owner about the subterranean environment changes and recommend a preventive action 1143 early on, thus extending the life of multiple production strings. It should then be understood that AutoRULE frequent utilization, preferably on every workover, could have significant ramifications for the entire operation, not just the particular well.

Critically Flawed Area Assessment

CFA is a complex encounter where imperfections in proximity are dynamically linked under loading, such as a corrosion pit with a crack at the bottom (similar to the CFA of FIG. 13C) or imperfections in proximity and orientation as to experience increased stress concentration. The detection of such a CFA early on may not necessarily mean rejection of MUA 1009 as simple precautions 1146, such as minimizing the cycling of the particular MUA 1009 location, may be sufficient and it may extend the use of the MUA 1009. In addition, with a AutoRULE continuously monitoring the CFA, the full useful life of the MUA 1009 may be used despite the presents of the CFA as long as the CFA growth and/or morphology migration remain within acceptable limits as shown in 1155D and 1155E.

It should also be noted that the AutoRULE processing is diametrically opposing the 1D-NDI processing whereby a single uncorrected signal is used to pass or send the material for verification. Since the uncorrected signal of a small crack at the bottom of a pit does not significantly alter the pit signal, 1D-NDI would pass the material with the CFA as long as the pit signal itself does exceed the preset magnitude limit. It is also important to observe that corrosion pits occur at the surface of materials and in materials that endure dynamic loading, such as coiled tubing, drill pipe and marine drilling risers, the pits, the welds and other imperfections act as stress concentrators. Cracking would then initiate at the stress concentrators, like the bottom of the pits or the heat affected zone of welds, but such CFAs would go unnoticed by the TOFD of U.S. Pat. No. 6,904,818 because the CFAs would fall within the TOFD near-surface and far-surface detection dead-zones.

3-d and 3-D Assessment

Imperfections like grooves and gauges along with material hardness changes typically fall into this segment of the flaw spectrum. Grooves typically arise from erosion or corrosion while gauges are mostly the result of mechanical damage. Dents and deformations, discussed further below, often include gauges, scratches and notches. 2-D and 2-d remediation action, as shown in FIG. 13B, also results in imperfections that typically fall into this segment.

When an excavator accidentally hits a pipeline, it will dent it, thus it would plastically change the pipeline material. Interaction with the environment may change the material properties and it may change the plastically deformed dent region at a different rate than the undamaged pipeline material. During pumping, the pipeline pressure varies at a frequency that may lead to a crack in the deformed area.

Hardness estimates the strength of the material and its resistance to wear. Hardness changes, such as a hard spot, affect the remaining useful life of the MUA 1009 differently from wall thickness related features. For example, in material enduring cycles of tension and compression the vicinity of the hard spot would experience significantly increased loading and increased fatigue built-up, a potential (EaFL).

Wall Thickness Assessment

Wall thickness assessment may utilize the wall thickness profile (minimum, nominal, design, maximum), the wall thickness variation profile, the cross-sectional area profile and the average wall thickness profile, preferably all covering one-hundred percent (100%) of the MUI 1001 continuously.

As mentioned earlier, wall thickness changes, by design or otherwise, may be used to alter the AutoRULE processing. For example, a pipe coupling would appear as a significant wall thickness increase and may be used to invoke the AutoRULE coupling inspection.

3-G Deformation Assessment

Irregularities in the MUA 1009 geometry, such as ballooning, dents, eccentricity, neck-down, ovality, misaligned welds and straightness typically fall into this category. Deformations may originate in manufacturing, such as eccentricity; may be the result of a repair, such as a misaligned weld and lastly deformations may be induced during deployment, such as dents, ovality and ballooning. Dents and gouges are typically the results of mechanical action, such as an excavator hitting a pipeline. The fact that material is not straight, such as a bend drill pipe joint, is an indication that the material's yield strength was exceeded during deployment. A bend drill pipe joint would most like vibrate, increase the fatigue build-up and increase the wear on both the joint and any casing is deployed through.

Coiled tubing endures plastic deformation and it is an example of use induced deformation. When tubing bends, the fibers at the major axis have to travel further (extend) than the fibers on the minor axis (compress). This involves an amount of stored energy. In order to minimize the amount of stored energy, the tube swells sideways (neutral axis) and assumes an oval cross-section (ovality). By doing so, it minimizes the major axis fiber extension and the minor axis fiber compression. AutoRULE uses 3-G information directly and/or as a processing selection guide.

Material Deployment Loads

During deployment, materials may experience bending, buckling, compression, cyclic loading, deflection, deformation, dynamic linking, dynamic loading, elastic deformation, eccentric loading, feature propagation, impulse, loading, misalignment, moments, offset, oscillation, plastic deformation, propagation, shear, static loading, strain, stress, tension, thermal loading, torsion, twisting, vibration, and/or a combination thereof.

As it is well known, MUA 1009 features behave differently under different loading and therefore AutoRULE would have to evaluate the features it encounters under all the anticipated types of loading 1140 and any combination thereof. For example, drill pipe in a dog leg would also be subjected to bending in addition to torsion and loading. Furthermore, re-rating 1148 MUA 1009 early on may extend the MUA 1009 useful life.

AutoRULE Feasibility

The overall system must be feasible not only from the classification standpoint but also from the realization standpoint. In addition to the classification and minimum error, the system constrains also include, but are not limited to, cost, packaging, portability, reliability, and ease of use; all of which should be addressed in each step of the design. The system design preferably must assign initial resources to each level and should attempt to minimize or even eliminate resources whose overall contribution is negligible. This can be accomplished by converting certain features to bias and evaluating the resulting error.

Computer 1020 preferably recognizes the feature by comparing the final array of identifiers 1135, 1136, 1139 with a stored features template database. Once a feature is recognized, computer 1020 may verify the correctness of the recognition by further evaluating intermediate identifiers.

AutoRULE Instability and Conflict Resolution

Occasionally, the feature recognition becomes unstable with the final array of identifiers toggling between two solutions on each iteration. For example, during the inspection of used production tubing, the recognition may bounce back and forth between a large crack or a small pit. Resolution of such instability may be achieved by varying the feature duration length, utilizing intermediate identifiers, by utilizing the previous recognition value, or by always accepting the worst conclusion (typically referred to as pessimistic classification). However, AutoRULE instability may also be the outcome of improper backwards chaining or even faulty constrains. Slight increase in the coefficients of the backwards chained features may produce an output oscillation thus rapidly locating the problem feature and/or coefficients.

A conflict arises when the final array of identifiers points into two or more different MUA 1009 conditions with equal probability. Again, resolution of such conflict may be achieved by utilizing intermediate identifiers, by utilizing the previous recognition value or by always accepting the worst conclusion. However, a definite solution may be obtained by eliminating features that the conclusions have invalidated and by reprocessing the signals under the new rules.

The AutoRULE is preferably designed to reason under certainty. However, it should also be capable of reasoning under uncertainty. For example, during the assessment of used production tubing of a gas well, rodwear is detected. Since there are no sucker rods in the gas well, the conclusion is that this is either used tubing that was previously utilized in a well with sucker rod or there is a failure in the AutoRULE. The AutoRULE could query the operator 138 about the history of the tubing and specifically if it was new or used when initially installed in the well. The answer may be difficult to obtain, therefore a 50-50 chance should be accepted. A bias value may then be altered and the signal may be reprocessed under the new rules.

Alternate coefficients may be stored for use when certain failures are detected. For example, the wellhead pressure transmitter may fail. Upon detection of the failure, the alternate set of coefficients should be loaded for further use. It should be understood that even a simple bias may substitute for the failed transmitter.

RULE Calibration Sample

FIG. 26A illustrates a calibration sample with four features for use with AutoRULE to evaluate the AutoRULE feature identification capabilities and tune its parameters for the specific RULE needs of the particular material/application. Imperfection 1156A is a crack-like imperfection, 1156B is a pit-like imperfection, 1156C is a gouge-like imperfection and 1156D is a wall thickness feature. It should be understood that the calibration sample may contain multiple features and/or multiple examples of similar features with varying geometries. It should further be understood that features may be located on the OD or the ID of the material or both the OD and ID.

FIG. 26B illustrates a calibration sample with two coexisting imperfections for use with AutoRULE to evaluate the AutoRULE coexisting imperfection separation and identification capabilities and tune its parameters for the specific RULE needs of the particular material/application. Imperfection 1157 is a crack-like imperfection coexisting with a pit-like imperfection. It should be understood that the calibration sample may contain multiple coexisting features and/or multiple examples of similar coexisting features with varying geometries. It should further be understood that coexisting features may be located on the OD or the ID of the material or both the OD and ID.

Not shown are calibration samples with additional features, such as couplings, welds, deformation and the like, that may be utilized, as dictated by the particular material and/or application. Therefore it would be appreciated that standard threaded connections and/or welded sections, and the like, may be used for calibration.

FIG. 26C illustrates a range of 1D-NDI recommended calibration/reference imperfections. It is of interest to notice the machining precision specified for the reference imperfections. As a general rule, the tighter the machining tolerances for the reference imperfection, the least likely the imperfection would be encountered in nature. Furthermore, MUI with any diameter pit, $\frac{1}{16}$" or otherwise, should be rejected for further use way before the pit becomes a hole (100% penetration), regardless of the machining tolerances. Again, as shown in FIGS. 12A and 12B, 1D-NDI would easily mislead someone to believe that a 5% notch or a 100% pit (a hole) are appropriate calibration/reference standards and the tight machining tolerances add a false sense of confidence in 1D-NDI.

FIG. 26D illustrates yet another situation that 1D-NDI would mislead the inspector. Imperfection 1159 consists of a number of imperfections 1158. The highest signal selector 1010 of 1D-NDI would propagate to the readout 1005 the signal of only one of the imperfections 1159 resulting in an identical inspection trace for imperfections 1158 and 1159. Strength of material knowledge (and common sense) teaches that the MUA 1009 will break at 1159 when subjected to loads such as bending, torsion, cyclic loading etc. If imperfection 1158 did not cross the 1D-NDI threshold level, then 1159 will not cross the 1D-NDI threshold level either due to the 1D-NDI signal processing. Even if imperfections 1158 and 1159 did cross the 1D-NDI threshold level, it is unlikely that 1159 would be recognized as a CFA by the verification crew and it is highly unlikely if imperfections 1158 and 1159 were located in the ID of MUA 1009. On the other hand, AutoRULE would evaluate each 1159 imperfection on its own and apply neighborhood correction factors, thus distinguishing imperfection 1159 from 1158.

Remediation

As discussed earlier and referring back to FIG. 13, 1D-NDI will typically miss imperfection 1007B as it will also miss FIG. 26D imperfection 1159. Furthermore, 1D-NDI recommended remediation for imperfection 1007A does not account for the vicinity of imperfection 1007A. For example, if imperfection 1007B was located on the ID below imperfection 1007A, the 1D-NDI remediation action for 1007A would instead result in a differently defective material that is acceptable by 1D-NDI but rejectable by AutoRULE.

AutoRULE must calculate the optimal remediation profile along with the remediation feasibility. For example, it will be straight forward for AutoRULE to calculate the optimal remediation profile 1007B for external imperfections 1007A or 1158 and such remediation is feasible. It will be by far more complex to calculate the optimal remediation profile for external imperfections 1159. AutoRULE will first calculate the optimal remediation profile for each one of the imperfections making up 1159. AutoRULE would then examine the neighborhood for each morphology shifted imperfection making up 1159. This may result in a remediation profile that is no longer optimal and therefore, AutoRULE will calculate an optimal remediation profile combining two or more of the morphology shifted imperfections making up 1159. This iterative process may continue until an optimal remediation profile for 1159 is calculated or until AutoRULE decides that no remediation is feasible. For example, repeat remediation iterations for imperfection 1159 may lead to an optimal remediation profile resulting in a groove around the circumference of MUA 1009. This groove may render MUA 1009 unfit for continuing service. AutoRULE would then have to calculate an optimal remediation profile for the groove that would result in a fit for continuing service MUI or re-rated 1148 MUI. Therefore, AutoRULE optimal remediation profile calculations will continue until at least two consecutive unfit for service calculations have been performed.

NDI and AutoRULE Utilization

Figure 27:
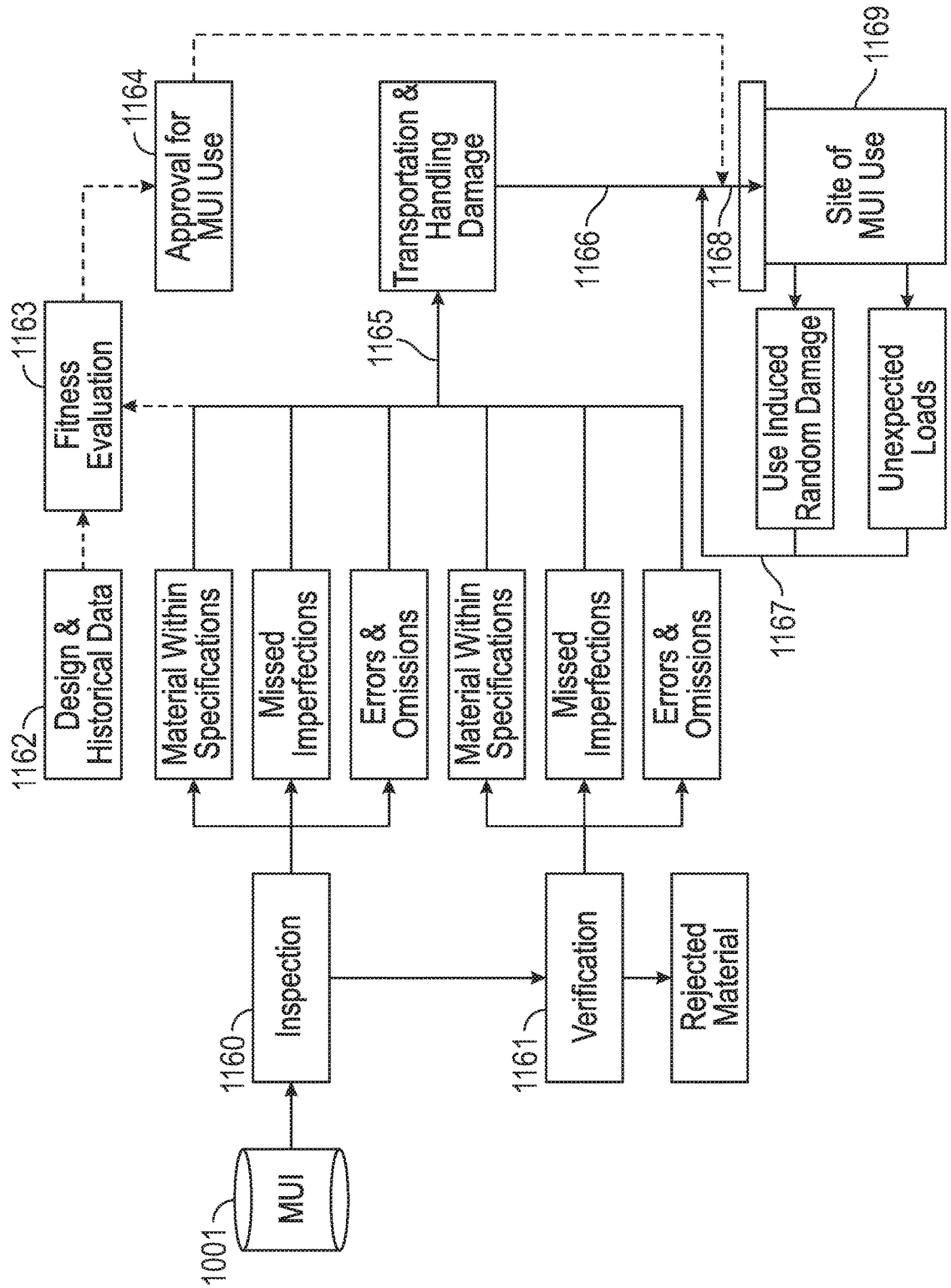
FIG. 27 illustrates a block diagram of a typical NDI process.

FIG. 27 illustrates a typical NDI process. As practiced today, NDI dictates termination of the material utilization altogether in order to accommodate the inspection process, which, is typically carried out by shipping the material to an inspection facility. The cost of inspection is therefore increased by the transportation cost and the material downtime. In addition, shipping and handling the material, especially after the inspection 1165, may induce damage to the material that could result in an unanticipated early catastrophic failure.

During inspection 1160, the MUI 1001 is examined for indications (flags), such as " . . . regions of abnormal magnetic reluctance (or echo, or phase shift etc.)", that exceed a preset threshold level. A typical 1D-NDI equipment" standardization" practice sets the threshold level by scanning a "reference standard" as shown in FIG. 26C. Again, referring back to FIGS. 12A and 12B, it is easy to see how someone may be misled to believe that "standardization of the 1D-NDI equipment" would somehow be equally accomplished by "referencing" a 1D-NDI unit on a "through-wall drilled hole", a 3-d imperfection with 0% remaining wall thickness, or a "5% OD notch", a 2-D imperfection with 95% remaining wall thickness. Therefore, the 1D-NDI equipment is "standardized" to flag imperfections with wall loss anywhere between 5% up to 100% depending on the geometry of the imperfection; the 1D-NDI practice that led to the material failure illustrated in FIGS. 12A through 12D. The flagged material is then sent for verification 1161.

Material 1165 may then contain an assortment of imperfections, some because of the 1D-NDI "standardization" practice, like an 75% drilled hole; some because of missed imperfections, due to "sensor liftoff" or "detection deadzones", and some because of errors and/or omissions either by the inspector or by the verification crew. Material 1165 is then exposed to potential accidental damage during transportation and handling to the site of use 1169. During deployment, the material may endure unexpected loads or suffer unexpected damage 1167, but the condition of the material 1168 will not be ascertained again until the next inspection cycle or after a failure.

Because of its implementation and the intrusion NDI imposes, typical inspections have been expensive and are thus performed at rare intervals or not performed at all. For example, NDI costs of OCTG can be as high as 30% of the material replacement cost.

In the rare occasion that an analysis follows the NDI, the inspection results 1163 are send for evaluation while the material is shipped to the use site 1169. The evaluation process 1164 may incorporate design and historical data 1162 and eventual approval for the material use may be granted well after the material has reached the use site 1169. Because of the evaluation process 1163 inherent delay and cost, along with other economic pressures, the material 1166 is typically put to use immediately upon arrival at the use site 1169 and the evaluation process is reduced to a search for the failure mechanism of the rejected material.

Pipelines on the other hand, are typically inspected by internal inspection units commonly known as pipeline pigs or pigs. Following the scan, the inspection data is sent for evaluation 1163 while the pipeline is put back into service. It is obvious that areas of concern cannot be identified until trained inspectors examine the inspection data, a process that typically takes weeks if not months. It is not uncommon for a verification report to be generated months after the inspection identifying hundreds of areas of concern requiring manual verification. Manual verification for pipelines involves crews with heavy equipment that would travel to the designated areas, dig up the pipeline and perform manual inspections to evaluate the nature and extent of the imperfections that gave rise to the pig signals. The verification results would then be sent for evaluation 1163 and approval 1164, months after the pipeline was put back into service following the inspection. In the meanwhile, a pipeline leak may develop in one of the areas designated for verification or even in an area that was not flagged by the pig. Such detection failure may arise from the 1D-NDI limitations that result in specialized inspection pigs such a pitting inspection pigs, crack inspection pigs etc.

On the other hand, AutoRULE must examine and evaluate, as close as possible, 100% of the MUA 1009 for 100% of pertinent features and declare the MUA 1009 fit for continuing service only after the impact of all the detected features upon the MUA 1009 have been evaluated and estimate its RUL; diametrically opposing the 1D-NDI methodology. It is well known that the presence of any imperfection alters the expected (designed) life of the MUA 1009 and thus impacts its RUL. Thus, it should be appreciated that the deployment of the AutoRULE would increase the overall safety and reliability as it would lead to MUA 1009 repair/replacement prior to a catastrophic failure as well as it will reduce and/or eliminate its premature replacement due to concerns when the conventional inspection periods are spaced far apart and/or when the conventional inspection provides an insignificant inspection coverage.

Figure 28:
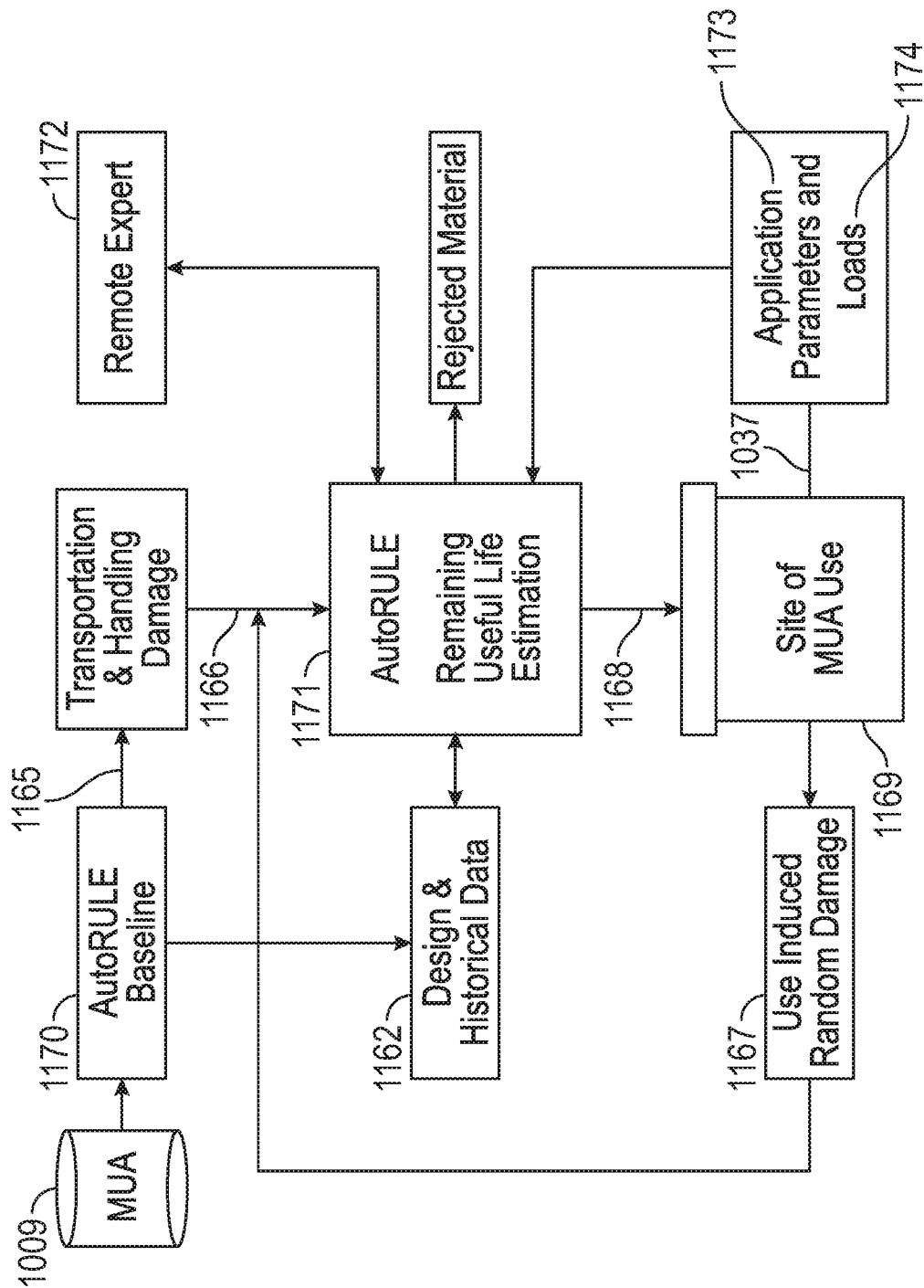
FIG. 28 illustrates a block diagram of the AutoRULE process according to the present invention.

FIG. 28 illustrates a typical AutoRULE process. Preferably, an AutoRULE baseline 1170 is obtained prior to the deployment of the MUA 1009. It should be understood that any subsequent onsite AutoRULE scans 1171 become the baseline, historical data 1162, for the next scan, therefore, the first baseline may also be obtained during the first AutoRULE scan 1171 at the deployment site 1169. Onsite AutoRULE scans 1171 would assure that material 1168 is still fit for service "as-is" including any transportation and/or handling damage 1166 or any use-induced damage 1167. A remote expert 1172 may review the AutoRULE data, may convert and run the AutoRULE data with finite element analysis engine and/or may alter the AutoRULE processing.

Figure 29A:
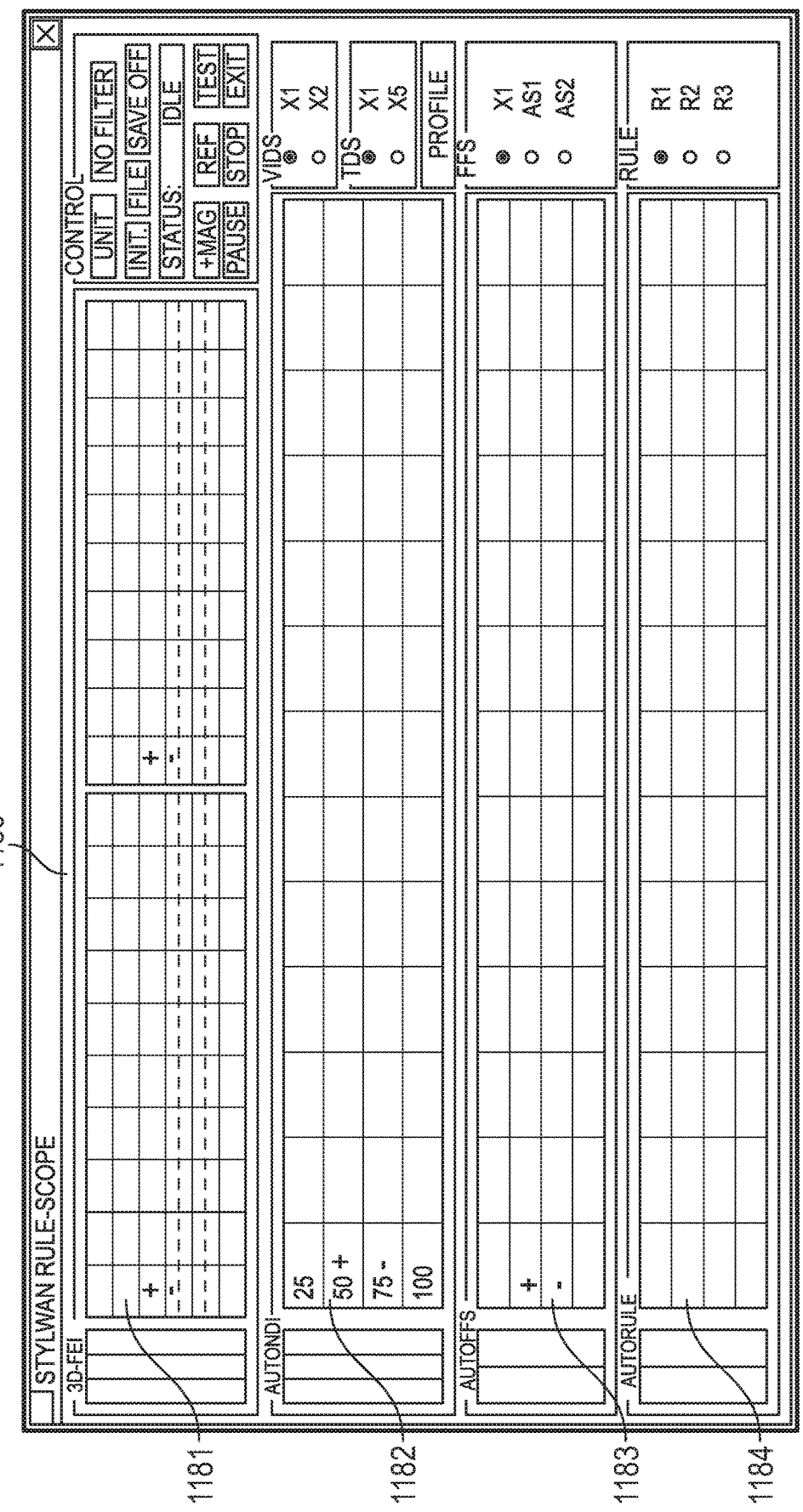
FIG. 29A illustrates an AutoRULE computer readout for use in FFS and RUL data gathering.

FIG. 29A illustrates a typical AutoRULE operator readout 1180 preferably for use to acquire laboratory and/or field data for the development and/or verification of FFS and RUL. It should be understood that the AutoRULE operator readout 1180 is provided in addition to the speech and sound interface. It should be further understood that this particular AutoRULE implementation is for illustration purposes only and should not be interpreted as limiting in any fashion. This particular AutoRULE operator readout 1180 comprises of the three-dimensional finite element inspection (herein after referred to as "3D-FEI") readout 1181, the AutoNDI readout 1182 and the AutoFFS readout 1183 and the AutoRULE readout 1184. This particular AutoRULE assigns a fitness number to the MUA 1009 between 0 and 100. Fit for service material is assigned a number between 50 and 100 (green). Material that is fit for service under continuous monitoring is assigned a number between 25 and 49 (yellow). Unfit for service material is assigned a number between 0 and 24 (red). This particular AutoRULE also assigns a RUL number to the MUA 1009 between 0 and 100.

It should be understood that while acquiring data for the development and/or verification of an FFS and a RUL, the MUA 1009 would preferably be under continuous monitoring by the 3D-FEI 1181 and AutoNDI 1182 and therefore minimizing the risk while extending the data collection range, as described in FIG. 25A-F. Typically, the exemplary RDIS-10 or a similar device would provide the 3D-FEI traces while AutoNDI is fully described in U.S. Pat. No. 7,155,369.

Figure 29B:
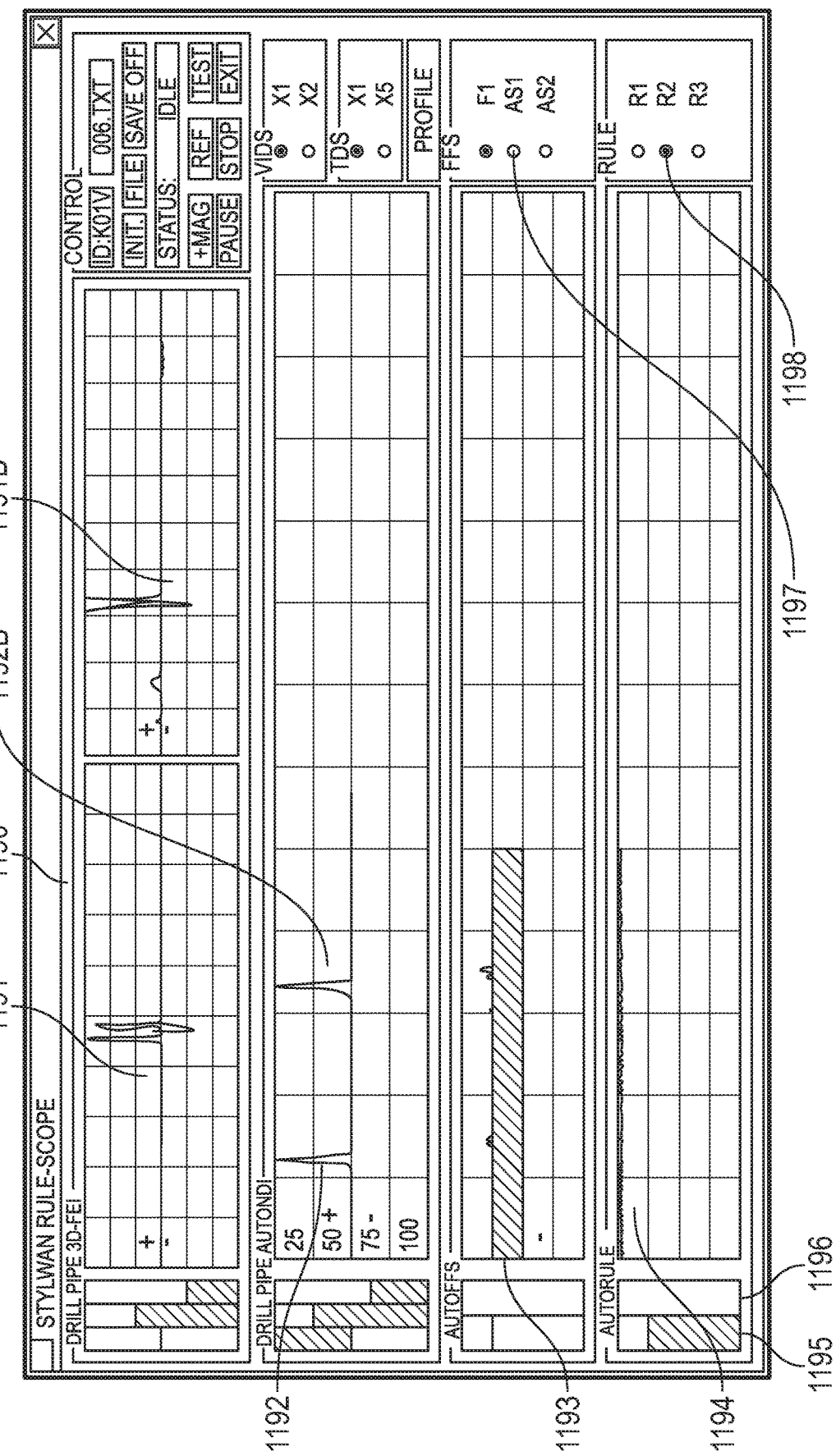
FIG. 29B illustrates an AutoRULE computer readout configured for drill pipe.

FIG. 29B illustrates a typical AutoRULE operator readout 1190 configured for drill pipe (MUA 1009). AutoRULE configuration menu is accessed through the "Profile" button or by speaking the word "Profile". The 3D-FEI readout shows a drill tool joint 1191A, a complex feature. As discussed earlier, if the AutoRULE was allowed to interpret the tool joint 1191A signals instantaneously, AutoRULE would behave erroneously, in a chemical-analysis-like fashion, and will report that the tool joint 1191A is made up by wall thickness increase and a number of assorted imperfections. It should be understood that 1D-NDI assigns this task entirely to the inspector and relies exclusively on the inspectors abilities. Instead, AutoRULE feature recognition processing, identified the tool joint 1191A (and 1191B), altered the processing path 1192A and calculated the FFS 1193 and RULE 1194 of the tool joint 1191A using a different assessment path than the drill pipe body wall path. This particular AutoRULE assessment declared both the drill pipe body wall and the tool joint fit for service (green—above midpoint) with RUL ranging from 96 to 100%. Barograph 1195 shows the joint RUL and 196 shows the drill string RUL. Similar barograph shows the joint FFS the drill string FFS.

Preferably, AutoRULE would be capable of utilizing multiple paths of MUA 1009 assessment. In this particular AutoRULE implementation, the operator may evaluate MUA 1009 under three different FFS paths 1197 and under three different RUL paths 1198. It should be understood that reprocessing paths 1197 and 1198 may not necessarily reflect the current MUA 1009 deployment but the next or a future MUA 1009 deployment. For example, the drill pipe illustrated in FIG. 29B may be evaluated using the next well (different strata) FFS and RUL and/or it may be segregated for further deployment in different wells to maximize the RUL of each joint in the string. It should be further understood that reprocessing of data through paths 1197 and 1198 is rapid, as the data preferably would be stored in a local storage device and/or in a storage device affixed onto the MUA 1009. Storing data in a memory affixed onto the MUA 1009 provides significant advantages versus searching a database for such data.

All of the AutoRULE data are available for examination by the operator and the remote expert 1172. Similarly, the internal memory of an AutoRULE pipeline pig can be examined rapidly in minutes instead of weeks or months. The pipeline can be put back to service with confidence or the remediation effort can start immediately with the areas that were determined to be unfit for service. In addition, FEA can also be utilized to augment and/or verify the AutoRULE data as an additional safety measure.

Exporting AutoRULE Data to an FEA Engine

With the advent of desktop computers and design/drafting software, FEA is in wide use today. It is typically utilized during the design phase to analyze as-designed structures. It should be understood that FEA engines operate on physical structures (something) under static or dynamic loading, not features alone, as features alone do not exist in nature. For example, a corrosion pit does not exist on its own. A corrosion pit exists as a feature on a physical structure, such a pipeline. Typically, the geometry of a feature is expressed as percentage of the physical structure geometry. For example, a 10% pit depth is a meaningless expression without knowing the wall thickness of the material, the physical structure. Therefore, a 10% pit on a 0.095" wall thickness coiled tubing has a depth of 0.0095" and on a 1.000" wall thickness riser auxiliary line has a depth of 0.100". AutoRULE (and NDI), typically relay to the operator information regarding the severity (presence) of a feature (imperfection, defect) in a format such as shown in FIG. 12A, FIG. 12C and FIG. 29B.

However, FEA Engines cannot operate on the data, such as shown in FIG. 12C and FIG. 29B. FEA Engines can only operate on a structure, such as shown in FIG. 13A through FIG. 13C, and evaluate the localized stresses of the structure under specific loading, as shown in FIG. 13D. It should be noted that 1D-NDI data are insufficient for FEA as 1D-NDI processing eliminates most of the material features information, as discussed earlier.

On occasion, it is desirable to analyze the as-is material with FEA to obtain, for example, deflection, strains, stresses, natural frequencies and similar data. Converting manually the AutoRULE signals to a structure requires a number of multidiscipline experts and it is time consuming. Therefore, it is desirable to provide a program that can convert automatically the AutoRULE material features to a geometrical structure for use by a commercially available FEA engine. The data is placed into a usable format for FEA engines, simulators, and the like. It should be understood that such conversion would depend on the particular AutoRULE capabilities and the particular FEA engine geometry file specifications. A more general AutoRULE conversion would translate the AutoRULE data to a drawing or representation of pipe or riser for use by a commercially available drafting program, such as AutoCAD. Other commercially available programs would then export the drawing data to an FEA engine. The data format is a suitable data format representative of pipe or material features. Unlike the prior art, the present invention is able to detect many different material features many of which are discussed herein. The material features may be different imperfections or different features such as threads, tapers, and the like that are built into the pipe string or pipeline. The database has a history of previously detected material features that can be monitored for changes. Known material features can thereby be stored. So it is possible to monitor previously detected material features that are reprehensive of the material, e.g. an OTCG, riser, pipeline or the like. The data set is representative of the material.

Having a physical description of the MUA 1009 (structure) alone is insufficient information for FEA, as the loads involved are also required. Typically, the MUA 1009 is analyzed under a regiment of anticipated loads that reflect the opinion of experts. A unique feature of AutoRULE is the data acquisition system 1035 and sensors 1036 and 1037. As discussed earlier, computer 1020 may also monitor, through the data acquisition system 1035, parameters that are related to the assessment or utilization of the MUA 1009 and/or parameters to facilitate RULE and/or remaining useful life estimation. Such parameters may include, but not be limited to, the MUA 1009 pump pressure, external pressure, such as the wellhead pressure, temperature, flow rate, tension, weight, load distribution, fluid volume and pump rate and the like. Preferably, these parameters are measured or acquired through sensors and/or transducers mounted throughout the MUA 1009 deployment area 1169, such as a rig or on the MUA 1009, such as a vibration monitor. For ease of understanding, these various sensors and transducers are designated with the numeral 1037. Therefore, and in addition to the physical description of the MUA 1009, AutoRULE would also acquire and export information regarding the actual deployment condition parameters 1173 and the actual loads 1174, including actual and the unanticipated loads the MUA 1009 endures resulting in an as-is and as-used FEA.

It should be understood that not all AutoRULE features can be converted to a geometrical structure for use by an FEA engine, such as fatigue. Instead, such features affect the remaining useful life of the material. It should be further understood that setting the FEA boundaries and accepting, interpreting and understanding the overall FEA process data and results is beyond the anticipate capabilities of the onsite AutoRULE operator, and therefore, this task is assigned to a remote expert 1172 or group of experts.

It may be seen from the preceding description that a novel Autonomous Remaining Useful Life Estimation system and control has been provided that is simple and straightforward to implement. Although specific examples may have been described and disclosed, the invention of the instant application is considered to comprise and is intended to comprise any equivalent structure and may be constructed in many different ways to function and operate in the general manner as explained hereinbefore. Accordingly, it is noted that the embodiments described herein in detail for exemplary purposes are of course subject to many different variations in structure, design, application and methodology. Because many varying and different embodiments may be made within the scope of the inventive concept(s) herein taught, and because many modifications may be made in the embodiment herein detailed in accordance with the descriptive requirements of the law, it is to be understood that the details herein are to be interpreted as illustrative and not in a limiting sense.

The invention claimed is:

1. A method for assessment of a tubular, said method comprising:
utilizing a material features acquisition system operable to detect a plurality of material features in said tubular, said material features acquisition system comprising a sensor;
providing a database to retain data so that said material features acquisition system is operable to produce a history of said tubular whereby said material features acquisition system is operable to detect and monitor changes in said tubular from repeatedly scanning said tubular with said material features acquisition system over time and wherein scanning said tubular comprises providing axial movement between said sensor and said tubular;
providing that said material features acquisition system is responsive to a material feature for calibrating said material features acquisition system from a calibration sample;
detecting an output of said sensor;
calibrating said sensor with a calibration sample comprising a plurality of different material features;
providing that said material features acquisition system is operable to evaluate said output of said sensor to detect new material features and monitor previously detected material features in said tubular from said database; and
providing that said material features acquisition system is operable for determining a degradation mechanism from a plurality of possible degradation mechanisms or changes affecting said tubular.

2. The method of claim 1, further comprising simulating an anticipated load on said tubular to assess said tubular.

3. The method of claim 1, wherein said material features acquisition system is operable to categorize material features comprising at least wall thickness, cracks, welds, tapers, and collars.

4. The method of claim 1, further comprising determining whether said tubular is fit for service with a plurality of anticipated loads based on one or more of an estimated remaining strength of said tubular, a material strength requirement for a range of operational loads for said tubular, a minimum strength requirement for said tubular, or a deterioration of said tubular.

5. The method of claim 1, further comprising providing data in a suitable data format representative of said tubular to at least one of an FEA program, a simulation program, or a computer aided design (CAD) program.

6. The method of claim 1, wherein said tubular comprises an oil country tubular good, a pipeline, a riser, a component of said oil country tubular good, said pipeline or said riser, or combinations of said oil country tubular good, said pipeline, or said riser.

7. The method of claim 1, wherein said sensor is capable of measuring at least one of acoustic information, conductivity, current, deformation, density, depth, direction, distance, eddy—current information, electrical information, EMAT (electromagnetic acoustic transducer), field, flow, flux-leakage, frequency, geometry, by laser, length , location, motion, magnetic, optical, physical properties, rate, RFID signals, reluctance , resistance, time, ultrasonic signals, vibration, or voltage.

8. The method of claim 1, wherein said sensor is capable of collecting at least one of acoustic information, conductivity information, current information, deformation information, density information, depth information, direction information, distance information, eddy—current information, electrical information, EMAT (electromagnetic acoustic transducer) information, field information, flow information, flux-leakage information, frequency information, geometry information, laser information, length information, location information, motion information, magnetic information, optical information, physical properties information, rate information, RFID signal information, reluctance information, resistance information, time information, ultrasonic signal information, vibration information, or voltage information.

9. A method for assessment of a tubular, comprising:
providing a material features acquisition system that comprises an excitation inducer to induce excitation into said tubular;
providing that said material features acquisition system comprises a sensor responsive to said excitation induced into said tubular;
calibrating said sensor with a calibration sample comprising a plurality of different material features;
providing axial movement between said sensor and said tubular; and
utilizing data from said sensor for simulating an anticipated load on said tubular or producing a representation of said tubular.

10. The method of claim 9 further comprising providing a database operable for storage of a history of said tubular under evaluation, said material features acquisition system is operable to determine at least one degradation mechanism that affects said tubular under evaluation from a plurality of possible degradation mechanisms from said history.

11. The method of claim 9 further comprising providing data representative of said tubular from said sensor of said material features acquisition system to at least one of an FEA program, a simulation program, or a computer aided design (CAD) program and providing that said data representative of said tubular is in a usable format for at least one of said FEA program, said CAD program, or said simulation program.

12. The method of claim 11 further comprising comparing said data representative of said tubular with a history of said tubular from a database or storage to determine changes in said tubular.

13. The method of claim 11 further comprising producing a representation of said tubular utilizing said data from said sensor.

14. The method of claim 13 further comprising comparing said representation of said tubular with a representation from a history of said tubular from a database to determine changes in said tubular.

15. The method of claim 9, determining whether said tubular is fit for service with a plurality of anticipated loads based on one or more of an estimated remaining strength of said tubular, a material strength requirement for a range of operational loads for said tubular, a minimum strength requirement for said tubular, or a deterioration of said tubular.

16. The method of claim 9, wherein said axial movement is at a selectable scanning speed in terms of distance over time.

17. The method of claim 9, wherein said tubular comprises an oil country tubular good, a pipeline, a riser, a component of said oil country tubular good, said pipeline or said riser, or combinations of said oil country tubular good, said pipeline, or said riser.

18. The method of claim 9, wherein said sensor is capable of measuring at least one of acoustic information, conductivity, current, deformation, density, depth, direction, distance, eddy—current information, electrical information, EMAT (electromagnetic acoustic transducer), field, flow, flux-leakage, frequency, geometry, by laser, length, location, motion, magnetic, optical, physical properties, rate, RFID signals, reluctance, resistance, time, ultrasonic signals, vibration, or voltage.

19. The method of claim 9, wherein said sensor is capable of gathering at least one of acoustic information, conductivity information, current information, deformation information, density information, depth information, direction information, distance information, eddy—current information, electrical information, EMAT (electromagnetic acoustic transducer) information, field information, flow information, flux-leakage information, frequency information, geometry information, laser information, length information, location information, motion information, magnetic information, optical information, physical properties information, rate information, RFID signal information, reluctance information, resistance information, time information, ultrasonic signal information, vibration information, or voltage information.

20. A system to evaluate a tubular comprising:
a material features acquisition system, said material features acquisition system comprising of at least one sensor with an output;
a calibration sample comprising a known material feature whereby said material features acquisition system is adjusted for said known material feature;
a database operable for storage of a history of said tubular under evaluation, said material features acquisition system is operable to determine at least one degradation mechanism from a plurality of possible degradation mechanisms affecting said tubular under evaluation; and
said material features acquisition system being operable to record data for said tubular under evaluation repeatedly over time during axial movement of a selectable speed between said sensor and tubular.

21. The system of claim 20, wherein said sensor is capable of measuring at least one of acoustic information, conductivity, current, deformation, density, depth, direction, distance, eddy—current information, electrical information, EMAT (electromagnetic acoustic transducer), field, flow, flux-leakage, frequency, geometry, by laser, length, location, motion, magnetic, optical, physical properties, rate, RFID signals, reluctance, resistance, time, ultrasonic signals, vibration, or voltage.

22. The system of claim 20, wherein said sensor is capable of receiving at least one of acoustic information, conductivity information, current information, deformation information, density information, depth information, direction information, distance information, eddy—current information, electrical information, EMAT (electromagnetic acoustic transducer) information, field information, flow information, flux-leakage information, frequency information, geometry information, laser information, length information, location information, motion information, magnetic information, optical information, physical properties information, rate information, RFID signal information, reluctance information, resistance information, time information, ultrasonic signal information, vibration information, or voltage information.

23. A method for assessment of a tubular, said method comprising:
providing a material features acquisition system that comprises an excitation inducer to induce excitation into said tubular;
providing that said material features acquisition system comprises a sensor responsive to said excitation induced into said tubular;
calibrating said material features acquisition system at least once with a calibration sample comprising a plurality of material features;
providing relative axial movement between said sensor and said tubular;
producing data that is representative of material features of said tubular in a format for use by at least one of a finite element analysis program or a computer aided design program or a simulation program; and
utilizing said data to simulate an anticipated load to assess said tubular.

24. The method of claim 23 further comprising comparing said data that is representative of material features of said tubular with earlier data from a history of said tubular in a database to determine changes in said tubular.

25. The method of claim 23 further comprising determining whether said tubular is fit for service with a plurality of anticipated loads based on one or more of an estimated remaining strength of said tubular, a material strength requirement for a range of operational loads for said tubular, a minimum strength requirement for said tubular, or a deterioration of said tubular.

26. The method of claim 23 further comprising, tracking of an order of each tubular for a plurality of tubulars and recording said order, simulating a change in an order of said plurality of tubulars to provide a re-ordered simulated tubular string, and determining whether said re-ordered simulated tubular string is operable to withstand said anticipated load.

27. The method of claim 26, wherein said plurality of tubulars comprises a riser string, said anticipated load comprises at least one or more of water currents acting on said riser string, a length of said riser string, an applied tension to said riser string, a pressure in said riser string, a rig motion applied to said riser string, cyclical loads applied to said riser string, weights of fluids within said riser string, forces applied to said riser string, string weight or maximum allowable loads for said riser string.

28. The method of claim 23, further comprising replacing a selected tubular from a simulated tubular string to provide a revised simulated tubular string and determining whether said revised simulated tubular string is operable to withstand said anticipated load.

29. The method of claim 23, wherein said anticipated load comprises at least two of tension, bending, torsion, and vibration.

30. The method of claim 23, wherein said calibration sample comprises a plurality of different imperfections.

31. The method of claim 23, further comprising utilizing deployment data along with manufacturing material and geometry data for said tubular to assess said tubular.

32. The method of claim 23, further comprising determining a remaining useful life of said tubular.

33. The method of claim 23, wherein axial movement occurs is at a speed in terms of a distance over time.

34. The method of claim 23, further comprising utilizing said data that is representative of material features of said tubular in at least one of said finite element analysis program or said computer aided design program.

35. The method of claim 34, further comprising exporting a data set representative of said tubular to said finite element analysis program.

36. The method of claim 23, further comprising selecting a resolution to export to said finite element analysis program.

37. The method of claim 23, wherein said step of producing data representative of material features of said tubular by scanning said tubular for use by at least one of a finite element analysis program or a computer aided design program is performed substantially or completely by a computer.

38. The method of claim 23, wherein said sensor is capable of measuring at least one of acoustic information, conductivity, current, deformation, density, depth, direction, distance, eddy—current information, electrical information, EMAT (electromagnetic acoustic transducer), field, flow, flux-leakage, frequency, geometry, by laser, length, location, motion, magnetic, optical, physical properties, rate, RFID signals, reluctance, resistance, time, ultrasonic signals, vibration, or voltage.

\* \* \* \* \*